United States Patent [19]
Eastman et al.

[11] Patent Number: 4,464,650
[45] Date of Patent: Aug. 7, 1984

[54] APPARATUS AND METHOD FOR COMPRESSING DATA SIGNALS AND RESTORING THE COMPRESSED DATA SIGNALS

[75] Inventors: Willard L. Eastman, Lexington, Mass.; Abraham Lempel; Jacob Ziv, both of Haifa, Israel; Martin Cohn, Arlington, Mass.

[73] Assignee: Sperry Corporation, New York, N.Y.

[21] Appl. No.: 291,870

[22] Filed: Aug. 10, 1981

[51] Int. Cl.³ ............................................ H03K 13/00
[52] U.S. Cl. ............................. 340/347 DD; 364/200; 364/900
[58] Field of Search ................ 340/347 DD; 364/200, 364/900

[56] References Cited

PUBLICATIONS

Ziv, "IEEE Transactions on Information Theory", IT 23-3, pp. 337-343, May, 1977.
Huffman, "Proceedings of the Ire", Sep. 1952, pp. 1098-1101.

Primary Examiner—C. D. Miller
Attorney, Agent, or Firm—Howard P. Terry; Albert B. Cooper

[57] ABSTRACT

A compressor parses the input data stream into segments where each segment comprises a prefix and the next symbol in the data stream following the prefix. The prefix of a segment is the longest match with a previously parsed segment of the data stream. The compressor constructs a search tree data base to effect the parsing and to generate a pointer for each segment pointing to the previous segment matching the prefix. The search tree comprises internal nodes including a root and external nodes denoted as leaves. The nodes are interconnected by branches representative of symbols of the alphabet. Each parsed segment of the input data is represented by a path from the root to a leaf. The tree is adaptively constructed from the input data such that as each new segment is parsed, one new internal node of the tree is created from a leaf and new leaves are defined, one for each symbol already encountered by the encoder plus an additional branch to represent all potential but unseen symbols. The compressor transmits a leaf pointer signal for each parsed segment representative of the prefix thereof and the suffixed symbol of the alphabet. A decompressor constructs an identical search tree in response to the received leaf pointers so as to reconstitute the original data stream.

244 Claims, 31 Drawing Figures

,0,00,03,030,02,002,0020,1,
FIG.4A.
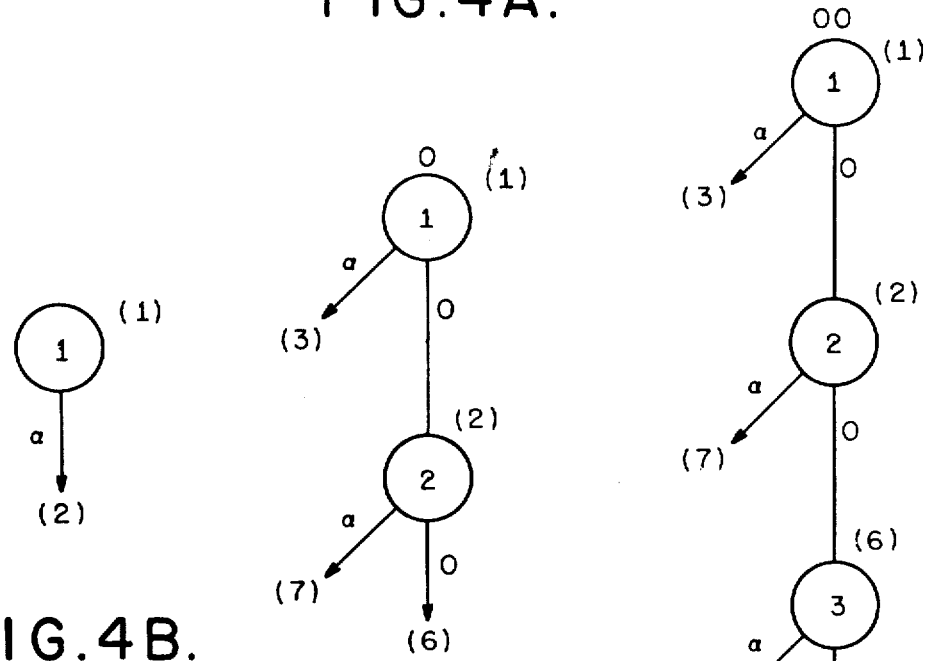
FIG.4B.
FIG.4C.
FIG.4D.
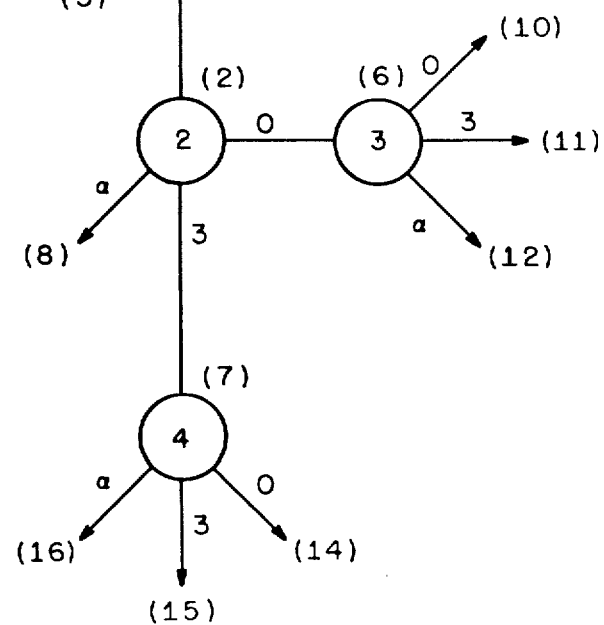
FIG.4E.

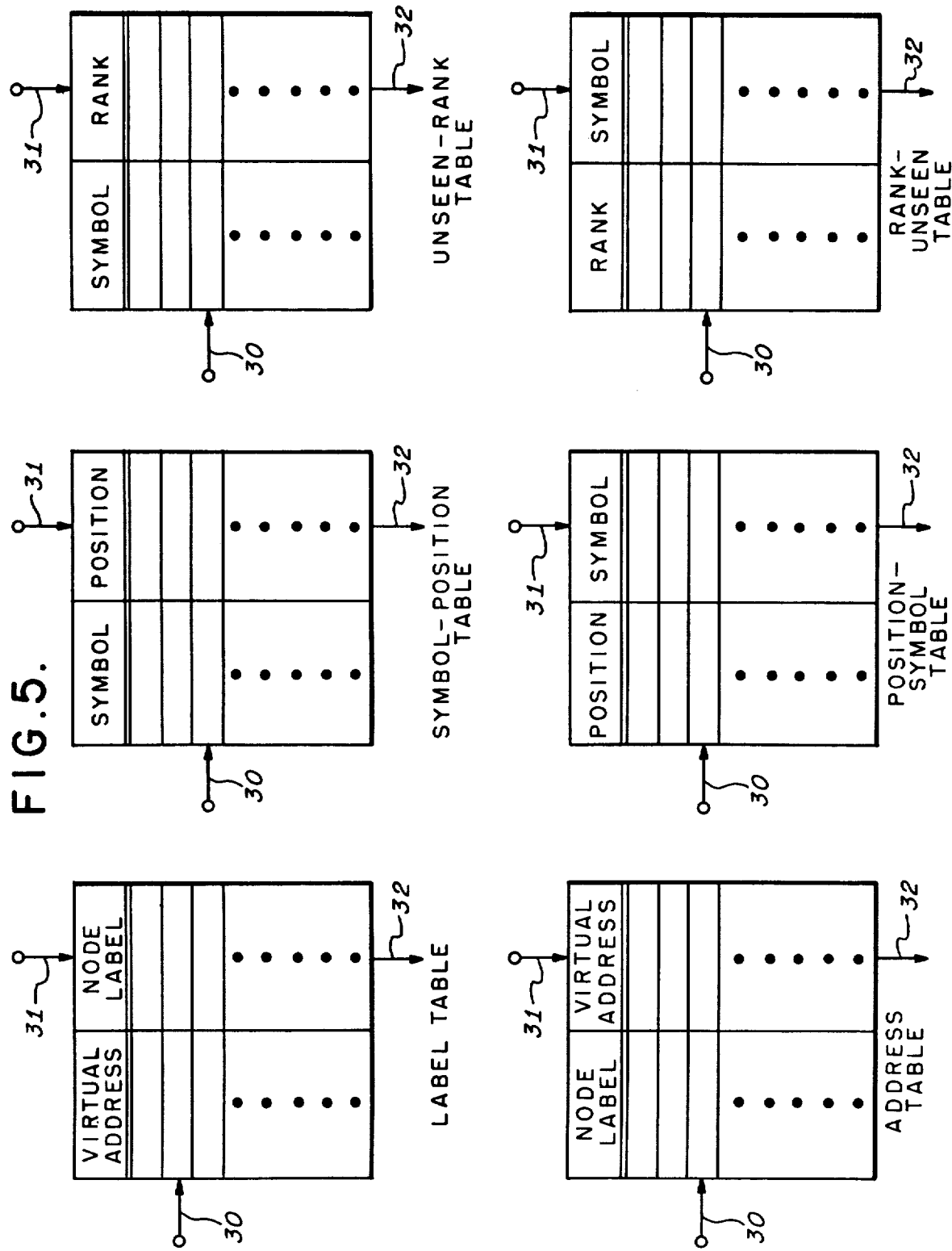

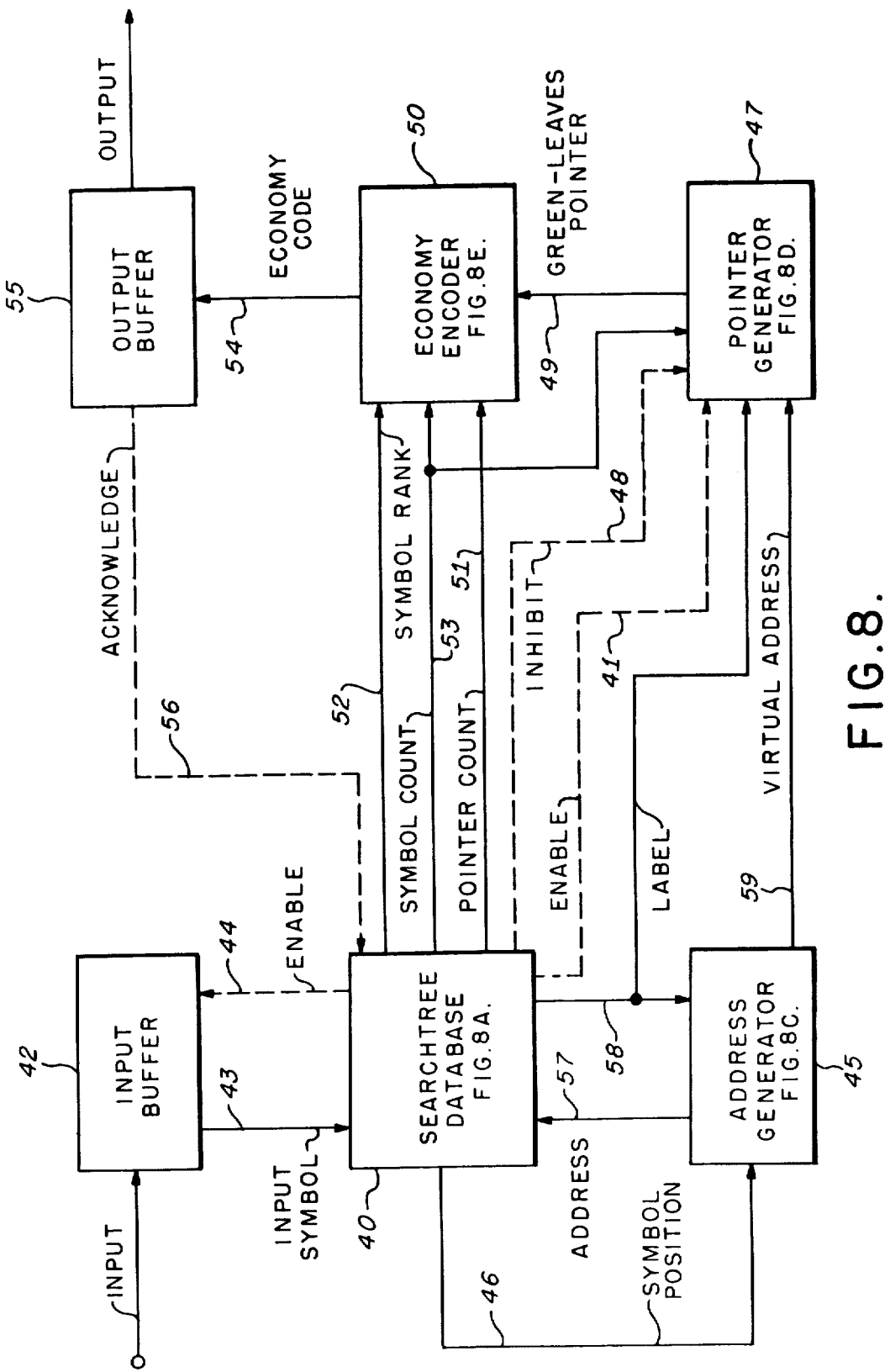

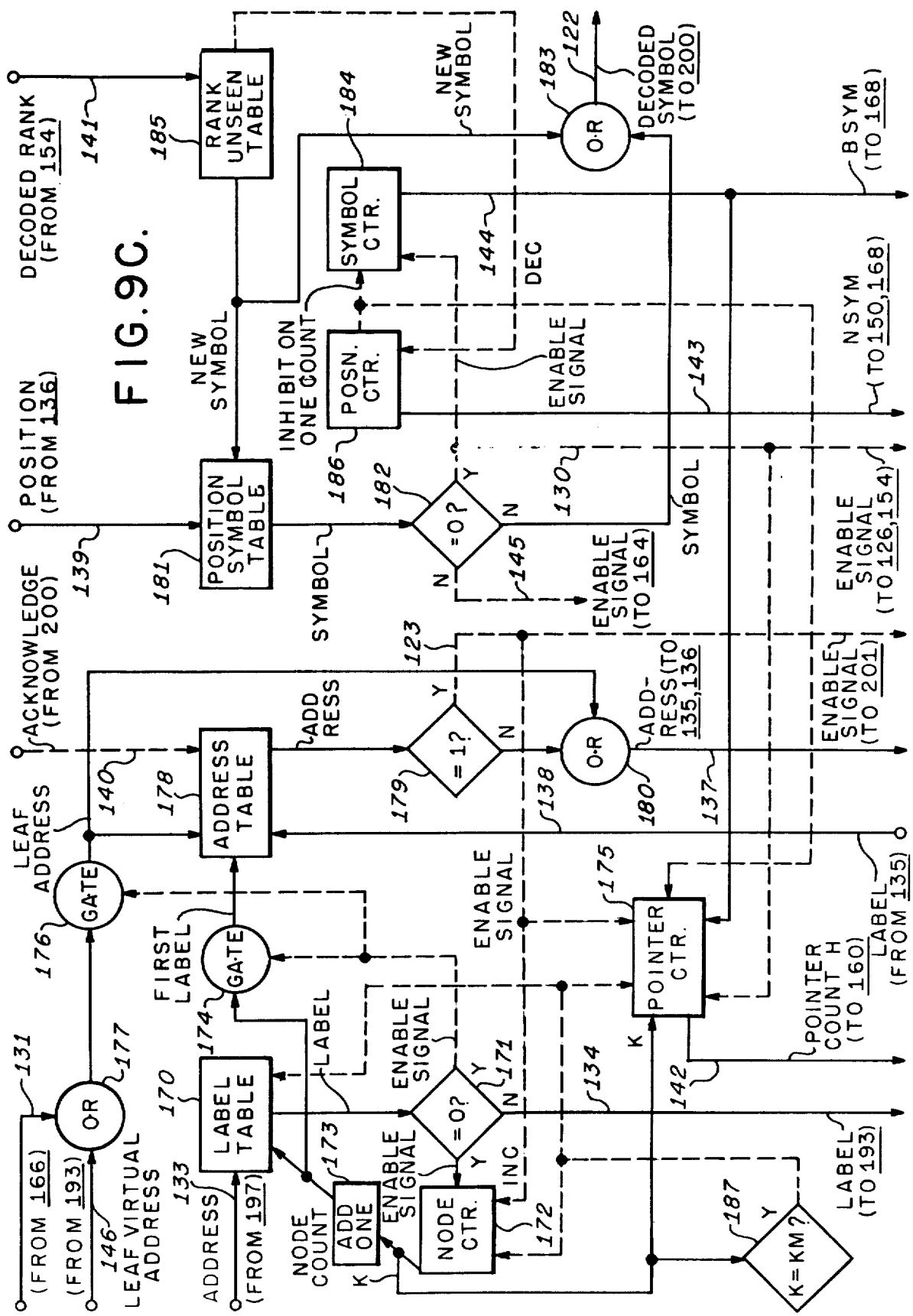

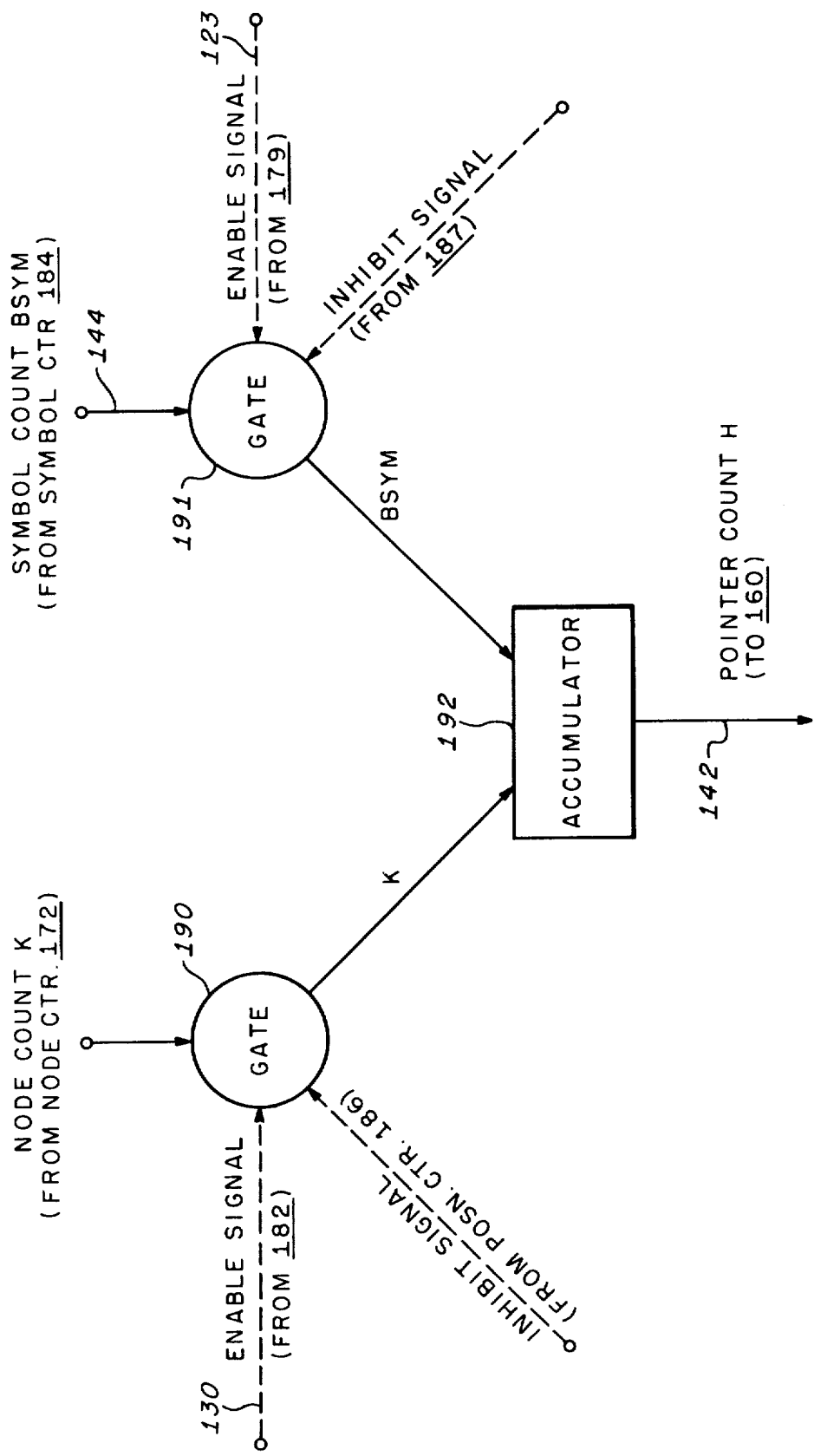

APPARATUS AND METHOD FOR COMPRESSING DATA SIGNALS AND RESTORING THE COMPRESSED DATA SIGNALS

BACKGROUND OF THE INVENTION

1. Field of the Invention

The invention relates to apparatus for processing data signals particularly with respect to apparatus and method for compressing data signals and reconstituting the compressed data signals.

2. Description of the Prior Art

Data compression systems are known in the prior art that encode a stream of digital data signals into compressed digital code signals and decode the compressed digital code signals back into the original data. The objective of data compression systems is to effect a savings in the amount of storage required to hold or the amount of time required to transmit a given body of digital information. The compression ratio is defined as the ratio of the length of the encoded output data to the length of the original input data. The smaller the compression ratio, the greater will be the savings in storage or time. By decreasing the required memory for data storage or the required time for data transmission, compression results in a monetary savings. If tapes or disks are utilized to store data files, then fewer tapes or disks are required for storing compressed files. If telephone lines or satellite links are utilized for transmitting digital information, then lower costs result when the data is compressed before transmission.

For example, it may be desired to transmit the contents of a daily newapaper via satellite link to a remote location for printing thereat. Appropriate sensors may convert the contents of the newspaper into a data stream of serially occurring symbol signals for transmission via the communication link. If the millions of symbols comprising the contents of the newspaper were compressed before transmission and reconstituted at the receiver, a significant amount of transmission time would be saved.

As a further example, when an extensive data base such as an airline reservation data base or a banking system data base is stored for archival purposes, a significant amount of storage space would be saved if the totality of symbol signals comprising the data base were compressed prior to storage and reexpanded from the stored compressed files for later use.

To be of practical and general utility a digital data compression system should satisfy four basic criteria. The system should be reversible, universal, asymptotically optimal and linear. In order for a data compression system to possess the property of reversibility it must be possible to reexpand or decode the compressed data back into its original form without any alteration or loss of information. The decoded and the original data must be identical and indistinguishable with respect to each other. The property of reversibility is synonymous with that of strict noiselessness as used in information theory.

For a digital data compression system to be universal one common procedure should be applicable to all data. No fore-knowledge of data source characteristics should be required or assumed and the compression method should be adaptive to any changes in the data source characteristics if they occur. The data must possess the characteristic of redundancy to be compressible.

A digital data compression system is asymptotically optimal if in the limit of increasingly long input data sequences, the system performs as well as or better than any other existing or conceivable data compression system. Special purpose data compression systems are known in the prior art designed for data with specific characteristics. Although a universal or general purpose data compression system will not always perform as well as a special purpose system on a small body of the specific data, a universal system that is asymptotically optimal will perform as well in the long run. As the amount of data to be compressed is increased without limit, the universal asymptotically optimal system should perform as well as any other method including a special purpose method designed for the data in question.

A data compression system is linear when the amount of processing time and the amount of working memory space required for the system increase only proportionately with the amount of data to be processed. The time required to execute the data encoding and decoding procedures should not grow faster than the amount of data to be processed. Thus the property of linearity ensures that the time required to compress large files will not exceed the available time regardless of the device speeds of the data processing components utilized. The working memory space required to execute the procedures also should not grow faster than the data, and it should be possible to limit the memory space to a fixed arbitrary size while continuing to process further input data if desired. Under this last constraint the compression may not be optimal.

Various data compression systems are known in the art, many of the systems utilizing special purpose compression methods designed for compressing special classes of data. Although such systems may be inexpensive to utilize and very effective when applied to the specific type of data for which they were designed, they can fail significantly, even causing expansion, when applied to data types for which they were not designed. In general purpose situations where the type and characteristics of the data to be encountered are not known in advance and may change during processing, such special purpose data compression systems, whatever their merits in special situations, are not practicable. Examples of data processing systems that can not be utilized for general application because of their lack of the property of universality utilize such methods as run-length encoding, zero-suppression, null-suppression and pattern substitution. One class of commonly utilized data compression methods consists of smoothing and filtering procedures. Smoothing and filtering techniques, which may be considered as special purpose and thus unsuitable in a general context, are also undesirable because of their lack of reversibility. The reexpanded data are only an approximation to the original data rendering these techniques unsuitable for applications such as banking, intelligence, scientific data, computer programs, command and control words, and the like.

The above described special purpose data compression systems suffer from the disadvantage of lacking the property of universality and in some instances of lacking reversibility. The present invention, to be described hereinbelow, provides a system for general use, for example in a computer disk storage system or in a data transmission system, where the type and characteristics of the data to be encountered are not known in advance and may change during processing.

General purpose data compression procedures are also known in the prior art, three relevant procedures being the Huffman method, the Tunstall method and the Lempel-Ziv method. The Huffman method is widely known and used, reference thereto being had in the article of D. A. Huffman entitled "A Method for the Construction of Minimum Redundancy Codes", Proceedings IRE, 40, 10 pages 1098–1100 (September 1952). Reference to the Tunstall algorithm may be had in the Doctoral thesis of B. P. Tunstall entitled "Synthesis of Noiseless Compression Codes", Georgia Institute of Technology (September 1967). Reference may be had to the Lempel-Ziv procedure in a paper authored by J. Ziv and A. Lempel entitled "A Universal Algorithm for Sequential Data Compression", *IEEE Transactions on Information Theory*, IT-23,3, pages 337–343 (May 1977). Further reference to the Lempel-Ziv procedure may be found in a paper authored by Messrs. Ziv and Lempel entitled "Compression of Individual Sequences Via Variable-Rate Coding", *IEEE Transactions on Information Theory*, IT-24,5, pages 530–537 (September 1977).

The best known and most widely utilized of these general purpose data compression procedures is the Huffman method. The Huffman procedure maps fixed-length segments of symbols into variable length words. The construction of a Huffman code for a set of n symbols $x(1), \ldots, x(n)$ with associated symbol probabilities $p(1), \ldots, p(n)$ is effected by constructing a binary tree whose leaves (external nodes) represent the symbols $x(1), \ldots x(n)$. The Huffman procedure involves selecting two leaves $x(i), x(j)$ with lowest associated probabilities and combining these leaves to form a new node, their father, at a higher level in the tree. This new father node then has an associated probability of $p(i)+p(j)$ and branches to $x(i)$ and $x(j)$. Next the two leaves $x(i)$ and $x(j)$ are removed from the set under consideration and the new father node is added to the set. This procedure is repeated until only one node, the root, with associated probability 1 remains. The resulting tree is utilized to assign code words to the symbols of the alphabet in the following manner. For each successive pair of branches emanating from a node, starting at the root, 0 is assigned to one branch and 1 is assigned to the other branch. The code word assigned to symbol $x(k)$ is given by the assignments to the successive branches in the path from the root to the leaf $x(k)$.

The Huffman data compression procedure suffers from two limitations. Firstly, the Huffman procedure operates under the constraint that the input data to be compressed be parsed into fixed-length segments of symbols. Although the Huffman procedure provides the best compression ratio that can be obtained under this constraint, when the constraint is relaxed it is possible to obtain significantly better compression ratios by utilizing other procedures. The present invention to be described hereinbelow does not operate under this constraint and thus achieves significantly lower compression ratios than does Huffman coding notwithstanding that Huffman coding is widely considered to be optimal. Secondly, Huffman coding requires foreknowledge of the statistical characteristics of the source data. The Huffman procedure operates under the assumption that the probability with which each fixed-length input segment occurs is known. This requirement of the Huffman procedure can, in practice, be obviated by the use of an adaptive version of the procedure which accumulates the necessary statistics during processing of the data. This, however, is cumbersome, requires considerable working memory space and performs suboptimally during adaptation. The present invention to be described hereinbelow does not require any a priori knowledge of the characteristics of the source data.

The Tunstall algorithm, which maps variable-length segments of symbols into fixed-length binary words, is complementary to the Huffman procedure with the fixed-length constraint now applied to the output segments instead of to the input segments. In the Tunstall procedure the output code word length is fixed with the consequence that the number n of code words and the set of code words are known in advance. The objective of the procedure is to make the set of messages (input segments) created by the input parsing as nearly equiprobable as possible. The procedure beings with a basic message set consisting of the, say m, symbols comprising the input alphabet. The most probable message is removed from the set and replaced by m new messages, each of which is the removed message suffixed by one of the m input alphabet symbols. This procedure is continued until the message set contains n messages. The n code words can then be assigned to these n messages in any manner desired.

The Tunstall procedure constrains the output string thereof to consist of fixed-length binary words. Under this constraint the procedure is asymptotically optimal with respect to other procedures having the same constraint. Since the present invention to be hereinafter described does not have a fixed-length constraint on either the input words or the output words, the present invention generally outperforms the Tunstall procedure. Like the Huffman procedure, the Tunstall procedure requires a foreknowledge, and in the case of the Tunstall procedure a very extensive foreknowledge, of the source data probabilities. Again this foreknowledge requirement can be obviated to some degree by utilizing an adaptive version which accumulates the statistics during processing of the data with the same concomitant disadvantages experienced by the Huffman procedure as discussed above.

Unlike the present invention, neither the Huffman nor the Tunstall codes have the ability to "extend the source", that is, to encode increasingly longer combinations of source symbols. The present invention gradually increases the lengths of words it is encoding, at least until memory is saturated, and thereby is able to compensate for dependencies in the probabilities of occurrence of source symbols. The Huffman and Tunstall codes necessarily treat probabilities of symbol occurrence as though they were independent, and thereby give inferior performance when dependencies exist.

The prior art Lempel-Ziv procedure, which maps variable-length segments of symbols into variable-length binary words, is asymptotically optimal when there are no constraints on the input or output segment lengths. In this procedure the input data string is parsed into adaptively growing segments, each segment consisting of an exact copy of an earlier portion of the input string suffixed by one innovative symbol from the input data. The copy which is to be made is the longest possible and is not constrained to coincide with an earlier parsed segment. The code word which replaces the segment in the output contains information consisting of a pointer to where the earlier copied portion begins, the length of the copy, and the innovative symbol.

One of the problems with the prior art Lempel-Ziv algorithm was that is did not exhibit the property of linearity since the required memory space grew at a non-linear rate with respect to the input data. Additionally, no means were available for locating the longest earlier match in linear time (time proportional to the length of the new segment). The encoding of the joint information of the pointer to the earlier match, the length of the earlier match and the innovative symbol was inefficient, compounding the impracticability of the algorithm.

The prior art, Lempel-Ziv algorithm, included a modification wherein the copy which is to be made is the longest possible and is constrained to coincide with an earlier parsed segment. The prior art Lempel-Ziv algorithm, including the modification, remains essentially an unrealized concept for data compression. The prior art algorithm, including the modification, has not been utilized since heretofore there has not been available any practical implementation of the algorithm.

The present invention to be hereinafter described provides practical implementations of the modified Lempel-Ziv algorithm to provide data compression apparatus and method that is asymptotically optimal without any word length constraints with respect to either the input or output data. The present invention also possesses the properties of linearity, reversibility and universality. It compresses data as well as or better than any heretofore known data compression apparatus or procedure and is faster than prior art procedures.

SUMMARY OF THE INVENTION

The invention compresses data by compressing a stream of data symbol signals into a compressed stream of digital code signals the data symbol signals being members of an alphabet of symbol signals comprising a predetermined number of symbol signals. The compression involves parsing the stream of data symbol signals into segments, each segment comprising a prefix and the next data symbol signal occurring in the data stream following the prefix. The prefix comprises the longest match with a previous segment. A pointer signal is generated for each segment, the pointer signal being representative of the previous segment matching the prefix and the next occurring data symbol signal suffixed to the prefix. The pointer signals generated for the respective segments of the stream of data symbol signals comprise the compressed stream of digital code signals. The parsing and pointer signal generation is achieved by defining a search tree having nodes and branches emanating from the nodes, each node having at most one incoming branch. The outgoing branches emanating from a node are representative of the respective symbol signals of the data alphabet, the branches having respective addresses associated therewith. A segment is parsed from the input data stream by tracing the incoming data symbol signals respectively from node to node in the search tree, starting at the root of the tree, until an external node or leaf of the tree is reached. The address associated with the leaf is utilized to provide the pointer signal corresponding to the parsed segment.

The original data is recovered from the sequence of pointer signals by defining a search tree to decompress the pointer signals, the decompression search tree being constructed in a manner identical to that of the compression search tree.

BRIEF DESCRIPTION OF THE DRAWINGS

FIG. 4a is an example of a parsed stream of data symbols from a quaternary alphabet;

FIGS. 4b–4j are successive stages of the incremental search tree constructed in accordance with the present invention for parsing the stream of data symbols of FIG. 4a into the segments illustrated and for providing the pointer signals corresponding thereto;

FIG. 5 illustrates conceptualized memory maps for the tables utilized in the encoder and decoder of the present invention;

FIG. 8 is a schematic block diagram of an embodiment of the data compression encoder of the present invention;

FIG. 8b is a schematic block diagram illustrating details of the pointer counter of the search tree data base apparatus of FIG. 8a;

FIG. 9c is a schematic block diagram illustrating details of the search tree data base apparatus of the decoder of FIG. 9;

FIG. 9d is a schematic block diagram illustrating details of the pointer counter of the search tree data base apparatus of FIG. 9c;

DESCRIPTION OF THE PREFERRED EMBODIMENTS

The encoding portion of the compression or present invention compresses digital data signals providing compressed code for storage or transmission. The decompression or decoding portion of the invention restores the compressed code signals to the original digital data signals. The digital data to be compressed is over a predetermined alphabet of a predetermined number of symbol signals. For example, if it is desired to compress the contents of English language textual material, the alphabet involved would be the 26 symbols of the English alphabet, the ten arabic digits and the plurality of punctuation symbology utilized in the English language. If it is desired to compress a string of binary data, the alphabet involved comprises the two symbols binary 0 and binary 1. It is appreciated in modern day data processing and communication systems that the symbols of, for example, the English language alphabet are processed and conveyed as bytes of binary digits in a convenient code such as the ASCII format. The symbols from a complex alphabet, such as the English language alphabet, may be handled by the present invention either in digital byte format or as strings of binary digits which comprise the bytes.

Two preferred embodiments of the invention will be described hereinbelow, one embodiment utilizing a general purpose digital computer storing encoding and decoding programs and the other embodiment comprising discrete hardware elements for performing the encoding and decoding.

Figure 1:
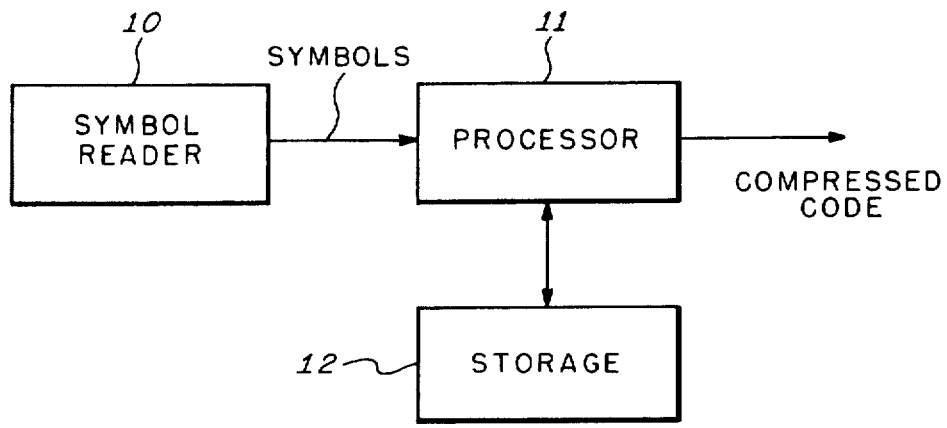
FIG. 1 is a schematic block diagram of the encoder (compressor) of a preferred embodiment of the invention.

Referring to FIG. 1, a schematic block diagram of the encoding system of the present invention is illustrated. A source of digital data symbol signals, such as a conventional symbol reader 10, provides the stream of symbol signals to be compressed to a digital processor 11 which in turn provides the compressed code signals corresponding to the input data. A storage medium 12, such as a disk file is associated with the processor 11 for providing temporary storage of input data, output data and processing programs. The processor 11 may be a general purpose digital computer for storing and executing the encoding program appended hereto. The compressed code from the processor 11 may be either transmitted, for example, to a remote location for decoding or may be stored in electronic storage files for, for example, archival purposes.

Figure 2:
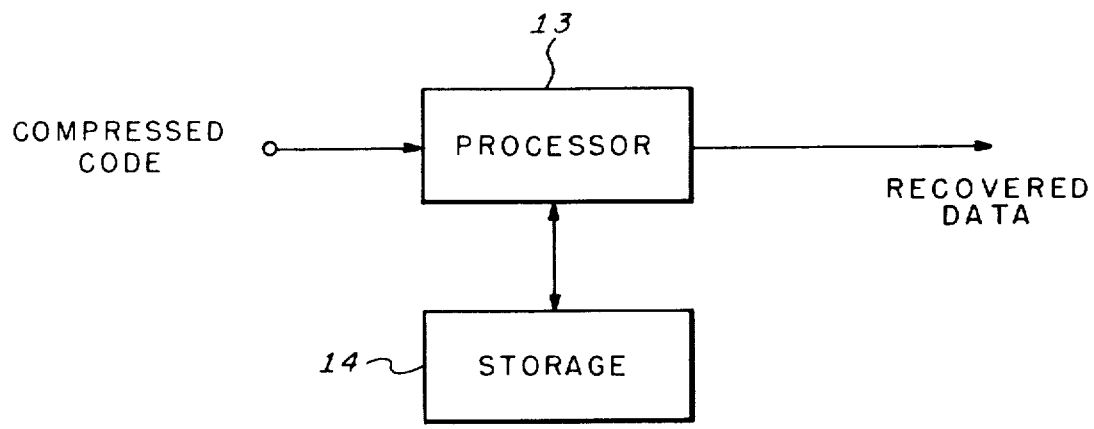
FIG. 2 is a schematic block diagram of the decoder (decompressor) of a preferred embodiment of the invention.

Referring to FIG. 2, a schematic block diagram of the decoding portion of the present invention is illustrated. The compressed code signals generated by the encoding apparatus of FIG. 1 is received by a processor 13 to provide the recovered data. A storage medium 14, such as a disk file, is associated with the processor 13 for temporary storage of input data, output data and processing programs. The processor 13 may comprise a general purpose digital computer for storing and executing the decoder program appended hereto.

In a data transmission system the processor 11 and the processor 13 may be remotely located with respect to each other. In a system wherein the invention is utilized for data storage the processors 11 and 13 may be distinct devices, the processor 11 providing the compressed code to archival storage and the processor 13 retrieving the compressed code therefrom to provide the recovered data. Alternatively in such a data storage system the processor 11 and the processor 13 may comprise the same computer with the encoding and decoding programs appended hereto stored therein for execution when required. It will be appreciated with respect to FIG. 1 and FIG. 2 that in the discrete hardware embodiment of the invention the processor 11 and storage apparatus 12 are replaced by discrete encoding hardware and the processor 13 and storage apparatus 14 are replaced by discrete decoding hardware.

The encoder of the present invention parses the input stream of data symbols into segments whereby each segment is comprised of a prefix and the data symbol next following the prefix in the data stream. The prefix comprises the longest match with a previously parsed segment of the data stream. Parsing may be conceptualized as inserting virtual commas between symbols of the data stream thereby setting off the segments. Therefore, in the present invention the search into the unprocessed data stream for a match involves searching from a comma to the next ensuing comma to find the longest match with a previously parsed segment.

Figure 3:
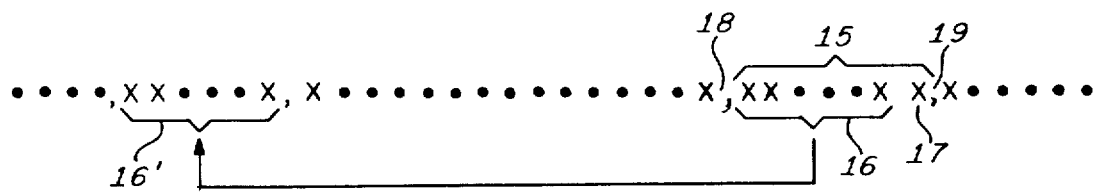
FIG. 3 is a schematic representation of a parsed portion of a stream of data symbols.

Referring to FIG. 3, a schematic representation of a portion of a stream of data symbols is illustrated where the "x's" represent arbitrary symbols of the alphabet. Commas are illustrated in the data stream only to depict the parsing. A segment 15 of the data stream is comprised of a prefix 16 and an innovative symbol 17. The innovative symbol 17 is the next symbol in the data stream following the prefix 16 irrespective of what symbol it is. In other words, the innovative symbol 17 may be a symbol that has been seen previously in the data stream or it may be a symbol of the alphabet that is encountered for the first time. The segment 15 is parsed or punctuated in the data stream by virtual commas 18 and 19. The prefix 16 matches the previous segment 16', and the segment 16' is the longest parsed segment preceding the comma 18 that matches the input data stream following the comma 18. The encoder of the present invention constructs a search tree data base that provides a pointer signal associated with the segment 15 that indicates the match to the previous segment 16' as well as the innovative symbol 17. The decoder responsive to the sequence of pointer signals corresponding to the sequence of parsed segments constructs a search tree data base identical to that of the encoder in order to recover the symbols of the parsed segments.

A precise definition of the parsing procedure utilized in the present invention may be had as follows: Let A be a finite alphabet of symbols, for example, $A = (0, 1, \ldots, m-1)$ and let $|A|$ denote the number of members in the set A, in this case m. A word (sequence, string) x of length $L(x)$ over A is an ordered k-tuple $x = x_1 x_2 \ldots x_k$ of symbols from A. Let $x(i,j)$ denote a substring or segment of x which starts at position i and ends at position j. When $i \leq j$, $x(i,j) = x_i x_{i+1} \ldots x_j$, but when $i > j$, $x(i,j) = \emptyset$ the null word of length zero. For each j, $0 \leq j \leq L(x)$, denote $x(1,j)$ as a prefix of x and $x(1,j)$ as a proper prefix of x if $j < L(x)$. Let $x(n_1 * n_2 * \ldots * n_p)$ denote the parsing of x into $p+1$ segments $x_i = x(n_{i-1}+1, n_i)$, $i = 1, 2, \ldots, p+1$, where $0 = n_0 < n_1 < \ldots < n_p < n_{p+1} = L(x)$. The parsing utilized in the present invention is derived by the following recursive procedure where k denotes the iterative steps thereof:

Initially, set $k = 1$ and $n_o = 0$.

At step k, find $i < k$ such that $x_i$ is the longest segment which is a prefix of $x(n_{k-1}+1, L(x))$.

Set $n_k = n_{k-1} + 1 + L(X_i)$.

The parsing procedure exhibits the following properties. The nomenclature $n_i$ denotes the position of the parsing comma for step $k = i$. For each $k = 1, 2, \ldots, p$;

$X_k = X_{i_k} x_{n_k}$ where $i_k < k$ is the value of i in the $k^{th}$ iteration of the parsing procedure. $X_{i_k}$ is always a proper prefix of $X_k$ and thus $L(X_k) > L(X_{i_k})$. It follows that if a data base is constructed whereby $X_i$ may be determined from the index i, $0 \leq i \leq k-1$, then it is possible to determine $X_k$ recursively given the joint event $(i_k, x_{n_k})$. Such a data base is provided by the search tree constructed in accordance with the present invention.

The search tree data base is constructed by the encoder of the present invention and is utilized both for parsing the input data into segments and for encoding the parsed segments. A similar data base is constructed by the decoder of the present invention and is utilized in decoding the encoded segments to recover the input data. In a manner to be described hereinbelow, the search tree base is actually stored as a set of tables or lists which in effect define the search tree over a finite alphabet.

The following definitions are useful in defining the search tree. A tree is a connected graph without circuits. A tree is directed if each of its branches (arcs) is directed. A tree is rooted if it has a unique node, denoted as the root, without incoming arcs. A path in a rooted tree is a sequence of arcs traversable consistently with their directions. Except for the root, every node of a rooted tree has exactly one incoming arc and, therefore, there exists a unique path leading to the node from the root.

Let T denote a rooted tree. A node of T without outgoing arcs is called an external node or a leaf. Nodes other than leaves are called internal nodes. If nodes $v_1$ and $v_2$ are joined by an arc directed from $v_1$ to $v_2$, $v_1$ is denoted as the father of $v_2$ and $v_2$ as a son of $v_1$. Nodes with a common father are called brothers. Let B be a finite alphabet. A search tree over B is a rooted tree having arcs labeled with symbols from B in such a manner that no two arcs emanating from the same node have the same label. A search tree over B is denoted by (T,B). Therefore, the search tree (T,B) can have at most $|B|$ arcs emanating from any of its nodes. A father with $|B|$ sons is called complete. Each node v of (T,B) defines a unique word W(v) over B, given by the sequence of labels on the arcs of the path from the root to v. The root defines the null word $\emptyset$. A word X over B is defined by (T,B) if there exists a node v in (T,B) such that $X = W(v)$.

The search tree is defined recursively during the parsing of the imput sequence. At step k, a new internal node is created from a leaf $v_k$ such that $W(v_k) = X_k$, the $k^{th}$ parsed segment. Let $A_k$ denote the alphabet of input symbols which have been seen through the $k-1^{st}$ parsing. These are the only symbols which appear on arcs leading to internal nodes. However, to be able always to create a new internal node from an existing leaf when $A_k < A$, one arc from each internal node is included labeled by some special symbol not in A, for example @, which represents all symbols in $A-A_k$. If $(T_k, B_k)$ denotes the incremental search tree at the $k^{th}$ step in the parsing, then $B_k = \{A_k, @\}$ if $|A_k| < |A|$, and $B_k = A$ if $A_k = A$. An arc receiving the label @ is called an alpha branch.

The definition of $(T_k, B_k)$ proceeds as follows. Initially, $k = 1$, $A_1$, is empty, and $B_1 = \{@\}$. The initial tree $(T_1, B_1)$ consists of two nodes, the root and a leaf, and one arc labeled @ leading from the root to the leaf. Given $(T_k, B_k)$ and the pending input $x^{(k)} = x(n_k-1+1, L(x))$, the defining node $v_k$ of $X_k$ can be located by tracing the incoming symbols of $x^{(k)}$ sequentially along a path of $(T_k, B_k)$ from the root. The label @ is considered to match any symbol of $A-A_k$. When a node is reached from which no further tracing is possible, it is identified as $v_k$. Let $\hat{v}_k$ denote the label on the arc entering $v_k$. If $\hat{v}_k \neq @$, then $X_k = W(v_k)$, the word defined by $v_k$, $B_{k+1} = B_k$, and $v_k$ is made the father of $|B_k|$ sons. If, however, $\hat{v}_k = @$, $X_k$ is obtained from $W(v_k)$ by replacing @ with the symbol $x_{n\ k}$ which it represents; then setting $B_{k+1} = \{B_k, x_{n_k}\}$, adding a corresponding new son to each internal node v in $(T_k, B_k)$, and making the new brother of $v_k$ the father of $|B_{k+1}|$ sons, rather then $v_k$ as above. If $|B_k| = |A| - 1$, the label @ is replaced everywhere by the single element of $A-A_{k+1}$.

The following properties of the search trees are noted. Each internal node of $(T_k, B_k)$ is complete and hence, $v_k$ is always a leaf. The father of $v_k$ defines the segment $X_{i_k}$ to be copied, and hence, the comma $i_k$. The search tree $(T_k B_k)$ contains k internal nodes and each internal node has 51 $B_k$ sons. Therefore, the total number of nodes is $1 + k |B_k|$, and the total number of leaves is $1 + k(|B_k| - 1)$.

The number of possible joint events (comma, innovation) is identical to the number of leaves in the tree $(T_k, B_k)$. Thus, if the leaves are numbered consecutively by the integers from 0 to $k(|B_k| - 1)$, then these numbers, denoted as leaf pointers, provide an efficient encoding of the parsed segment $X_k$. An efficient binary encoding of the leaf pointers is provided by the economy binary tree described below. Thus, the search tree of the present invention provides both a tool for parsing the input data and an efficient encoding of the parsed segments.

The decoding process constructs and utilizes the same search tree as the encoding process. The recursive growth of $(T_k, B_k)$ at the decoder proceeds in exactly the same manner as at the encoder. The initial tree $(T_1, B_1)$ is known in advance. Given $(T_k, B_k)$, the current encoded segment, say $Y_k$, can be used to identify $v_k$. By tracing the backward path from $v_k$ to the root, $\hat{v}_k$ and $X_{i_k}$ are obtained, and $(T_{k+1}, B_{k+1})$ can be determined as described above with respect to the encoder.

Thus the search tree of the present invention is utilized to parse the input data stream and to encode the parsed segments. The symbols of the input data are traced respectively from the root along the arcs of a path determined by the symbols until a leaf is attained. The leaf is expanded into an internal node as discussed above. To facilitate the tracing, each internal node of the search tree is assigned an integer label, the root being assigned the label 1. During successive parsing iterations, successively increasing integer labels are assigned to the internal nodes in the order in which they are created. Therefore, the internal node created at iteration k receives the integer label $k + 1$. Each node of a search tree over an alphabet having $|A|$ symbols in the alphabet has $|A|$ potential sons. A unique virtual address is provided for each of the potential sons of each of the nodes of the search tree. Each node label is utilized for calculating the unique virtual address for the $|A|$ potential sons of the node. The root is given the virtual address of 1. Conceptually a virtual search tree is created with $|A|$ sons for each internal node rather than with $|B_k|$ sons as described above. The symbols of the alphabet are assigned respective unique integer positions in accordance with the order in which the symbols are encountered in the input data stream. For an alphabet having $|A|$ symbols the integer position $|A|$ is assigned to the symbol of the alphabet that is first encountered in the input data stream, the integer position $|A|-1$ to the second symbol of the alphabet to be encountered in the input data stream and so on to the assignment of the integer position 1 to the last symbol of the alphabet to be encountered in the data stream. The first symbol to be encountered is designated as $x_1$ for reasons to be later clarified. Thus $\emptyset(j)$ is defined where $|A| \geq \emptyset(j) \geq 1$ provides a unique integer position assignment to the $j^{th}$ symbol of A. In other words $\emptyset$ is a mapping from A onto $\{1, 2, ... |A|\}$.

In the present embodiment of the invention the $j^{th}$ potential son of node i is assigned the unique virtual address $$\overline{i_j} = i|A| - \emptyset(j) + 2 \quad (1)$$

The rightmost or highest arc of each node of the search tree has the arc label associated therewith of the first symbol of the alphabet to be encountered in the data stream. This arc is denoted as the $x_1$ son. The next arc emanating from the node to the left of the $x_1$ son has as its arc label the second symbol of the alphabet to be encountered in the input data stream. The leftmost son of the node is reserved for the alpha branch until the last symbol of the alphabet has been encountered in the input data stream at which time this last symbol of the alphabet to be encountered in the data stream becomes the arc label for the leftmost son of the node.

The virtual addresses computed in the manner described above provide the capability of locating in a computer storage array the internal node label of any son and also provide a means for calculating the associated leaf pointer for encoding a segment. A trace of a forward path from the root to a leaf in the search tree $(T_k, B_k)$ entails successively finding the internal node labels of the nodes visited as the respective symbols of the input data stream are traced. The node label of a father in conjunction with the next occurring symbol of the input data stream provides the means for calculating the virtual address at which the node label of the son corresponding to the input symbol will be found.

The encoder utilizes a label table for storing the node labels assigned to the virtual addresses. When a leaf is attained in a parsing interation, the appropriate integer node label is stored at the leaf address. During iteraction k the stored node label is k + 1. The encoder also utilizes a symbol-position table that stores the integer positions $\emptyset(j)$ as discussed above, at the locations for the symbols of the data alphabet as the symbols are encountered in the input data stream. Further details of the label table and the symbol-position table will be discussed hereinbelow.

In a manner to be described below in greater detail, the encoder generates a pointer signal $Y_k$ corresponding to the segment of the input data stream parsed in the $k^{th}$ iteration. When a new symbol is encountered during an interation, an encoded version of the symbol is provided by the encoder. In a system wherein the present invention is utilized to provide compressed data for storage purposes, the stream of pointer signals and encoded new symbols are the quantities stored. When the invention is utilized in a data transmission environment, the stream of pointer signals and encoded new symbols are transmitted on the medium. The decoder of the present invention reconstitutes the original data by constructing a search tree identical to that constructed by the encoder in response to the stream of stored or transmitted pointer signals and encoded new symbols. During iteration $k-1$, the encoder constructs search tree $(T_k, B_k)$ and generates the pointer signal $Y_k$ corresponding to the virtual address of the leaf reached to parse the $k-1^{st}$ segment. During the $k-1^{st}$ iteration of the decoder, the decoder constructs search tree $(T_k, B_k)$ and receipt of pointer signal $Y_k$ provides the decoder with the virtual address of the leaf of $(T_k, B_k)$ associated with the current parsed segment. A backward trace from this leaf to the root provides the symbols of the current parsed segment as the labels on the arcs of this backward path. It is appreciated that the arc labels acquired from the backward path are in reverse order with respect to the parsed segment of the input data and must be reversed in a manner to be described.

The trace of the backward path through the search tree $(T_k, B_k)$, as is needed in decoding, requires different information from that of the encoder. For each node visited the virtual address of the father is required. From the virtual address $\overline{i}$ of the son, the node label i of the father may be computed by $$i = 1 + (\overline{i} - 2)/|A| \quad (2)$$

where the equation is computed by integer arithmetic.

From the virtual address $\overline{i}$ of the son and the node label i of the father computed from equation 2, the position $\emptyset(j)$ of the label of the arc from the son to the father is computed as $$\emptyset(j) = i|A| - \overline{i} + 2 \quad (3)$$

The decoder maintains an address table and a position-symbol table. The address table stores the virtual addresses transmitted by the encoder at appropriate node label locations. The decoder stores the virtual address transmitted by the encoder at the next sequential node label corresponding to the iteration. The virtual address of the father is obtained by means of the address table from the node label of the father provided by equation 2. Thus equation 2 and the address table provide the capability of a backward search from the leaf designated by the encoder back to the root so as to obtain the symbol of the parsed segment. The position-symbol table stores the symbols at locations designated by the positions $\emptyset(j)$. The first newly encountered symbol transmitted to the decoder by the encoder is stored at position $|A|$. The next newly encountered symbol is stored at $|A|-1$. The symbols are stored in the position-symbol table in the order received from the encoder at decreasing positions until the last symbol to be encountered is stored at position 1. The position recovered by equation 3 is converted to the symbol by the position-symbol table. Further details of the address table and the position-symbol table will be given hereinbelow.

Figure 4F:
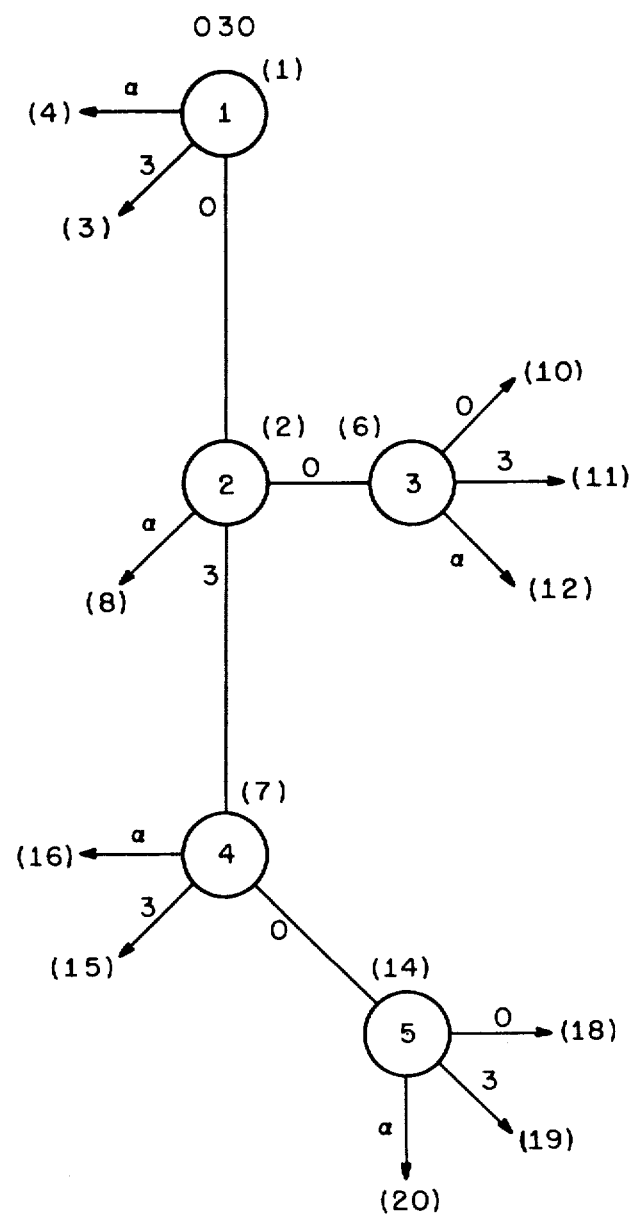
Figure 4G:
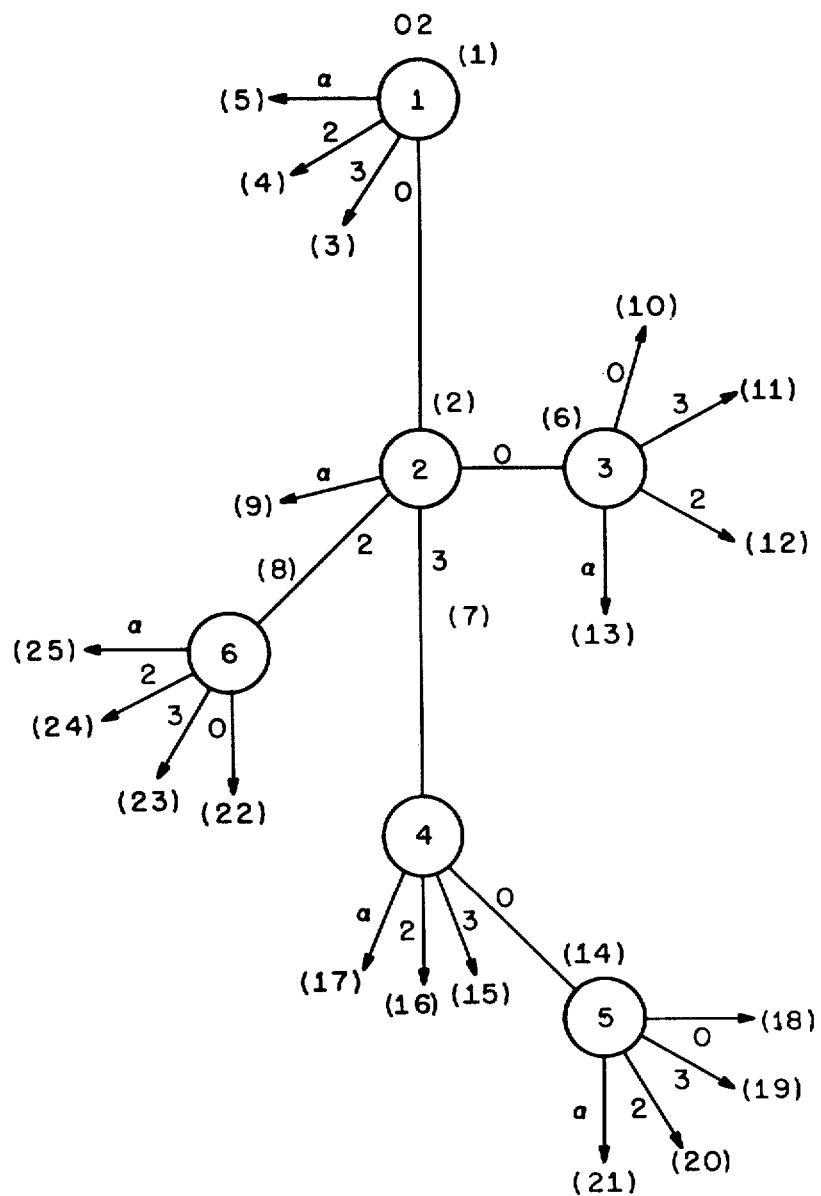
Figure 4H:
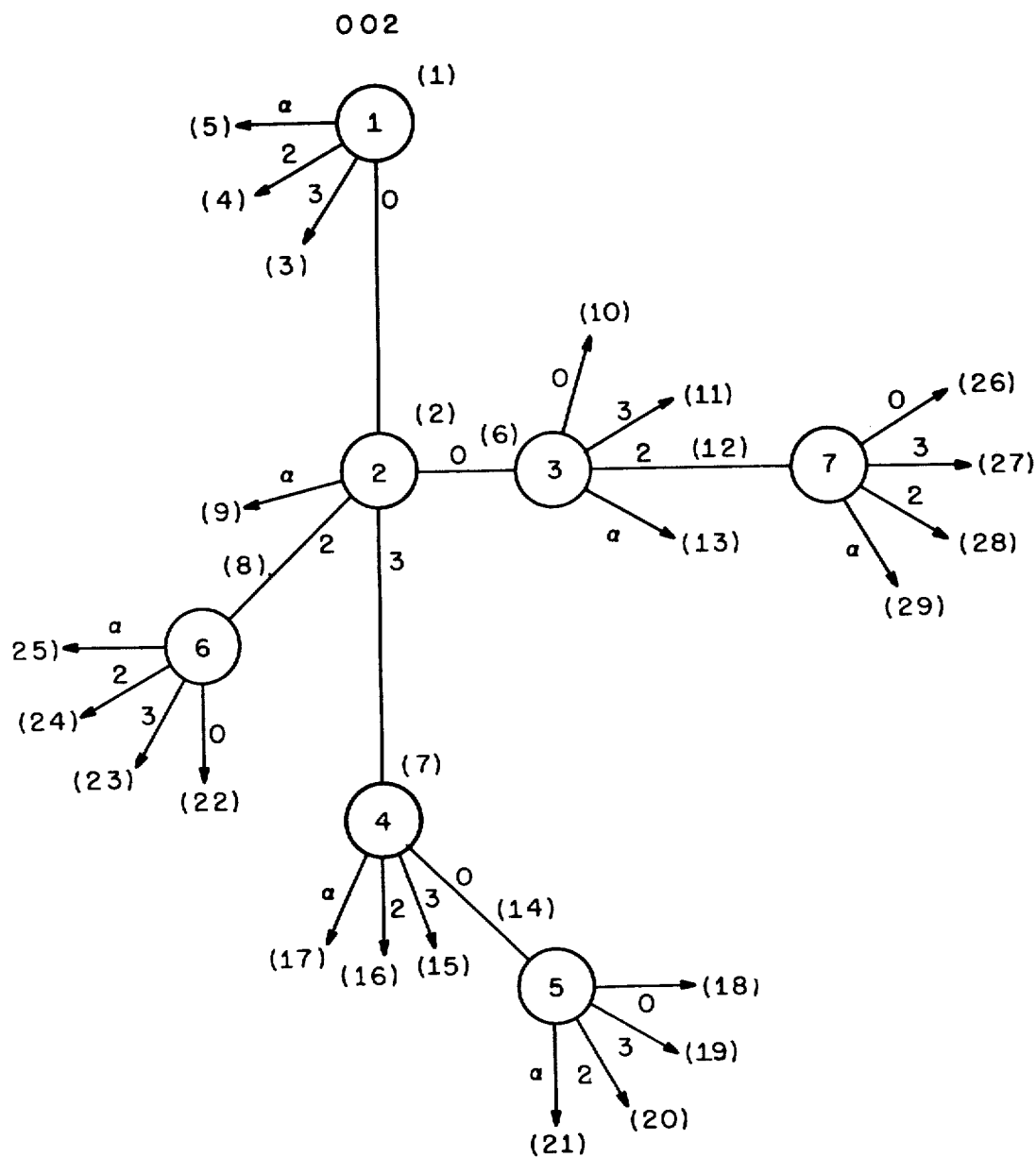
Figure 4I:
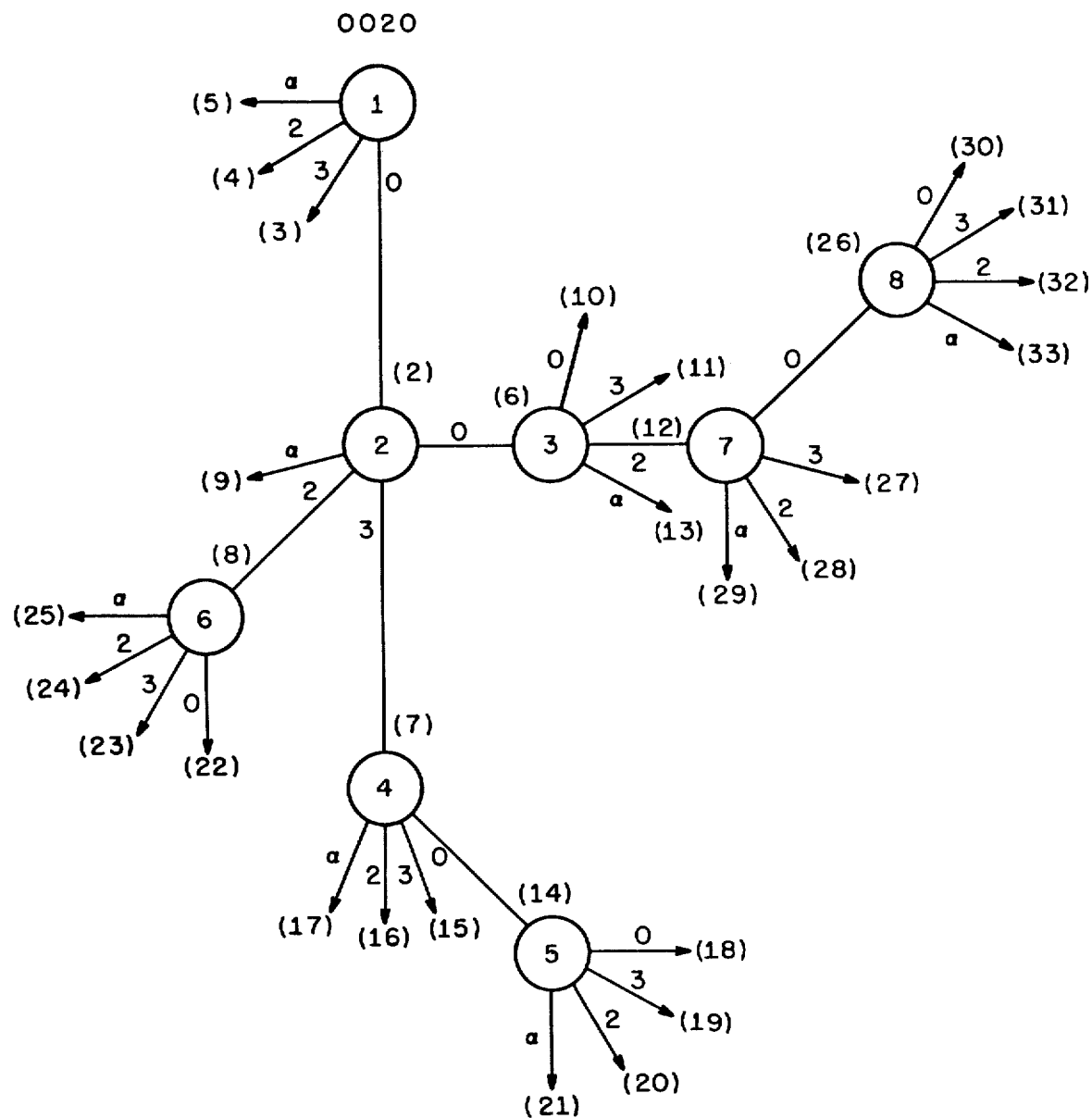
Figure 4J:
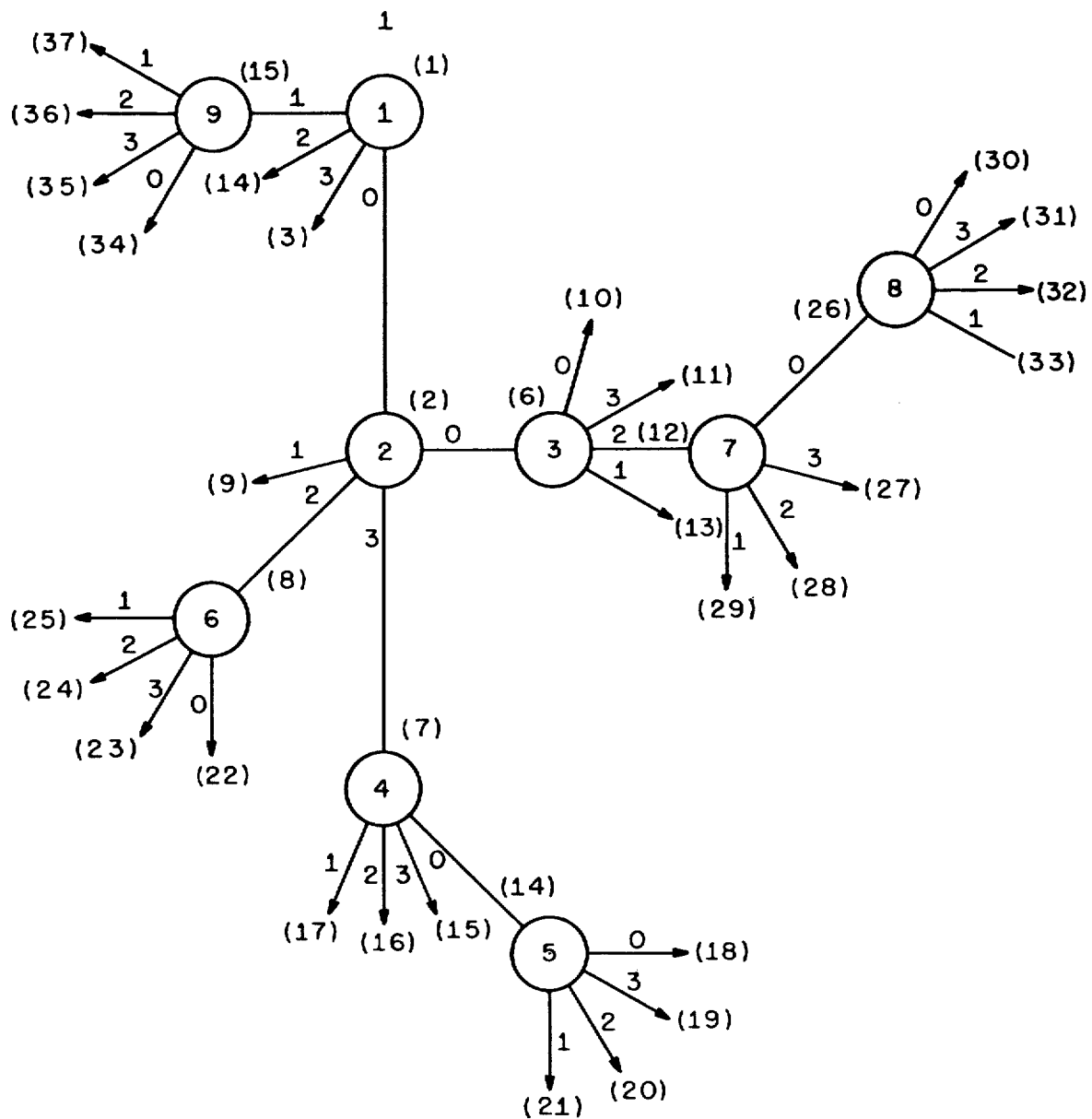

Referring now to FIGS. 4a–4j, and example of the adaptive incremental construction of a search tree is illustrated to facilitate an understanding of the invention. FIG. 4a provides an example of an input data stream over a quaternary alphabet comprised of the symbols "0", "1", "2" and "3". Thus in the example $|A|=4$. Virtual commas are inserted into the data stream only to illustrate the parsing. Starting at the left end of the data stream, the first symbol encountered is "0" and this symbol provides the first parsed segment. In the second iteration the search into the remaining data stream finds that the next encountered symbol "0" matches the first parsed segment. Thus this second symbol of the data stream forms the prefix of the second parsed segment. In accordance with the parsing rule, the next symbol, in this case "0" is suffixed to the prefix to form the second parsed segment "00". During the third iteration the search into the remaining data stream reveals that the longest match is with the first parsed segment "0" to which the next symbol "3" is suffixed to form the third parsed segment. It is noted that in this iteration the symbol "3" has been encountered for the first time. During the fourth iteration the longest match with the remaining input data stream is the third parsed segment "03" to which is suffixed the next occurring symbol in the data stream which in this instance is the symbol "0" to form the fourth parsed segment "030". The remainder of the exemplified data stream is parsed in the same manner to provide the parsed segments illustrated. Whenever a search into the data stream does not reveal a match with any previous segment, the next segment is considered to match the null segment of length 0 which the new segment is considered to have as its prefix. For example, the right most symbol "1" of the exemplified data stream is a newly encountered symbol and thus does not match any previously parsed segment.

Referring now to FIGS. 4b–4j, the search tree incrementally and adaptively constructed to parse the data stream of FIG. 4a is illustrated. The internal nodes of the tree are denoted as circles with the node labels therein and the leaves of the tree are denoted as arrowheads. The virtual address for each node (internal and external) is denoted by a number within parentheses. The arc label associated with each arc is denoted by a symbol adjacent the arc. FIGS. 4b, 4c, ..., 4j illustrate the respective search trees $(T_1, B_1), (T_2, B_2), ..., (T_8, B_8)$ where the symbols above the search tree denote the segment parsed thereby.

Specifically, FIG. 4b depicts search tree $(T_1, B_1)$. The tree $(T_1, B_1)$ consists of the root 1 and an alpha branch leading to a leaf with virtual address 2. It is noted that the alpha branch always assumes the position $\emptyset$ equal to the next unused position. Since no symbols of the alphabet have as yet been encountered, $\emptyset$ assumes the position 4 and utilizing equation 1 yields thee virtual address 2. As discussed above @ of the alpha branch matches all of the symbols not yet encountered. Since at this point no input data has been read, @ matches all of the symbols of the alphabet. Starting at the root 1, a trace of the symbols of the input data is begun. The first symbol "0" matches the alpha branch which terminates at the leaf having virtual address 2. Thus since a leaf has been attained, the first symbol of the exemplified data stream comprises the first parsed segment. The encoder transmits an encoded version of the virtual address 2 as the first leaf pointer $Y_1$ which in turn is received by the decoder. Since this is the first time that the symbol "0" has been encountered, an encoded version thereof is also transmitted to the decoder.

FIG. 4c illustrates search tree $(T_2, B_2)$ which is $(T_1, B_1)$ of FIG. 4b updated with the new information. In accordance with the updating procedure, the newly encountered symbol "0" replaces the alpha branch of FIG. 4b and a new alpha branch is added to node 1. The leaf with virtual address 2 is expanded into an internal node which is assigned the next sequential integer node label 2. The node 2 has two leaves, one for the symbol "0" and one for the alpha branch. The decoder updates the search tree in the same manner since it received the leaf pointer representing virtual address 2 indicating that that virtual address should be expanded as indicated. The decoder has also received the encoding of the newly encountered symbol "0" to provide the arc labels as depicted.

Since in the iteration described with respect to FIG. 4c the decoder received the leaf pointer representative of virtual address 2, the decoder starting at that virtual address and tracing back to the root encountered the symbol "0" on the arc from virtual address 2 back to the root, thus recovering the originally parsed segment. Actually the decoder utilizes equation 2 to obtain the node label of the father from the received leaf virtual address. Equation 3 is then utilized to obtain the position $\emptyset$ of the arc label and the position-symbol table consulted to retrieve the symbol itself.

The encoder is now ready to receive further input data. In the data stream example of FIG. 4a, the second symbol from the left now constitutes the beginning of the unprocessed data. The symbols of the data stream are traced with the tree of FIG. 4c starting at the root thereof. The first encountered "0" of the data matches the arc with virtual address 2. This arc leads to the internal node 2. The next symbol "0" matches the "0" son of node 2 which is a leaf with virtual address 6. Since a leaf has been attained, the next parsed segment is "00". The leaf pointer transmitted by the encoder to the decoder corresponds to the leaf virtual address 6. This information received by the decoder permits a backward trace from this leaf to the root providing the symbols of the parsed segment to recover the data. FIG. 4d illustrates the updating of the search tree wherein the leaf with virtual address 6 is expanded into internal node 3 with leaves.

The next segment "03" is parsed by the tree of FIG. 4d by tracing the 0 from node 1 to node 2 and going out along the alpha branch with virtual address 7 when the newly encountered symbol "3" is processed. FIG. 4e illustrates the updated tree wherein the arc with virtual address 7 is expanded into internal node 4. In the tree of FIG. 4e all of the alpha branches of FIG. 4d are replaced by the newly encountered symbol 3 and new alpha branches are added to all the nodes. The incremental growth of the search tree for the remainder of the data stream exemplified in FIG. 4a is depicted by FIGS. 4f–4j.

As discussed above, the search tree data base is constructed and stored by utilizing a plurality of tables. FIG. 5 illustrates conceptualized memory maps for the tables. The encoder utilizes a label table, a symbol-position table, and an unseen-rank table. The decoder utilizes an address table, a position-symbol table and a rank-unseen table as well as a label table. Each of the tables is schematically illustrated as having a left hand column and a right hand column, the left hand column being utilized for addressing the table, the right hand column being utilized for storing the retrieving quantities with respect to the addresses of the left hand column. Signals on an addressing input 30 address the locations of the table. When utilized in a write mode, a quantity applied to an input 31 is stored at the location addressed by the input 30. When utilized in a read mode, the quantity stored at the location addressed by the input 30 is applied to the table output 32.

With respect to the encoder, the initial tree $(T_1,B_1)$ is established by storing the node label 1 at the virtual address 1 in the label table denoting the root of the tree and storing zeros at the remainder of the virtual addresses. The symbol-position table provides a location for each of the symbols of the data alphabet. The symbols may conveniently be arranged in lexicographic order. Initially all zeros are stored at the positions corresponding to the symbols.

With respect to the decoder, initially the address table stores virtual address 1 at node label 1 corresponding to the root of the initial tree and zeros at all of the remaining virtual address locations corresponding to the remaining node labels. The position-symbol table provides locations for positions $|A|, |A-1|, \ldots 1$. Initially all zeros are stored at the symbol locations corresponding to the positions.

In the operation of the encoder a parsing iteration begins at the root of the search tree. Thus a signal on the input 30 of the label table addresses virtual addresses 1 and the label table returns the stored node label 1 on the output 32 thereof. The next symbol of the input data stream is applied to the input 30 of the symbol-position table which returns the corresponding position $\emptyset$ on the output 32 thereof. This position in combination with the node label returned from the label table is applied to equation 1 to compute the virtual address of the appropriate son. This computed virtual address is applied to the input 30 of the label table which returns on the output 32 of the label table the node label of the next node to be visited. This node label, in combination with the position of the next symbol, provides the next virtual address via equation 1 which, in turn, is utilized to again address the label table. This process continues until the label table returns the node label 0, indicating that a leaf of the search tree has been reached. The next sequential node label is applied to the input 31 of the label table and is stored at this leaf virtual address. The leaf virtual address is utilized in a manner to be described to provide the encoding $Y_k$ for the parsed segment.

If when the symbol-position table is consulted, a 0 is returned on the output 32 thereof, this indicates that a newly encountered symbol has been read. When this occurs the new sequential position is applied to the input 31 of the symbol position table and is stored at the location addressed by the symbol. When this position is utilized in equation 1 with the node label returned from the label table, the virtual addresses computed will be that of an alpha branch and when applied to input 30 of the label table, will return a 0 at the output 32 of the label table, indicating that the alpha branch reached is a leaf of the tree.

In the operation of the decoder the leaf virtual address provided by the encoder is stored at the next empty node label position of the address table. This virtual address applied to equation 2 yields the node label of the father. This computed node label applied to the input 30 of the address table returns a virtual address stored thereat on the output 32 of the address table which when applied to equation 2 yields the label of the next father node to be visited in the backward search. From each virtual address of a son and the node label of the father provided from equation 2, equation 3 utilized to provide the position of the associated arc. The position-symbol table is addressed by this position to recover the associated data symbol. In this manner a backward trace from the leaf virtual address to the root provides the symbols of the parsed segment in reverse order. When the position-symbol table of the decoder returns a 0 in response to an addressing position, this indicates that the encoder has encountered a new symbol. The encoder transmits an encoded version of this new symbol following the encoded version of the leaf virtual address. The decoder then receives this encoded new symbol and stores the new symbol at the position in the position-symbol table that had returned the 0.

In the digital computer embodiment of the invention the label table is an array F providing for each virtual address, the node label assigned to the node belonging to that address. Since in general there are many more addresses than labels, most of the label table array is empty and it is economical of storage to utilize hashing for the high-address portion of the array. Thus at times the node label is stored directly in the array F at the virtual address itself and in other cases the virtual address is utilized as an input key to a hashing function which computes a real address in F at which the label is stored. At the beginning of the encoding the storage available for node labels in the array F is divided between direct and hashed portions, the early (top) portion of the label table F is stored directly to save time since it is consulted frequently. The latter parts of the label table are hashed to save memory since they are consulted infrequently.

In the digital computer embodiment of the invention the address table is an array G providing for each node labe the virtual address of the node. The array G is the inverse of the array F and contains for each node label the assigned virtual address. Since the address table G has dimension equal to the number of internal nodes, it does not require nor benefit from hashing.

At the conclusion of the tracing of a forward path by the encoder the virtual address $\bar{i}$ of a leaf node is obtained for which no stored internal node label is returned from the label table F. Transformation of the search tree $(T_k, B_k)$ into $(T_{k+1}, B_{k+1})$ is completed by storing the internal node label $k+1$ at the leaf virtual address location in F. If a new symbol has been identified, the symbol table is updated as discussed above. The encoder then translates the leaf virtual address into the encoded output segment $Y_k$. The translation from $\bar{i}$ into $Y_k$ occurs in three parts:

1. Virtual $\bar{i}$ to "leaves-only" value D.
2. leaves-only value D to "green-leaves" value $D_g$.
3. Green-leaves value $D_g$ to output segment $Y_k$.

The translation is performed to effect further data compression economy. All nodes of the tree $(T_k, B_k)$ have unique virtual addresses but only leaves can function as pointers to eligible joint events (comma, innovation). Since only $1+k(|A_k|-1)$ of the $1+k|A_k|$ nodes of $(T_k, B_k)$ are leaves, it is appreciated that only some integer values of the dense set of integer virtual addresses are utilized for the leaves. It is the objective of the translation of $\bar{i}$ into $Y_k$ to provide a dense set of integer values for the leaves beginning with the integer 0. An appropriate correction is to subtract the internal node label of the father from the virtual address of the son. This, however, is insufficient since some values would be repeated while others are still unused. It is further desirable to reuse the pointer of an internal node father by reassingning it to one of the sons, for example, to that son with the smallest virtual address. This is the son j for which $\emptyset(j) = |A|$. As discussed above, the symbol encoding $\emptyset$ utilized by the encoder assigns the position $|A|$ to $X_1$, the first symbol encountered, $|A|-1$ to the second symbol and so forth.

The first part of the translation, virtual address $\bar{i}$ to leaves-only value D, is performed concurrently with the path tracing. During path tracing three quantities are maintained: C, the virtual address of the son; E, the label of the father; and D, the leaves-only representation of C. If the current symbol from the input data sequence differs from $X_1$, the pointer D, initially set to 0, is redefined as $$D=C-E-1 \qquad (4)$$

If the current symbol equals $X_1$, the pointer D is not redefined and thus retains the value of the pointer for the father. It is appreciated that in the embodiments of the invention the quantity $\overline{C}$ is utilized to represent the virtual address $\overline{i}$ of the son and the quantity E is utilized to represent the node label i of the father.

The remaining parts of the translation occur after the path tracing has been completed. D then represents the leaves-only value of the leaf pointer for the external node whose virtual address is C, but the numerical value of D is based on a full alphabet of $|A|$ symbols. When $|A_k| < |A|-1$, the number of leaves which can be reached is not $1+k(|A|-1)$ but is $1+k|A_k|$. The $1+k|A_k|$ leaves which can be reached are denoted as green-leaves. Thus the leaves-only values of the green-leaves can be mapped into the range $(0,k|A_k|)$ by the transformation $$D_g = D + (1-|A-A_k|)(D/(|A|-1)) \qquad (5)$$

where $D_g$ is the green-leaf value of the pointer D and is computed utilizing integer arithmetic. It will be appreciated hereinafter when discussing the embodiments of the invention that the variable $NSYM = |A-A_k|$ is the number of unseen symbols at the $k^{th}$ parsing and the variable $ASYM = 1-NSYM$. It will be appreciated that the green-leaf values of the leaf pointers for the search tree $(T_k, B_k)$ form a dense set of integer values $0, 1, 2, \ldots, k|A_k|$.

The final part of the translation from the leaf virtual address C into the encoded binary segment $Y_k$ is accomplished by a binary tree that translates the green-leaves value to an economy binary code. The binary tree is thus denoted as an economy binary tree. Let H be the number of leaves of the tree $(T_k, B_k)$ that provided the encoded binary segment $Y_k$. The economy binary tree provides a binary prefix code for the integers from 0 to $H-1$ utilized as pointers for the H leaves such that the code word lengths are as small and as uniform as possible. The resulting economy code is a left-biased, balanced, prefix (tree) code, equivalent to a Huffman code constructed for a set of equally probable messages. Let $l(H)$ denote the least integer which is not less than $\log_2(H)$. The code thus defined by the economy tree comprises $2H - 2^{l(H)}$ words of length $l(H)$, assigned to the first $2H - 2^{l(H)}$ members of $(0, H-1)$ and $2^{l(H)} - H$ words of length $l(H)-1$, assigned to the last $2^{l(H)} - H$ members of $(0, H-1)$. For example, if $H=5$, then $l(H)=3$ and the assignments are (0:000), (1:001), (2:01), (3:10), and (4:11). For $H=6$, the assignments are (0.000), (1:001), (2:010), (3:011), (4:10), and (5:11). The economy tree grows, with an incrementing of H by branching from the left most nodes of length $l(H)-1$, producing two new nodes of length $l(H)$. Use of the economy tree saves on the average about one-half bit per output segment $Y_k$.

In operation the encoder compares the green-leaves value of the pointer with a threshold quantity $TB = 2H - 2^{l(H)}$. If $D_g > TB$ then $D_g$ is replaced by $2D_g - TB$, i.e., $$D_g = (2D_g - TB)/2 \qquad (6)$$

which is then encoded utilizing $l(H)$ bits. The last bit is discarded providing the desired encoding utilizing $l(H)-1$ bits. If $D_g \leq TB$, $D_g$ is encoded without change. For example, if $H=5$ and $TB=2$, then when $D_g=3$, $D_g$ is changed to $2D_g - TB = 4$, which is encoded using 3 bits as 100. This encoding is then converted to the desired 2 bit encoding 10 by truncating the final bit. If, however, $H=6$, then $TB=4$ and $D_g=3$ is encoded without change as 011.

As described above, the encoder provides the pointer signals $Y_k$ corresponding to the parsed segments of the input data stream. The decoder receives the pointer signals as an input compressed data stream extracting each of the pointers $Y_k$ therefrom and translating the pointer into the virtual address $\overline{i}$ of the appropriate leaf of the search tree $(T_k, B_k)$. The parsed segment $X_k$ is then recovered by tracing the path backward to the root, extracting the arc labels encountered along the way. The translation from $Y_k$ $\overline{i}$ occurs in three parts, reversing the order of the translation described above from $\overline{i}$ to $Y_k$ by the encoder:

1. Segment $Y_k$ to green-leaves value $D_g$.
2. Green-leaves value $D_g$ to leaves-only value D.
3. Leaves-only value D to virtual address $\overline{i}$.

The first part of the translation comprises converting the binary economy encoding $Y_k$ to the green-leaves value $D_g$. The threshold TB is computed as described above with respect to the encoder and $Y_k$ is initially assumed to utilize $B = l(H)$ bits where H is the current number of green leaves in the tree. The B-bit number is compared with the threshold TB and if $Y_k \leq TB$, then $D_g = Y_k$ is the green leaves value and no change is required. Otherwise only $B-1$ bits were utilized to encode the pointer and $D_g$ is obtained from the equation:

$$D_g = (Y_k + TB)/2 \qquad (7)$$

where $D_g$ is computed utilizing integer arithmetic.

The second step of the translation converts the green-leaves value $D_g$ to the leaves-only value D. If $D_g = 0$, then $D=0$. If, however, the green-leaves value $D_g$ is not 0, then the leaves-only value is recovered by the integer equation $$D = D_g + CSYM((D_g-1)/BSYM) \qquad (8)$$

where $BSYM = |A_k|$ the number of distinct symbols currently encountered and CSYM is one less than the remaining number of potential but unseen symbols, or 0 if all $|A|$ symbols have appeared. Thus, when less than all $|A|$ symbols have appeared, $CSYM = NSYM - 1 = |A - A_k| - 1$.

The third part of the translation converts the leaves-only value D to the virtual address $\overline{i}$. A virtual address is obtained from D by the following equation:

$$\overline{i} = D + (D + 2|A| - 3)/(|A|-1) \qquad (9)$$

where $\overline{i}$ is computed utilizing integer arithmetic. It is appreciated, however, that i may be the virtual address, not of a leaf, but of an internal node, since in computing leaves-only values the encoder passes the pointer value of the father to its $X_1$- son. The translation is completed by determining whether $\overline{i}$ is the address of a leaf or of an internal node. If it is the address of an internal node the node is replaced by its $X_1$- son and this process is continued until a leaf is attained.

In order to test whether the received virtual address i is the address of a leaf or of an internal node the decoder utilizes a forward tree label table which is constructed in the same manner as that constructed by the encoder as discussed above. The decoder label table may be conceptualized as being configured in accordance with the label table memory may of FIG. 5. The label table of the decoder receives the virtual address transmitted by the encoder and a forward trace is conducted in the manner described above until the label table returns a node label of 0. The virtual address that returns the 0 node label is that of the desired leaf for starting the backward trace. This leaf virtual address is then utilized by the decoder in conjunction with equation 2 and the address table to effect the backward trace as described. Additionally, the decoder forward tree label table is updated by storing the next sequential node label at the leaf virtual address that returned the 0. The decoder backward tree address table is also updated as described above.

Thus it is appreciated that if the last symbol in a parsed segment is the first encountered symbol $X_1$, the label table is utilized by the decoder for translating the encoded pointer $Y_k$ back into the corresponding virtual address. The label table is utilized by the decoder to traverse $X_1$- arcs until a leaf is attained. The decoder then utilizes the address table beginning from the attained leaf, traversing arcs back through the tree until reaching the root. The decoder label table in effect determines how many repetitions of the initially encountered symbol $X_1$ are required to attain the leaf from which to start the backward trace.

As discussed above, whenever a newly encountered input symbol is detected, a new branch is created from every internal node to represent the new symbol and an encoded version of the new symbol is appended to the encoder output segment $Y_k$ in the encoder output data stream. It is more efficient to encode the rank of the new symbol in a list of all unseen but potential symbols instead of encoding the symbol itself. Thus, the unseen-rank table of FIG. 5 provides, for each potential symbol never encountered previously, the rank of the symbol among all the unseen symbols. The encoder maintains this ordered unseen-rank table, denoted as DR in the digital computer embodiment of the invention, of potential, but as yet unseen, symbols. FIG. 5 illustrates the conceptualized memory map for the unseen-rank table. All of the symbols of the input data alphabet are arranged in the left hand column in any convenient order, for example, lexicographic order. Corresponding ranks for the respective symbols are stored in the right hand column and may be retrieved on the output 32 by addressing the symbol on the input 30. The ranks may be ordered in any convenient manner, for example. 1, 2, .. ., $|A|$ or the inverse $|A|, |A-1|, \ldots, 1$. When a new symbol is detected and its rank provided by the unseen-rank table, the table is thereafter updated by removing the symbol and its corresponding rank therefrom and decrementing the rank of each symbol appearing thereafter in the table to maintain stored in the table at all times a dense set of integer valued ranks.

As previously discussed, a savings is realized by utilizing the rank of a newly encountered symbol as a representative of the new symbol in the encoder output data stream. A further savings is realized (on the average of about one-half bit per encoding) by utilizing an economy binary tree to provide an economy binary prefix code for the rank values in a manner similar to that described above with respect to the pointer values. The new symbol ranks are encoded utilizing the economy binary tree in identically the manner described above with respect to the pointer signals except that the number of unseen symbols $NSYM = |A - A_k|$ determines the parameters rather than the pointer count H as discussed above. Thus the economy binary tree provides a binary prefix code for the dense set of integer ranks 1, 2, ..., NSYM such that the code word lengths are as small and as uniform as possible. Let $\dagger(NSYM)$ denote the least integer which is not less than $\log_2(NSYM)$. A threshold is then defined as $TA = 2 \cdot NSYM - 2^{\dagger(NSYM)}$. The code defined by the economy tree then contains $2NSYM - 2^{\dagger(NSYM)}$ words of length $\dagger(NSYM)$, assigned to the first $2NSYM - 2^{\dagger(NSYM)}$ members of (1,NSYM), and $2^{\dagger(NSYM)} - NSYM$ words of length $\dagger(NSYM) - 1$, assigned to the last $2^{\dagger(NSYM)} - NSYM$ members of (1,NSYM). The economy tree grows, with an incrementing of NSYM by branching from the leftmost of the nodes of length $\dagger(NSYM) - 1$, generating two nodes of length $\dagger(NSYM)$.

In operation the encoder compares the rank value with the threshold quantity $TA = 2NSYM - 2^{\dagger(NSYM)}$. If rank $R > TA$, than R is replaced by $$R = 2R - TA \tag{10}$$

which is then encoded utilizing $\dagger(NSYM)$ bits. The last bit is discarded providing the desired encoding utilizing $\dagger(NSYM) - 1$ bits. If $R \leq TA$, then R is encoded without change.

The economy encoded rank is received by the decoder and converted back into the rank value as follows. Initially the decoder assumes that $A = \dagger(NSYM)$ bits have been utilized to encode the symbol rank. The A-bit number is compared with the threshold TA and if $R \leq TA$, then the rank value equals the encoded rank value and no change is required. If, however, the encoded symbol rank is greater than the threshold TA, only $A - 1$ bits were utilized to encode the rank and the rank R is obtained from the integer equation $$R = (R + TA)/2 \tag{11}$$

The decoder then utilized the rank-unseen table to recover the symbol from the decoded rank.

The rank-unseen table (FIG. 5) of the decoder is the inverse of the unseen-rank table of the encoder described above. The rank-unseen table stores the column of ranks and the column of corresponding symbols in the same order as that described with respect to the unseen-rank table. When the rank-unseen table is utilized to recover a new symbol, the symbol and its rank are removed from the table and all lower symbols and ranks of the table are moved up one location in a manner identical to that described above with respect to the unseen-rank table. In this manner the rank-unseen table maintains a dense set of integer ranks.

It will be appreciated that the unseen-rank table of the encoder and the rank-unseen table of the decoder are complementary with respect to each other. The only a priori information required by the data compression system is the alphabet size $2^m$ where m is the symbol size in bits. Although it is preferable that the symbols are ordered and updated in the same manner in both tables, this is not a requirement. Initially, however, both tables must store the entire alphabet of symbols over which the data is provided and the same rank must be assigned to the same symbol in both tables. The updating procedures utilized by both tables must be such as to maintain the correspondence between symbols and ranks the same with respect to both tables. The rank-unseen table assigns an unseen but potential symbol to each rank up to the number of unseen symbols.

The digital computer embodiment of the invention is implemented by utilizing the programs appended hereto in the processors 11 and 13 of FIGS. 1 and 2, respectively. The encoder portion of the invention is implemented by loading the encoder program into the processor 11. The decoder is implemented by loading the decoder program into the processor 13. The appended programs utilize the FORTRAN V language and, therefore, any digital computer with a FORTRAN V compiler may be utilized for each of the processors 11 and 13. As discussed above, one computer storing both the encoder and decoder programs may be utilized to perform both functions. It is appreciated that the programmed computer version of the invention comprises one embodiment of the invention, other embodiments being realizable by microprogrammed or hard wired electronic devices. One such embodiment will be hereinafter described. The encoding and decoding programs construct and maintain the search tree described above, tracing paths therethrough to encode and decode segments of data. It will be appreciated that present day computer systems with which the invention may be utilized usually provide appropriate subroutines in their software libraries suitable for calling by the appended programs. Comments are provided with the appended encoder and decoder programs to explain the functions thereof.

Figure 6:
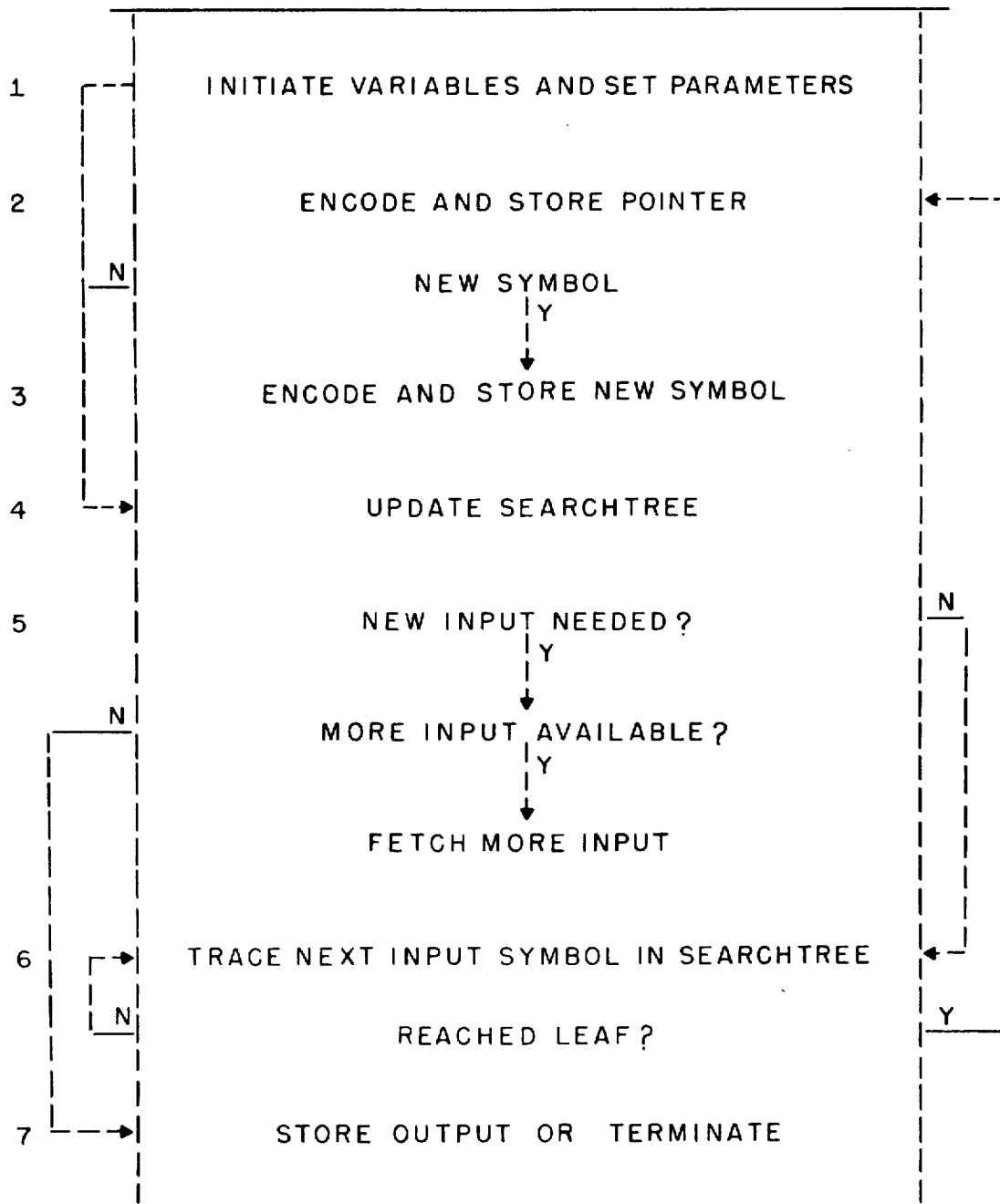
FIG. 6 is a flow chart depicting the operation of the data compression encoder of the present invention.

Referring to FIG. 6, a flow chart of the encoder program is illustrated. The encoder program is comprised of seven sections: initialization, pointer encoding, symbol encoding, search tree updating, input testing, path tracing, and termination. The program flow is designated by the YES and NO arrows denoted by the legends.

The initialization section of the encoder program defines initial values for program variables, sets up the symbol-position table SYM and the unseen-rank table DR, and partitions the available storage for the search tree between direct and hashed portions. The initialization section is concluded by a jump to section 4 to define the initial 2-node search tree.

Section 2 of the encoder program completes the encoding of the leaf pointer as described above by performing parts 2 and 3 of the encoding. The third line of code in the section converts the leaves-only value of the pointer into the green-leaves value by utilizing equation 5 above. The fifth line of code defines the threshold TB and the 5th and 6th lines test the pointer against the threshold and modify the pointer when necessary, utilizing Equation 6 above. The lines 7-19 of section 2 of the encoder program control storing the encoded pointer in an output array Z, which, when full, is emptied onto a disk file. To conclude section 2 of the encoder program, a jump is taken to section 3 or section 4 in accordance with the last symbol processed being, or not being, a newly encountered symbol.

Section 3 of the encoder program encodes the rank of the newly encountered symbols. Line 2 of the section defines the threshold TA and line 7 modifies the rank utilizing equation 10 above, if the threshold is exceeded. The unseen-rank table DR is updated by the DO loop at lines 5-6. The count NSYM of unseen symbols is decremented at line 21 and if any remain, a new green leaf is created at line 25 for every internal node of the search tree. Lines 8-20 are concerned with storing the encoded symbol in the output array Z.

Section 4 of the encoder program performs the updating of the search tree unless the maximum tree size KM has been attained. The present program retains the tree in a static state when the alloted storage therefore has been exhausted. Alternatively, the search tree storage could be emptied and a new tree grown. The count K of internal nodes is incremented and the internal node label K is stored at the appropriate address in the label table array F. The count H of green-leaves is augmented by BSYM, the number of symbols $|B_k|$, and if necessary, the value of $+(H)$, called B in the program, is corrected. The leaves-only pointer value D is reset to 0 in preparation for the next search.

Section 5 of the encoder program performs a test to determine whether additional input is needed and available. If not available, an exit is made to the program termination section 7. Otherwise, if input is required, it is obtained from a disk file and read into the input buffer array R. The virtual address C of the current node is reset to 1 to begin a new search from the root in section 6.

Section 6 of the encoding program implements the parsing procedure described above. Input symbols are traced along a forward path of the search tree from the root to a leaf. Separate coding is executed in accordance with whether the current node C belongs to the direct or hashed portion of the tree (line 30 of the section). The next input symbol is read and replaced by its position utilizing the symbol-position table SYM (lines 12-26 of section 6). At line 27 of the section the virtual address for the new son, which replaces C, is calculated utilizing equation 1. The leaves-only pointer is updated at line 28, utilizing equation 4 unless the current symbol is $X_1$. Thereafter the internal node label E for the node C is sought in the array F. The tracing continues until F does not return any node label for the node with address C. When this occurs a leaf has been reached and an exit is taken to section 2.

In the termination section 7, any remaining encoded output in the array Z is stored on the disk file and the program run terminated.

Figure 7:
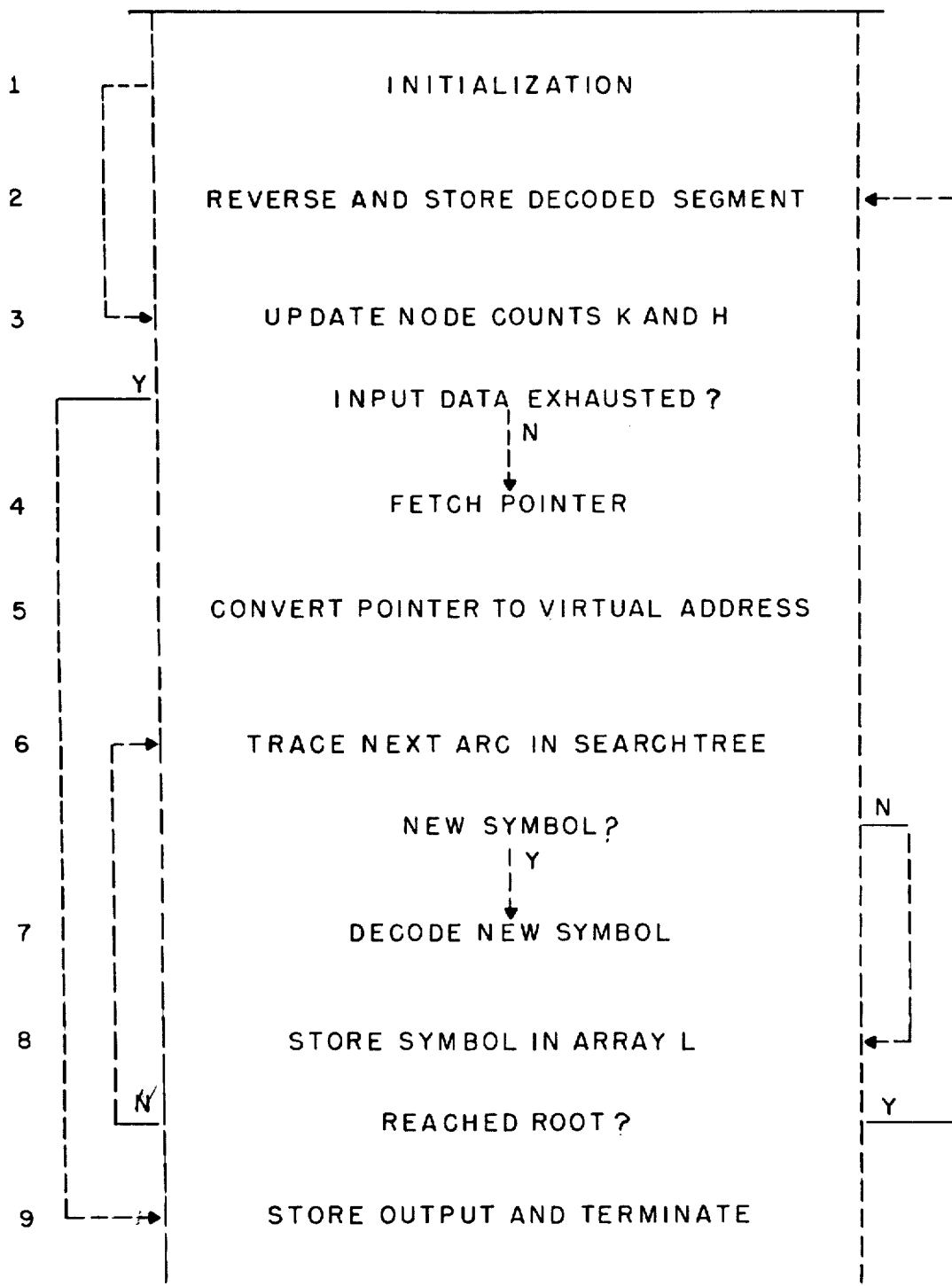
FIG. 7 is a flow chart depicting the operation of the data compression decoder of the present invention.

The program for the decoder appended hereto is comprised of 9 sections: initialization, store segment, update node counts, fetch pointer, convert pointer to address, backward trace, fetch symbol, store symbol, and termination. A flow chart for the decoder program flow is illustrated in FIG. 7 where the YES and NO arrows depict the flow as indicated by the legends.

Initialization section 1 of the decoder program is similar to that for the encoder and additionally includes storing the label of the root and the backward pointer for its sons as well as obtaining the initial block of input data from the assigned input file. Section 1 concludes by a jump to section 3.

At the beginning of section 2 the temporary storage array L contains the symbols of the decoded segment $X_k$, but in reverse order. In section 2 the order of the symbols is reversed and $X_k$ is stored in the output buffer R. Whenever R is full, it is emptied onto a disk file.

In the first line of section 3 a test is performed to determine whether all input data has been processed. If so, an exit is taken to the termination section 9. Otherwise, unless the maximum tree size has been attained (line 2), the count of green leaves H is augmented by the number of symbols which have been seen (line 4), and the number of internal nodes K is incremented (line 5). The updating of the search tree is completed in section 5 after the virtual address of the new leaf has been determined.

In section 4 the encoded pointer $Y_k$ is extracted from the input data stream and converted to its green leaves value. The first line of coding in section 4 computes the threshold TB and lines 22 and 23 of the section recover the green-leaves value utilizing equation 6 if the pointer value exceeds the threshold. The remainder of the section is concerned with reading more input data from the disk file into the input buffer z, if required.

In section 5, line 1, the green-leaves value of the pointer is replaced by the leaves-only value utilizing equation 8. Line 2 of the section converts the leaves-only value to the virtual address of a node of the search tree utilizing equation 9. The decoder label table is then utilized to trace a forward path in the tree along $X_1$ arcs until a leaf is attained. Section 5 is then completed by storing the internal node label of the new leaf in the forward tree label table, thus updating the forward tree and storing the virtual address of the attained leaf in the address table thus updating the backward tree.

In section 6 one step is made along the backward path from the leaf to the root. At line 6 the internal node label C1 of the father of the current node C is derived utilizing equation 2 and at line 7 C is replaced by the virtual address of the father obtained from the address table. At line 8 the symbol position along the arc from the son to the father is obtained utilizing equation 3. Section 6 is completed by a jump to section 8 if the position-symbol table SYM returns a non-zero value indicating that the current symbol is a previously encountered symbol. If, however, the position-symbol table SYM returns the value 0, the current symbol is a newly encountered symbol and section 7 is next executed to read the new symbol.

In section 7 the new symbol is extracted from the input data stream and more data is obtained for the input buffer if required. In section 7 the position-symbol table SYM is updated at line 18 by storing the new symbol at the appropriate position. It is appreciated that the SYM table maintained by the decoder is the inverse of the SYM table maintained by the encoder. In the decoder SYM(J) is the symbol whose position is J. In the encoder SYM(J) is the position of the symbol J. The rank-unseen table of the decoder is updated at line 20–21 by removing the new symbol from the list DR. Finally, unless all symbols have been seen (i.e., $A_k=A$), the search tree is updated at line 26 by creating K new green leaves, one for each internal node.

In section 8 of the decoder the symbol associated with the arc traversed in section 6 is stored in the temporary array L. Since the path from the leaf to the root encounters the symbols of the segment $X_k$ in reverse order, the string of symbols formed in L is reversed (in section 2) before they are stored in the output buffer R. At the last line of section 8 a test is made to determine whether the root has been reached. If it has, then a jump is executed back to section 2 to reverse and store one decoded segment. If the root has not been reached, a return is executed to section 6 of the decoder program to traverse the next arc in the backward path and obtain the next earlier symbol of $X_k$.

In the termination section 9 any remaining decoded output in the buffer R is emptied onto the disk file and the program run is terminated.

Although the encoder and decoder programs appended hereto are written with specific coding in the FORTRAN V language, other codings in the same or other languages may be utilized in performing the functions described herein to practice the data compression and retrieval procedures of the present invention.

Referring now to FIG. 8, a schematic block diagram of a discrete component hardware embodiment of the encoder of the present invention is illustrated. The encoder comprises a search tree data base 40 that constructs the search tree described above for parsing the input data stream by tracing paths from the search tree root to leaves of the tree. The search tree data base 40 provides an enable signal on a lead 41 when a leaf of the tree is attained. The encoder includes an input buffer 42 consisting of storage elements which hold a portion of the input data stream which is currently undergoing processing. The input buffer 42 provides the current input symbol signal on a lead 43 to the search tree data base 40 when called for by the search tree data base 40 by a signal on an enable lead 44. During a forward search through the search tree, an address generator 45 addresses, via a lead 57, the search tree data base 40 which returns a corresponding node label to the address generator via a lead 58. If the search tree node addressed is an internal node, the search tree data base 40 via the enable lead 44 calls for an input symbol signal from the input buffer 42. The search tree data base 40 converts the input symbol to a symbol position which in turn is provided to the address generator 45 via a lead 46. The address generator 45 combines the node label on the lead 58 with the symbol position on the lead 46 to provide a further address to the search tree data base 40 via the lead 57. This procedure is reiterated until the search tree data base 40 returns the node label 0 indicating that a leaf has been attained.

During the iterative trace from the root to a leaf the data base 40 provides the node labels on the lead 58 and the address generator 45 provides the corresponding virtual addresses on a lead 59 to a pointer generator 47. During each arc traversal iteration, the pointer generator 47 computes the leaves-only pointer value from the virtual address and the node label. In order to pass the pointer of a father to its $X_1$ son, the search tree data base 40 provides an inhibit signal on a lead 48 to the pointer generator 47 whenever the input symbol on the lead 43 to the search tree data base 40 is the first encountered symbol $X_1$. The inhibit signal on the lead 48 prevents the leaves-only conversion for the iteration, thereby retaining the leaves-only value of the father node. When a leaf is attained, the enable signal on the lead 41 from the search tree data base 40 to the pointer generator 47 enables the computation of the extant leaves-only pointer value into the green-leaves pointer signal.

The green-leaves pointer is provided on a lead 49 to an economy encoder 50. The search tree data base 40, in the updating of the search tree during a parsing iteration, computes the number of green-leaf pointers for the tree and transmits the pointer count on a lead 51 to the economy encoder 50. The economy encoder 50 utilizes the pointer count on the lead 51 to convert the green-leaves pointer signal on the lead 49 to a corresponding economy code utilizing the economy binary tree described above. Additionally, the search tree data base 40, when a newly encountered symbol is detected, provides the rank of the symbol on the lead 52 to the economy encoder 50. The search tree data base 40, during a parsing iteration, maintains the symbol count NSYM representative of the potential but unseen symbols and provides this symbol count on a lead 53 to the economy encoder 50 as well as to the pointer generator 47. The symbol count on the lead 53 is utilized by the pointer generator 47 in converting the leaves-only pointer value to the green-leaves pointer signal. The economy encoder 50 utilizes the symbol count on the lead 53 to convert the symbol rank on the lead 52 to an economy code utilizing the binary economy tree described above. The economy encoder 50 is configured to provide the economy symbol code following the economy encoded pointer on a lead 54. The stream of encoded pointers and encoded symbol ranks comprises the compressed data output stream.

The compressed data stream on the lead 54 is applied to an output buffer 55 which is comprised of storage elements for receiving and temporarily storing the encoded outputs from the economy encoder 50. After receiving an encoded pointer or, an encoded pointer and an encoded symbol rank when a new symbol is encountered, the output buffer 55 provides an acknowledge signal to the search tree data base 40 on a lead 56. The acknowledge signal on the lead 56 initiates a parsing iteration by effectively resetting the search tree data base 40 to begin a search through the incremental search tree starting at the root. This is achieved by addressing the search tree data base 40 with the virtual address 1.

Details of the component blocks of the encoder of FIG. 8 will now be described by reference to FIGS. 8a-8e. It will be appreciated with respect to FIG. 8, FIGS. 8a-8e, as well as FIG. 9 and FIGS. 9a-9h, that interconnecting conductors in solid line represent data bearing leads whereas interconnecting conductors in dashed line indicate control signal bearing leads for acknowledgement signals, reset signals, enable signals, inhibit signals, increment signals and decrement signals. In ensuing descriptions of FIGS. 8a-8e, it will be instructive to assemble these FIGURES in the arrangement indicated in FIG. 8 and to interconnect the leads as indicated by the legends. A similar arrangement may be effected with respect to the decoder FIGS. 9 and 9a-9h.

Figure 8A:
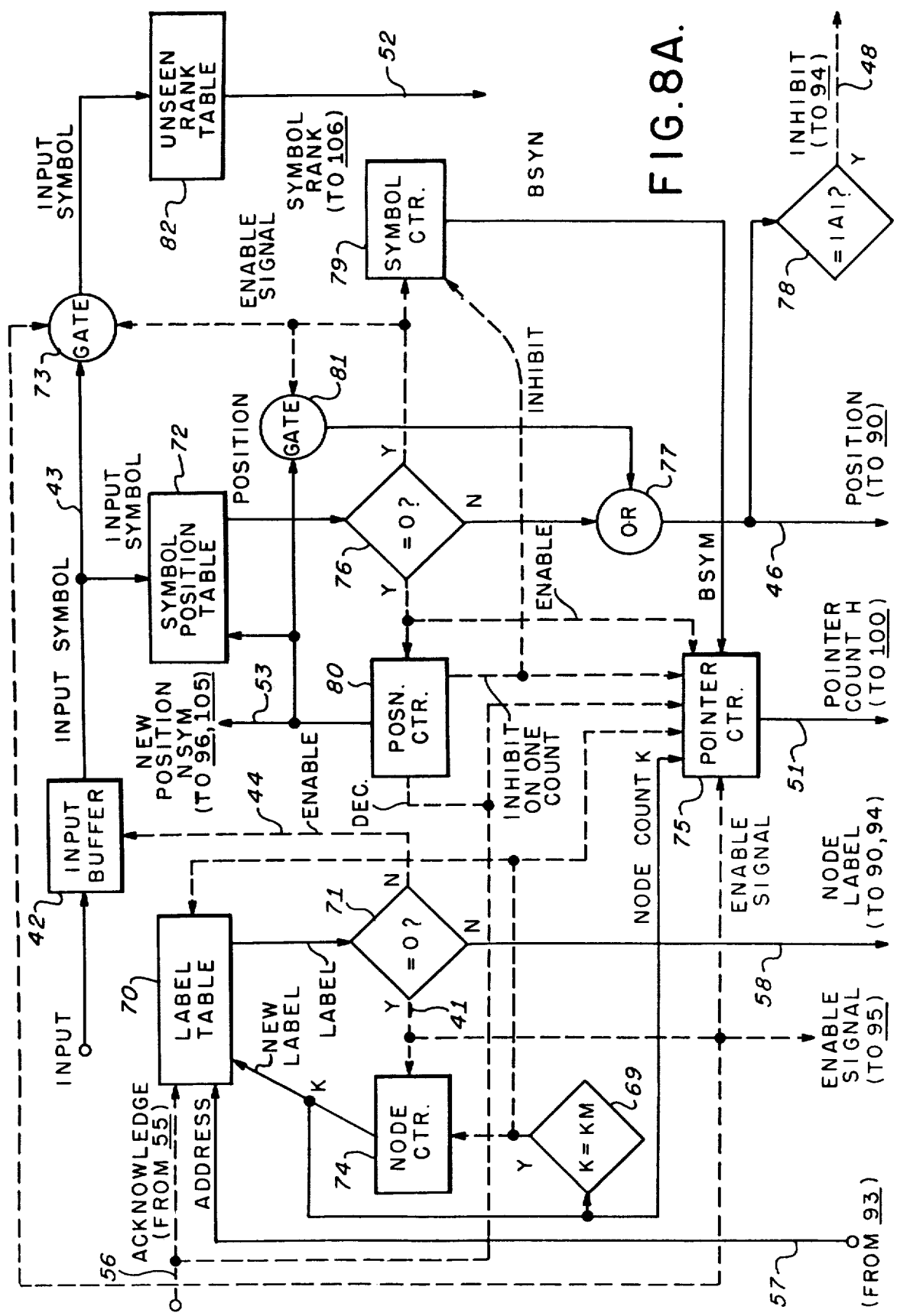
FIG. 8a is a schematic block diagram illustrating details of the search tree data base portion of the encoder of FIG. 8.

Referring now to FIG. 8a, in which like reference numerals indicate like elements with respect to FIG. 8, a schematic block diagram of details of the search tree data base 40 of FIG. 8 is illustrated. It is appreciated that although the input buffer 42 is included in FIG. 8a, for convenience it is not a part of the search tree data base 40. The search tree data base 40 includes a label table 70 which comprises a collection of storage elements conceptually configured as illustrated in FIG. 5. The storage elements comprising the label table 70 are accessed under control of an address signal provided by the address generator 45 (FIG. 8) on the lead 57 so as to return the label stored at the accessed address. The label provided by the label table 70 is applied to a label comparator 71 which compares the label with 0. When the label is not 0, it is transmitted by the label comparator 71 via the lead 58 to the address generator 45 (FIG. 8) and to the pointer generator 47 (FIG. 8). When the label supplied to the label comparator 71 from the label table 70 is not equal to 0, the label comparator 71 sends an enable signal to the input buffer 42 via the lead 44 to release the next input symbol to the lead 43. The input signal released by the input buffer 42 is applied to symbol-position table 72 and to a gate 73 for reasons to be described. Prior to processing data, the label table 70 initially contains a 1 in the node label column for address 1 and 0's for the remaining addresses. Operation of the apparatus is initiated by the acknowledge signal from the output buffer 55 (FIG. 8) on the lead 56 which addresses the label table 70 at virtual address 1.

The search tree data base 40 includes a node counter 74 which keeps track of the current node label providing a signal representative of node count K. The node count K is applied to the label table 70 as well as to a pointer counter 75. The node counter 74 is initialized to the count 1 and is enabled by the YES enable signal from the label comparator 71. When the label table 70 returns the node label 0, the label comparator 71 issues the YES enable signal to the node counter 74 incrementing the count contained therein by unity and thereafter applying the new label K for entry into the label table 70 at the current virtual address on the lad 57 which address had returned the node label 0. It is appreciated that when the label table 70 returns the node label 0, a leaf of the incremental search tree has been attained. Storing the next available label K from the node counter 74 at the current address in the label table 70 updates the incremental search tree by creating a new internal node from the attained leaf, effectively creating $|B_K|$ new leaves, one for each symbol which has been encountered and one for the alpha branch to represent all potential but unseen symbols. The Yes enable signal from the label comparator 71 on the lead 41 is also applied to the pointer counter 75, the gate 73 and the pointer generator 47 (FIG. 8).

The symbol-position table 72 is comprised of storage elements capable of being accessed by the input symbol signal provided by the input buffer 42 on the lead 43 so as to return a corresponding position. The symbol-position table 72 is conceptually configured as illustrated in FIG. 5 and contains a location for each of the symbols of the data alphabet. Initially the table 72 stores 0's at all of the positions corresponding to all of the symbols. The symbols of the data alphabet may be prestored in the symbol columnn of the table 72 or the table may conveniently be constructed in the manner provided by the encoder program appended hereto and discussed above.

When the symbol-position table 72 is accessed by the input symbol on the line 43, the table 72 returns the corresponding position to a position comparator 76. The position comparator 76 compares the position with 0 and passes the position to the address generator 45 (FIG. 8) via an OR gate 77 and the lead 46 when the position is not 0. When the address generator 45 has received both a new node label on the lead 58 and a new position on the lead 46, the address generator 45 generates a new address which is returned to the label table 70 via the lead 57 to continue the forward tracing cycle. The position signal from the OR gate 77 is also applied to an $X_1$ comparator 78 where it is compared with the first position $|A|$. When the position P is equal to $|A|$, the comparator 78 issues an inhibit signal to the pointer generator 47 (FIG. 8) via the lead 48.

The search tree data base 40 includes a symbol counter 79 which counts BSYM the number of distinct input symbols which have been encountered. Initially, the counter 79 is set to 0 and thereafter counts upwardly. The count BSYM from the symbol counter 79 is provided to the pointer counter 75. The search tree data base 40 also includes a position counter 80 which counts NSYM the number of potential but as yet unseen symbols. The counter 80 is initialized to the value $|A|$ and counts downwardly to 0. The position counter 80 provides an inhibiting signal to the pointer counter 75 and the symbol counter 79 when the position counter 80 attains the count of 1. In this manner the symbol counter 79 is prevented from counting beyond $|A|-1$. The pointer counter 75 also receives an enable signal from the output buffer 55 for reasons to be explained.

Whenever the symbol-position table 72 returns the position 0 to the position comparator 76, the comparator 76 issues a YES enable signal to the pointer counter 75, the symbol counter 79, the position counter 80, the gate 73 and to a gate 81. The YES enable signal from the comparator 76 increments the symbol counter 79 by unity at (or during) each parsing iteration in which the enable signal is received until inhibited by the inhibit signal from the position counter 80. The YES enable signal from the comparator 76 also enables the gate 81 to transmit the position stored in the position counter 80 via the OR gate 77 and the lead 46 to the address generator 45. The gate 81 is utilized to transmit the appropriate position to the address generator 45 when a new symbol is encountered which new symbol results in the YES enable signal from the comparator 76. Otherwise, when a previously encountered symbol is being processed and the position returned from the table 72 is not 0, the non-o position from the table 72 is transmitted to the address generator 45 via the comparator 76.

The YES enable signal from the comparator 76 enables the position counter 80 to transmit the current NSYM count to the symbol-position table 72 and to the gate 81 and via the lead 53 to the pointer generator 47 (FIG. 8) and the economy encoder 50 (FIG. 8). The YES enable signal from the comparator 76 also arms decrementing circuitry within the position counter 80 to permit the position counter 80 to be decremented by unity upon receipt of the acknowledge signal from the output buffer 55 (FIG. 8) on the lead 56. The NSYM value applied to the symbol-position table 72 when the 0 position is returned therefrom is stored adjacent the new input symbol that had returned the 0 position. It is appreciated that the table 72 is addressed by the input symbol signal on the lead 43 so as to appropriately control this memory writing function. The position counter 80 is decremented by unity at the termination of a parsing iteration by the acknowledge signal from the output buffer 55 (FIG. 8) on the lead 56 only during those parsing iterations when the position counter 80 had first received the YES enable signal from the position comparator 76. The position counter 80 counts down to the count 0 when the last of the unseen symbols has been encountered and remains at the count 0 for the remainder of the data compression operation. As explained above, when the position counter 80 is storing the 1 count, inhibit signals are provided to the pointer counter 75 and the symbol counter 79.

As previously discussed, the pointer counter 75 receives the node count K from the node counter 74 and the symbol count BSYM from the symbol counter 79 as well as enable signals from the label comparator 71, the position comparator 76 and the output buffer 55 as well as an inhibit signal from the position counter 80. The pointer counter 75 computes the pointer count H, the number of green-leaves in the incremental tree, which it provides via the lead 51 to the economy encoder 50 (FIG. 8). Initially, the pointer counter 75 is set to 1. When the label comparator 71 provides the YES enable signal to the pointer counter 75, the count in the counter 75 is increased by the BSYM value from the symbol counter 79. When the position comparator 76 issues the YES enable signal to the pointer counter 75, the pointer count H is increased by the node count K from the node counter 74. When the position counter 80, however, issues the inhibit signal to the pointer counter 75, the counter 75 is inhibited from utilizing the node count K to increment the pointer count H. As discussed above, the inhibit signal from the position counter 80 also inhibits incrementation of the symbol counter 79 which as a result does not count beyond $|A|-1$. It is appreciated that updating of the pointer count H from the pointer counter 75 should be performed after H is provided to the economy encoder 50 (FIG. 8). To provide appropriate updating, the pointer counter 75 receives an enable signal on the lead 56 from the output buffer 55 (FIG. 8) which latches the appropriate pointer count H into the output of the pointer counter 75 in a manner to be described.

Figure 8B:
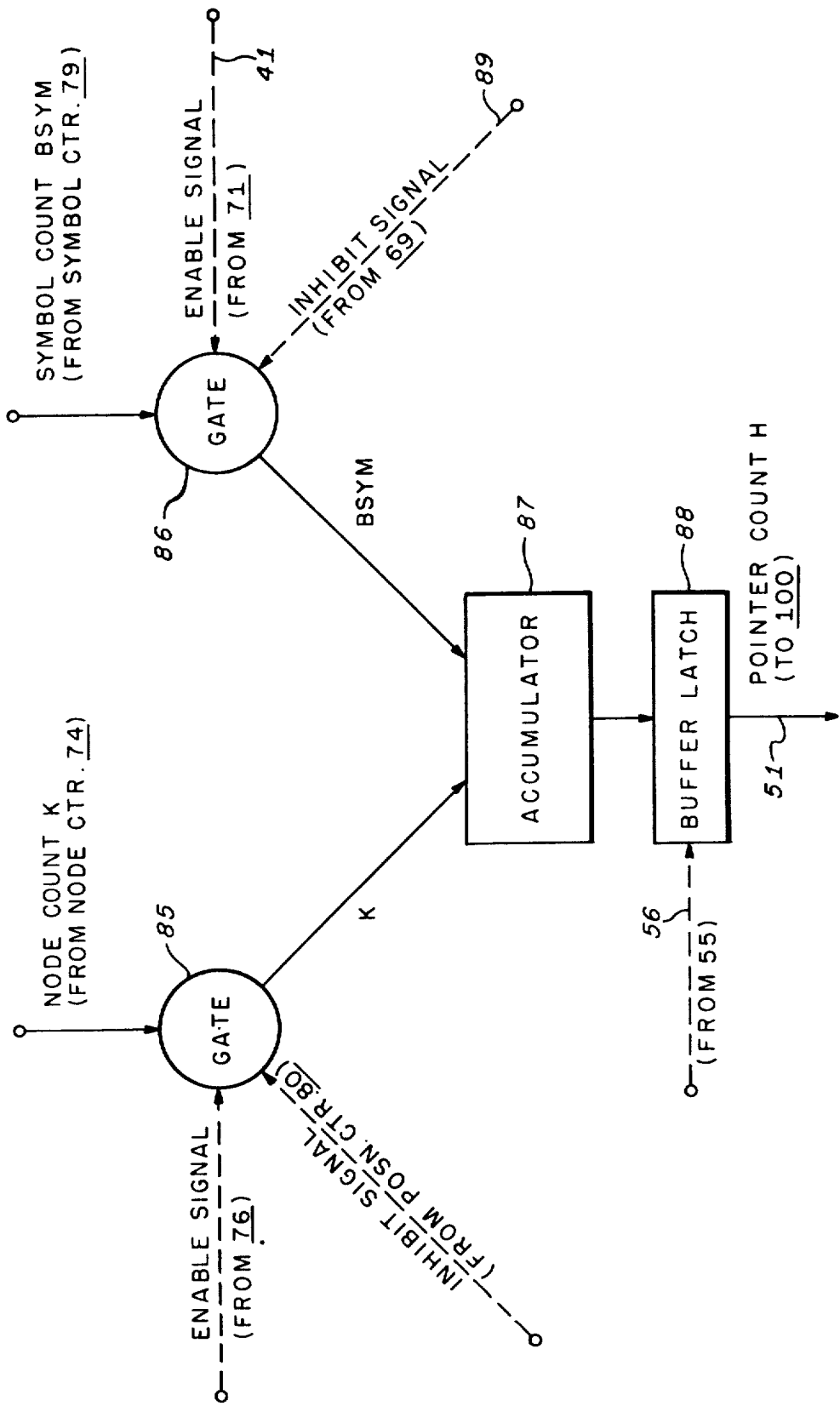

Referring for the moment to FIG. 8b, an implementation for the pointer counter 75 is illustrated. The pointer counter 75 comprises a gate 85, a gate 86, an accumulator 87 and a buffer latch 88. The gate 85 receives the node count K from the node counter 74 and the YES enable signal from the position comparator 76 and transmits the current node count K to the accumulator 87 upon receipt of the enable signal from the comparator 76. The gate 85 also receives the inhibit signal from the position counter 80 which inhibits the gate 85 from transmitting the node count K to the accumulator 87 when the position counter 80 stores the count of 1.

The gate 86 receives the symbol count BSYM from the symbol counter 79 and the YES enable signal from the label comparator 71 and transmits the current BSYM count to the accumulator 87 upon receipt to the enable signal from the comparator 71. The gate 86 also receives an inhibit signal on a lead 89 for reasons to be explained. The accumulator 87, which is initialized to the count of 1, increments its count by BSYM and K under control of the comparators 71 and 76 respectively, to provide the pointer count H on the lead 51 via the buffer latch 88.

In operation of the counter FIG. 8b, when a new internal node is defined in the search tree, the enable signal to the gate 86 from the comparator 71 causes the count in the accumulator 87 to be increased by BSYM, where BSYM = $|A|-1$ when all of the symbols have been encountered. Whenever a new symbol is encountered, the enable signal applied to the gate 85 by the position comparator 76 causes the pointer count to be increased by the node count K. This increase, however, does not occur if $|A|-1$ potential symbols have been encountered. The increase by the node count K is prevented by the inhibit signal provided to gate 85 by the position counter 80 whenever the position counter 80 contains the count of 1. During an iteration the appropriate value of the pointer count H is provided by the buffer latch 88 via the lead 51 to the economy encoder 50 (FIG. 8). Following the iteration, the signal on the lead 56 from the output buffer 55 (FIG. 8) latches the updated value of H into the buffer latch 88 to provide the proper pointer count during the next following iteration.

Referring again to FIG. 8a, whenever a new symbol is encountered, it is transmitted by the gate 73 to an unseen-rank table 82 which, in turn, provides the corresponding rank of the symbol via the lead 52 to the economy encoder 50 (FIG. 8). In a manner similar to that described above with respect to the appended encoder program circuitry is included to update the table 82 by removing the addressed symbol from the table along with its rank and decrementing the rank of each symbol appearing thereafter in the table. The unseen-rank table 82 may be arranged as conceptually illustrated in FIG. 5. The arrangement for the unseen-rank table 82 has been discussed hereinabove with respect to the embodiment of the invention utilizing the appended programs with reference to the table DR. The table 82 comprises a collection of storage elements associated with the respective symbols of the data alphabet for storing the respective ranks associated with the respective symbols.

The unseen-rank table 82 is addressed by the input symbol transmitted by the gate 73. The gate 73 is controlled by the YES enable signal from the position comparator 76 and the YES enable signal from the label comparator 71. For timing purposes, the gate 73 includes circuitry to permit it to be enabled only upon receipt of the enable signal from the label comparator 71 after receipt of the enable signal from the comparator 76 during a parsing iteration.

It will be appreciated from the foregoing that the label table 70 is utilized in traversing the search tree in the forward direction from the root to a leaf. For any labeled node K and arc label position the address of the appropriate son node is computed by the address generator 45 (FIG. 8). The label of the corresponding son node is then obtained from the table 70. The resulting sequences of labels may be considered as paths through the tree which, in effect, record all parsed segments previously encounted during the data encoding. The last element in a sequence is distinguished as a leaf when the label 0 is returned by the label table 70 for the current virtual address.

Figure 8C:
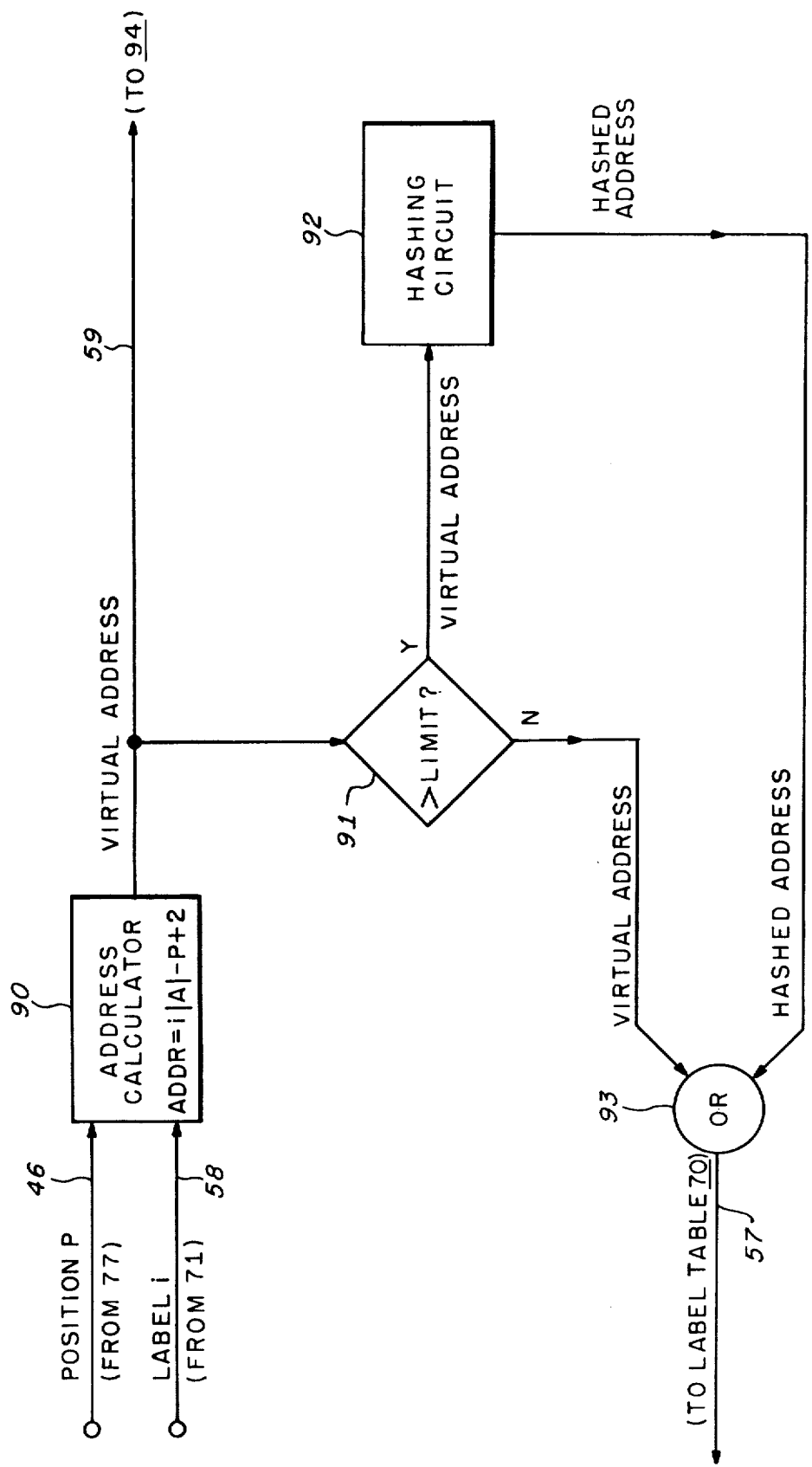
FIG. 8c is a schematic block diagram illustrating details of the address generator of the encoder of FIG. 8.

Referring now to FIG. 8c, in which like reference numerals indicate like elements with respect to FIG. 8, a schematic block diagram of details of the address generator 45 of FIG. 8 is illustrated. The address generator 45 includes an address calculator 90 which in response to the current input symbol position p from the OR gate 77 (FIG. 8a) and the current node label i from the label comparator 71 (FIG. 8a), calculates a new virtual address for the next node to be visited utilizing equation 1 above. It is appreciated that the nomenclature $\emptyset(j)$ and p are utilized synonymously. The address calculator 90 includes circuitry for storing the current node label i until receipt of the position p at which time the address computation is performed. The address computation may conveniently be performed by any conventional circuitry. Preferably the address calculator 90 contains shift-and-add circuitry accomplishing the multiplication by $|A|$ by shifting the label i to the left by M places, where M is the symbol size in bits. The shift- and-add circuitry then subtracts the position p and adds the constant 2 to form the virtual address. The virtual address computed by the address calculator 90 is provided via the lead 59 to the pointer generator 47 (FIG. 8) for use in updating the leaves-only pointer.

The virtual address is also provided to a hashing limit comparator 91 where it is compared with the limit established for the size of direct storage in the label table 70. The hashing limit comparator 91 is configured whereby when the virtual address is greater than the established limit, the address is provided on the YES output thereof; otherwise the virtual address is provided on the NO output thereof. The address generator 45 also includes a standard hashing circuit 92 which receives the virtual address from the hashing limit comparator 91 when the virtual address is greater than the limit. The hashing circuit 92 hashes the virtual address in a conventional manner. The hashed address from the hashing circuit 92 is applied to an OR gate 93 which also receives the unchanged virtual address when the address is not greater than the established limit. The resulting calculated address, hashed or unhashed in accordance with the comparison made by the comparator 91 is returned via lead 57 to the search tree data base 40 (FIG. 8) for the next lookup in the label-table 70 (FIG. 8a).

Figure 8D:
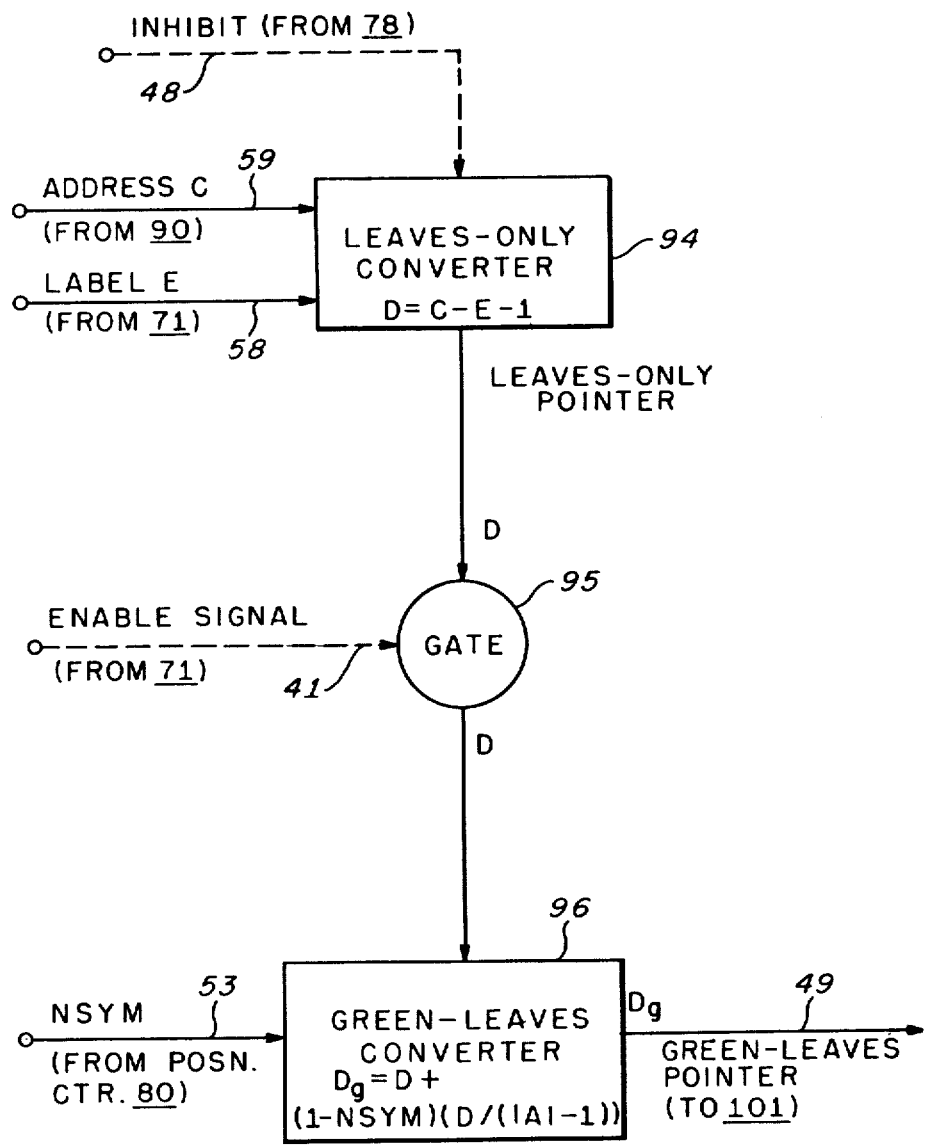
FIG. 8d is a schematic block diagram illustrating details of the pointer generator of the encoder of FIG. 8.

Referring now to FIG. 8d, in which like reference numerals indicated like elements with respect to FIG. 8, a schematic block diagram of the pointer generator 47 of FIG. 8 is illustrated. The pointer generator 47 includes a leaves-only converter 94 that receives the node label E (synonymous with node label i) of the father from the label table 70 of the search tree date base 40 and the virtual address C of the son from the address generator 45 (FIG. 8) and converts the virtual address C into the leaves-only value D of the pointer by utilizing equation 4 above. The computation is performed only when the new input symbol differs from the first file symbol $X_1$ so as to pass the pointer of the father to the $X_1$ son. The leaves-only pointer D is updated for each node visited during a trace through the search tree from the root to a leaf.

The leaves-only pointer D is transmitted to a green-leaves converter 96 via a gate 95. The gate 95 is enabled by the YES enable signal from the label comparator 71 (FIG. 8a). Upon receipt of the enable signal the leaves-only pointer D is transmitted to the green-leaves converter 96 which transforms it into the corresponding green-leaves pointer $D_g$ by utilizing the integer Equation 5 above. The green-leaves converter 96 receives the count NSYM, the number of unseen symbols, from the position counter 80 (FIG. 8a) of the search tree data base 40 via the lead 53. Thus it is appreciated that while the leaves-only pointer D is derived during the forward trace through the search tree, the leaves-only pointer is converted into the green-leaves pointer $D_g$ after the trace is completed when a leaf is attained. The green-leaves pointer $D_g$ computed by the converter 96 is transmitted to the economy encoder 50 (FIG. 8) via the lead 49 wherein the output segment $Y_k$, the economy code for the parsed input segment $X_k$ is computed.

Figure 8E:
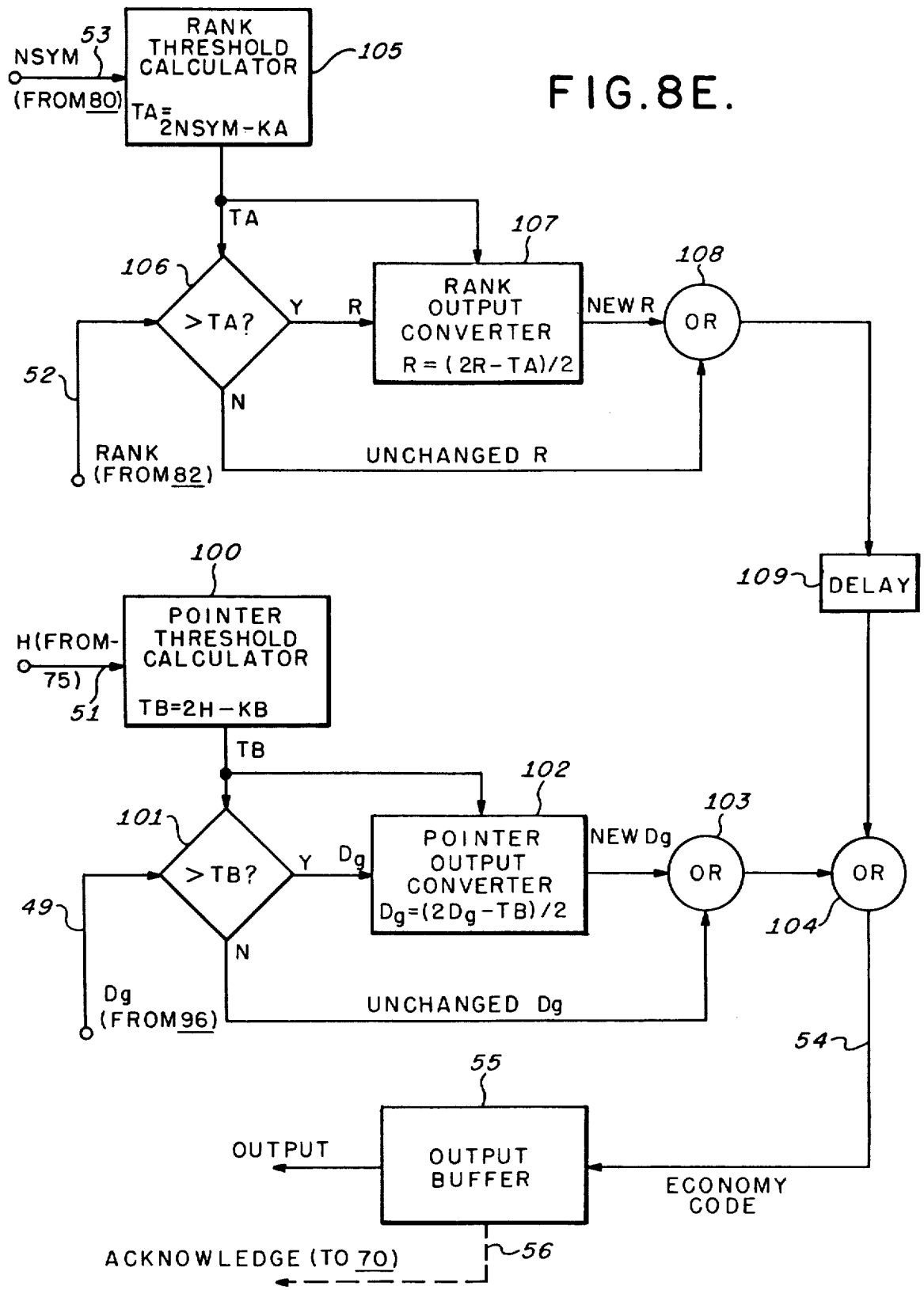
FIG. 8e is a schematic block diagram illustrating details of the economy encoder of the encoder of FIG. 8.

Referring now to FIG. 8e, in which like reference numerals indicate like elements with respect to FIG. 8, a schematic block diagram of the economy encoder 50 of FIG. 8 is illustrated. The economy encoder 50 is a mechanized version of the economy binary tree described hereinabove. The economy encoder 50 is utilized to calculate the economy code for the pointer $Y_k$ of the parsed input segment $x_k$ and the enconomy code for the rank of a newly encountered symbol. A pointer threshold calculator 100 responsive to the pointer count H from the pointer counter 80 (FIG. 8a) calculates the threshold $TB = 2H - KB$, where KB is the least integer which is not less than $\log_2(H)$. The quantity KB was heretofore referred to as $+(H)$. The threshold signal TB from the pointer threshold calculator 100 is applied to a pointer threshold comparator 101 which also receives the green-leaves pointer $D_g$ from the pointer generator 47 (FIG. 8) via the lead 49. The pointer threshold comparator 101 compares the pointer value $D_g$ with the threshold TB and if the threshold is not the smaller, the pointer value $D_g$ is provided to the NO output of the comparator 101. If, however, $D_g$ exceeds the threshold TB, the $D_g$ pointer value is provided on the YES output of the comparator 101. The YES output of the comparator 101 and the threshold value TB from the pointer threshold calculator 100 are applied to a pointer output converter 102 which changes the pointer value by utilizing Equation 6 above. The unchanged value of $D_g$ from the NO output of the comparator 101 and the new value of $D_g$ from the pointer output converter 102 are applied as inputs to an OR gate 103. Thus $D_g$ exceeds the threshold TB, the pointer value $D_g$ is first sent to the converter 102 and the new value sent to the output buffer 55 as the enconomy code for the segment via the OR gate 103, an OR gate 104 and the lead 54. When the threshold TB is not smaller than $D_g$, $D_g$ is sent unchanged to the output buffer 55 as the economy code for the current parsed input segment via the OR gates 103 and 104 and the lead 54.

The above described components 100 through 104 convert the green-leaves pointer $D_g$ to economy code utilizing a mechanized version of the economy binary tree. The economy encoder 50 also includes circuitry for converting the symbol rank from the unseen-rank table 82 to economy binary code. A rank threshold calculator 105 receives the unseen symbol count NSYM from the position counter 80 and calculates the threshold $TA = 2 \text{ NSYM} - KA$, where KA is the least integer which is not less than $\log_2 (\text{NSYM})$. It is appreciated that KA is synonymous with $+(\text{NSYM})$ discussed above. The threshold signal TA is applied to a rank threshold comparator 106 which also receives the symbol rank R from the unseen-rank table 82 (FIG. 8a). The comparator 106 compares the rank R with the threshold TA and if the threshold TA is not smaller than the rank R, the rank R is applied to the NO output of the comparator 106. If, however, the rank R exceeds the threshold TA, then R is transmitted to the YES output of the comparator 106.

The YES output from the comparator 106 and the TA threshold signal from the rank threshold calculator 105 are applied to a rank output converter 107 which changes the rank utilizing Equation 10 above. The output of the converter 107 and the NO output of the comparator 106 are applied as inputs to an OR gate 108. The output of the OR gate 108 is applied via a delay 109 as an input to the OR gate 104 and then to the output buffer 55.

Thus if the rank R exceeds the threshold TA, R is first sent to the converter 107, the output of which is sent to the output buffer 55 as the economy code for the rank via the OR gate 108, the delay 109, the OR gate 104 and the lead 54. If the threshold TA is not smaller than R, R is sent unchanged to the output buffer 55 as the economy code for the current new symbol rank via the OR gate 108, the delay 109, the OR gate 104 and the lead 54. The delay value for the delay 109 is selected to assure that the rank economy code follows the pointer economy code in transmission to the output buffer 55. The output buffer 55 completes the parsing-encoding cycle by transmitting the acknowledge signal to the search tree date base 40 via the lead 56 after receiving the economy code.

It is appreciated that the components 100, 102, 105 and 107 may conveniently be implemented by any conventional circuitry such as, for example, shift-and-add circuitry.

The quantities KA utilized in the rank threshold calculator 105 and KB utilized in the pointer threshold calculator 100 may conveniently be derived as follows: KB may be derived by utilizing a conventional circuit for deriving the log of H to the base 2 and truncating the result to the integral value thereof. Log taking circuitry that performs integer arithmetic may conveniently be utilized. The quantity KA is provided by identical circuitry operating on the quantity NSYM rather than H. Alternatively, apparatus for practicing the KB and KA updating procedures described in the appended encoder program may be utilized. In the encoder program each time H is augmented, a test is performed to determine whether KB requires incrementing. Similarly, when NSYM is decremented, a test is performed to determine if KA requires incrementing.

In the operation of the encoder illustrated in FIGS. 8a–8e, initially the label table 70 stores the node label 1 at virtual address 1 and 0's at the remaining the symbol-position table 72 stores 0's at all the symbol locations, the node count K of the node counter 74 is set to 1, the position count NSYM of the position counter 80 is set to $|A|$, the pointer count H of the pointer counter 75 is set to 1, the symbol count BSYM of the symbol counter 79 is set to 0, and the leaves-only pointer value D of the leaves-only converter 94 is set to 0. Initially, the label 70 is accessed at virtual address 1 and returns the node label 1 stored thereat causng the label comparator 71 to issue the NO enable signal on the lead 44. The label comparator 71 transmits this node label 1 to the address calculator 90 via the lead 58. The NO enable signal on the lead 44 enables the input buffer 42 to issue the first input symbol. This symbol applied to the symbol-position table 72 causes the symbol-position table 72 to issue a 0 to the position comparator 76. The YES enable signal from the position comparator 76 enables the gate 81 thereby transmitting the position $|A|$ stored in the position counter 80 to be transmitted via the OR gate 77 and the lead 46 to the address calculator 90. In response to the node label $i = 1$ on the lead 58 and the position p $= 0 |A|$ on the lead 46, the address calculator 90 generates virtual address 2. The YES enable signal from the position comparator 76 also enables the pointer counter 75 to increment its initial count of 1 by the node count K currently stored in the node counter 74 which at this time is 1. Thus the pointer count H is incremented to a count of 2. The YES enable signal from the position comparator 76 also increments the symbol counter 79 to BSYM = 1 and enables the position counter 80 to transmit the $|A|$ position value to the symbol position table 72 wherein it is stored at the location of the input symbol.

The virtual address 2 generated by the address calculator 90 is compared to the hashing limit by the limit comparator 91 and since the address 2 is less than the limit, the virtual address is used directly to access the label table 70 via the lead 57. In response to the virtual address 2 signal, the label table 70 returns the label 0. The label comparator 71 issues the YES enable signal on the lead 41 in response to the 0 node label enabling the node counter 74 to increment the node count K stored therein by unity. The node count K is thereby incremented to K = 2. The YES enable signal on the lead 41 causes the new node labe K to be transmitted to the label table 70 and stored at the virtual address 2 that had returned the 0 label. The YES enable signal on the lead 41 also enables the pointer counter 75 to increment its count by the BSYM value from the symbol counter 79 which at this time stores the value BSYM = 1. Thus the pointer count H stored in the pointer counter 75 is increased to the value H = 3. The YES enable signal on the lead 41 enables the gate 95 in the pointer generator 47 permitting the leaves-only value from the leaves-only converter 94 to pass to the green-leaves converter 96 wherein the green-leaves pointer value is computed, utilizing the value of NSYM from the position counter 80 which at this time is $|A|$. The YES enable signal on the lead 41 also enables the gate 73 thereby transmitting the new input symbol to the unseenrannk table 82 which issues the corresponding symbol rank to the rank economy encoder 50.

At the same time as the new symbol rank is applied to the rank economy encoder, the green-leaves converter 96 applies the green-leaves pointer value on the lead 49 to the pointer economy encoder. The pointer economy encoder converts the green-leaves value $D_g$ to the corresponding economy code and supplies this pointer value $Y_K$ to the output buffer 55. The encoded symbol rank from the economy encoder passes through the delay 109 to enter the output buffer 55 following the pointer value. Upon receipt of the encoded pointer and, when appropriate, the encoded symbol rank, the output buffer 55 provides the acknowledge signal on the lead 56 to decrement the position counter 80 to the value $|A| - 1$ and also addresses the label table 70 with virtual address 1 to repeat the procedure from the root of the search tree for parsing the next segment. It is appreciated that the acknowledge signal on the lead 56 decrements the position counter 80 since the decrementing circuitry (not shown) within the position counter 80, as discussed above, has been armed for decrementing by the YES enable signal from the position comparator 76. The acknowledge signal on the lead 56 also latches the pointer count value from the accumulator 87 into the buffer latch 88 (FIG. 8b). At this time the pointer counter 75 stores the pointer count $H = 3$. It is appreciated from FIG. 4c that the search tree $(T_2, B_2)$ has three leaf pointers available for tracing the second segment.

During the subsequent tracing of segments substantially the procedures described above are followed. As the sequence of internal nodes of the search tree are visited the input buffer 42 issues an input symbol for each node and the symbol-position table 72 issues the corresponding position via the position comparator 76. The positions are combined with the respective node labels from the label table 70 by the address generator 45 to provide the sequence of virtual addresses to the label table 70 so as to execute the trace from the root to the leaf of the incremental search tree. When the leaf attained does not correspond to a newly encountered symbol, the position comparator 76 does not issue the YES enable signal and the pointer count H of the pointer counter 75 is not incremented by the node count K. Whenever the attained leaf is the alpha branch corresponding to a newly encountered symbol, the YES enable signal from the position comparator 76 passes the appropriate position of the new symbol through the gate 81 to complete the address calculation and increment the pointer counter 75 by the extant node count K from the node counter 74. When a leaf is attained as indicated by the label comparator 71 issuing the YES enable signal, the pointer count H of the pointer counter 75 is incremented by BSYM from the symbol counter 79 and the node count K of the node counter 74 is incremented by unity for updating the label table 70.

After the encoder has encountered the next to the last new symbol and the search tree has been updated, each node of the tree will have $|A|$ arcs emanating therefrom, one of the arcs being the alpha branch. When the last symbol is received, the alpha branch will be replaced by this last symbol and each node of the search tree thereafter will also have $|A|$ arcs emanating therefrom. Thus, after the encoder has encountered the next to the last new symbol and the tree has been updated, the symbol count BSYM in the symbol counter 79 is inhibited from counting beyond $|A| - 1$ and the pointer counter H in the pointer counter 75 is inhibited from being incremented with the node count K. These inhibiting functions are effected when the position counter 80 attains the count of 1. The inhibition of the pointer counter 75 and the symbol counter 79 in response to the count of NSYM = 1 maintains between the time the next to the last symbol is encountered and the tree is accordingly updated and the time prior to receipt of the last new symbol. After the last new symbol is received, the position count NSYM = 1 is stored in the symbol-position table 72 at the location of the last symbol and the 1 count from the position counter 80 maintains the inhibition of the symbol counter 79 and the pointer counter 75. At the end of the segment parsing iteration during which the last new symbol is encountered, the acknowledge signal on the lead 56 from the output buffer 55 decrements the position counter 80 to 0, which removes the inhibit signals from the pointer counter 75 and the symbol counter 79. Thereafter, however, the symbol counter 79 will not be incremented and the pointer counter 75 will not be increased by the node count K because the symbol-position table 72 does not contain any further 0 positions and the YES enable signal from the position comparator 76 will no longer be issued. Thereafter, as leaves are attained, the pointer count H will only be incremented by BSYM = $|A| - 1$.

As discussed above, when the number of nodes K in the search tree attains the value KM, indicating that the storage allocated for the search tree has been exhausted, further growth of the search tree is inhibited. Accordingly, the search tree data base of FIG. 8a includes a comparator 69 for comparing the node count K from the node counter 74 to a predetermined constant KM to determine when equality between K and KM is attained. When equality is attained, the YES signal from the comparator 69 is applied as an inhibit signal to the label table 70, the node counter 74 and, via the lead 89, to the pointer counter 75. When K = KM the node counter 74 is inhibited from further incrementation of the node count value K and the label table 70 is inhibited from further utilization of the node count signal K for updating the search tree. When K = KM the pointer counter 75 is inhibited from incrementing the pointer count H by the symbol count BSYM. The YES signal from the comparator 69 (FIG. 8a) is applied to the gate (FIG. 8b) to inhibit the gate 86 from transmitting the symbol count BSYM to the accumulator 87.

Figure 9:
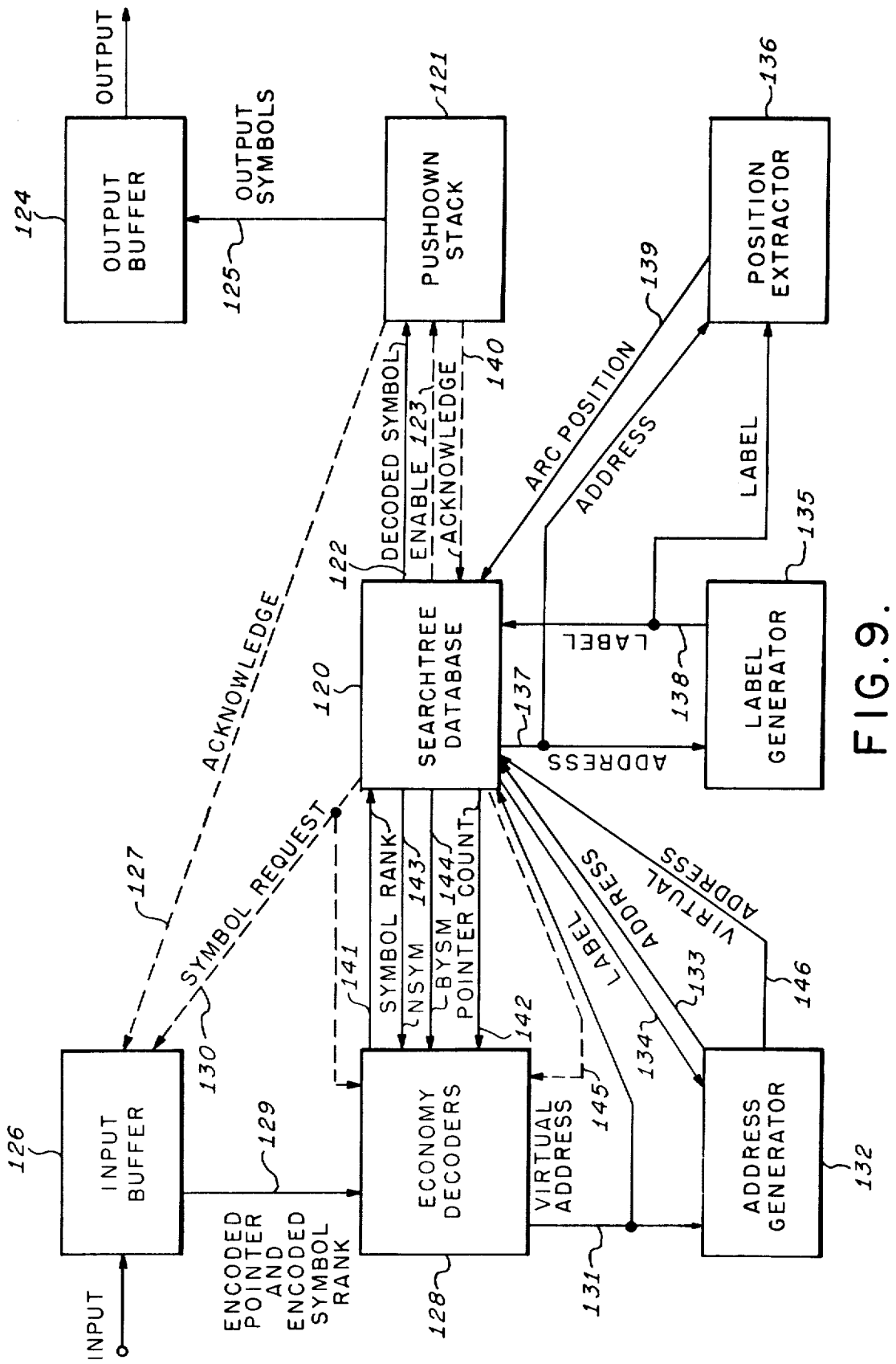
FIG. 9 is a schematic block diagram of an embodiment of the decoder of the present invention.

Referring now to FIG. 9, a schematic block diagram of a discrete component hardware embodiment of the decoder of the present invention is illustrated. The decoder of FIG. 9 inverts the compressed code signals provided by the encoder by means of a retrieval search tree which it constructs identical at every iteration with respect to that constructed by the encoder. The retrieval search tree, otherwise denoted as the backward tree, is constructed by a search tree data base 120 that traces a path from a virtual address corresponding to a received leaf pointer back to the root extracting the symbol signals from the arcs of the path as the successive internal nodes are visited. The symbol signals are transmitted to a pushdown stack 121 via a lead 122 in reverse order with respect to that of the corresponding parsed input segment. When the root is attained the search tree data base 120 transmits an enable signal to the pushdown stack 121 via a lead 123 in response to which the pushdown stack 121 transmits the output symbol signals of the segment in original order to an output buffer 124 via a lead 125.

An input buffer 126 receives and provides temporary storage for the compressed code signals generated by the encoder. When the pushdown stack 121 transmits the symbol signals of a parsed segment to the output buffer 124, an acknowledge signal is transmitted to the input buffer 126 via a lead 127 enabling the buffer to transmit the next encoded pointer signal to economy decoders 128 via a lead 129. Whenever the search tree data base 120 detects that the received leaf pointer provides the virtual address of an alpha branch, the search tree data base 120 issues an enable signal on a lead 130 to the input buffer 126 requesting that the buffer release the encoded symbol rank to the economy decoders 128 via the lead 129. The enable signal on lead 130 is also applied to the economy decoders 128 to enable the rank economy decoder contained therein.

It is appreciated that the compressed code provided by the input buffer 126 to the economy decoders 128 comprises a string of leaf pointers, each leaf pointer corresponding to a parsed segment of the original input data stream applied to the encoder. When a leaf pointer corresponds to an alpha branch, the encoded rank of the corresponding newly encountered symbol is transmitted following the leaf pointer.

In response to a leaf pointer $Y_k$, the pointer economy decoder included in the economy decoders 128 derives the green-leaves pointer $D_g$, converts $D_g$ into the leaves-only pointer D and converts D into the corresponding virtual address. The economy decoders 128 provide the virtual address on a lead 131 to the serach tree data base 120 and to an address generator 132.

As discussed above, the encoder of the present invention reuses the pointer of a father by passing the pointer to its $X_1$ son. In order to determine if the received virtual address is that of an internal node or that of a leaf, the search tree data base 120 constructs a forward search tree identical to that constructed by the search tree data base 40 of FIG. 8. The virtual address applied to the address generator 132 via the lead 131 is compared therein to a hashing limit and is transmitted hashed or unhashed to the search tree data base 120 via a lead 133. The address signal on the lead 133 addresses the forward tree of the search tree data base 120 which returns a node label to the address generator 132 via a lead 134. The address generator 132 converts the node label on the lead 134 to the virtual address of the $X_1$ son of the node and, after a comparison for hashing, returns the virtual address to the search tree data base 120 via the lead 133. This procedure is continued until the forward search tree attains a leaf. The virtual address of the leaf which had been received by the search tree data base 120 on the lead 133 is transmitted to a label generator 135 and to a position extractor 136 via a lead 137. It will be appreciated for reasons to be clarified that the virtual address transmitted to the label generator 135 and the position extractor 136 on the lead 137 is received by the search tree data base 120 on the lead 131 and a lead 146. The label generator 135 computes the node label of the father of the leaf virtual address and returns the node label to the search tree data base 120 via a lead 138 and also transmits the node label to the position extractor 136. The position extractor 136 computes the position of the arc joining the father nodehaving the applied node label with the son having the applied virtual address. The position extractor 136 returns the extracted position to the search tree data base 120 via a lead 139. The search tree data base 120 decodes the position and transmits the corresponding symbol to the pushdown stack 121 via the lead 122. When the pushdown stack 121 receives a symbol from the search tree data base 120, the pushdown stack 121 transmits an acknowledge signal to the search tree data base 120 via a lead 140.

The acknowledge signal on the lead 140 enables the backward tree of the search tree data base 120 to accept the computed label on the lead 138 and to return the corresponding virtual address on the lead 137 to the label generator 135 and the position extractor 136. The label generator 135 provides a further label which in the manner described, results in a further symbol applied to the pushdown stack 121. When the label on the lead 138 applied to the search tree data base 120 results in the backward tree returning the virtual address 1, the root of the backward tree has been attained. When this occurs, the search tree data base 120 issues the enable signal on the line 123 to the pushdown stack 121 which transmits the output symbols to the output buffer 124 as described above. The pushdown stack 121 issues the acknowledge signal on the lead 127 to the input buffer 126 to forward the next leaf pointer to the economy decoders 128.

When the search tree data base 120 detects that a new symbol has been encountered and enables the rank economy decoder in the economy decoders 128 via the lead 130, the decoder rank of the new symbol is transmitted to the search tree data base 120 via a lead 141 for conversion to the symbol corresponding to the rank. During the segment decoding iterations, the search tree data base 120 maintains a count of the number of extant leaf pointers and transmits the pointer count via a lead 142 to the economy decoders 128 for generating the pointer threshold utilized in converting the economy coded pointer signal to the green-leaves pointer signal $D_g$. The search tree data base 120 also maintains the NSYM count representative of the number of potential and as yet unseen symbols as well as the BSYM count representative of the number of symbols currently encountered. The search tree data base 120 transmits the NSYM and BSYM count signals via leads 143 and 144, respectively, to the economy decoders 128 wherein they are utilized in a manner to be described.

As discussed above, the search tree data base 120 transmits an enabling signal on a lead 130 to the economy decoders 128 to enable the rank economy decoder when required to decode a new symbol. The search tree data base 120 also transmits an enabling signal on a lead 145 to the economy decoders 128 to enable the pointer economy decoder for the decoding of the leaf pointer signals. The enabling signals on the leads 130 and 145 are complementary with respect to each other. That is, when the signal on the lead 130 enables the rank economy decoder, the signal on the lead 145 disables the pointer economy decoder and conversely when the signal on the lead 145 enables the pointer economy decoder, the signal on the lead 130 disables the rank economy decoder. Quiescently, the signal on the lead 145 is provided to enable the pointer economy decoder until a new symbol is encountered, at which time the rank economy decoder is enabled and the pointer economy decoder is disabled for the duration of the rank decoding procedure.

Figure 9A:
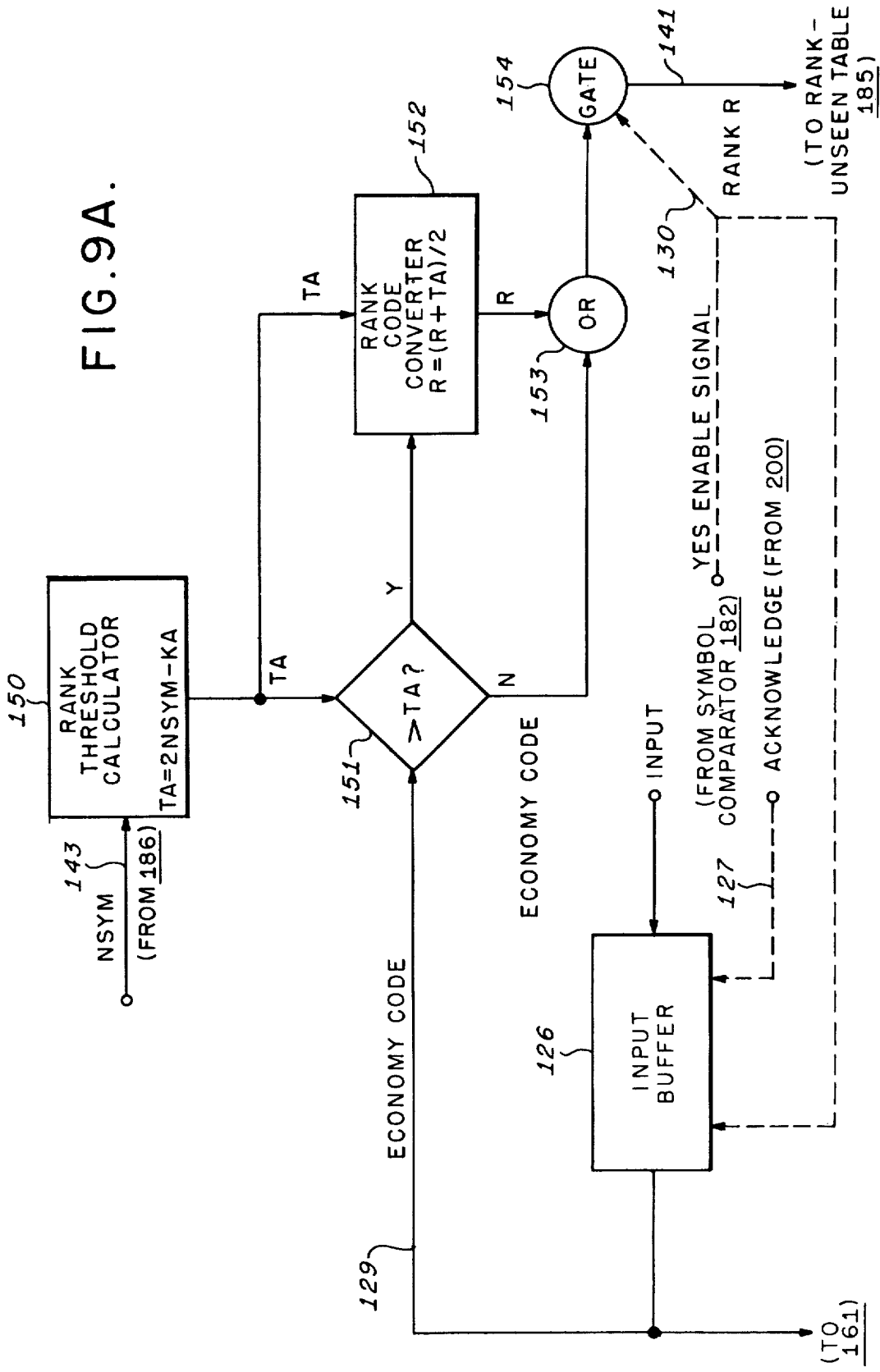
FIG. 9a is a schematic block diagram illustrating details of the rank economy decoder of the decoder of FIG. 9.

Details of the component blocks of the decoder of FIG. 9 will now be described by reference to FIGS. 9a–9h. Referring to FIG. 9a, in which like reference numerals indicate like elements with respect to FIG. 9, details of the rank economy decoder contained in the economy decoders 128 of FIG. 9 are illustrated. The rank economy decoder includes a rank threshold calculator 150 which computes the threshold TA in response to the NSYM count signal on the lead 143. The rank threshold calculator 150 is identical to the rank threshold calculator 105 (FIG. 8e) utilized in the encoder of the present invention. The threshold signal TA is applied to a rank threshold comparator 151 which also receives the rank economy code on the lead 129. The rank economy code for a newly encountered symbol is transmitted to the rank threshold comparator 151 from the input buffer 126 when the input buffer 126 receives the enable signal on the lead 130. The enable signal on lead 130 releases the encoded rank from input buffer 126. The rank threshold comparator 151 is configured in a manner similar to that of the rank threshold comparator 106 (FIG. 8e) and functions to transmit the rank economy code to a rank code converter 152 when the economy code exceeds the threshold TA, and to transmit the economy code to an OR gate 153 when the threshold is not exceeded. The rank code converter 152, which receives the threshold signal TA, transforms the economy encoded rank into the decoded rank by utilizing Equation 11 above where the computation is performed by integer arithmetic. Thus, when the economy code exceeds the threshold, the rank code converter 152 provides the decoded rank via the OR gate 153. When the threshold is not exceeded, the economy code is the symbol rank which is transmitted via the OR gate 153.

The rank economy decoder of FIG. 9a is enabled for decoding of rank signals by the enable signal on the lead 130. The enable signal on the lead 130 is applied to a gate 154 which receives its input from the OR gate 153. The output of the gate 154 provides the decoded rank on the lead 141. Thus, when the search tree data base 120 (FIG. 9) detects a newly encountered symbol, the search tree data base 120 issues the enable signal on the lead 130 which enables the gate 154 to transmit the decoded rank of the newly encountered symbol to the lead 141.

Figure 9B:
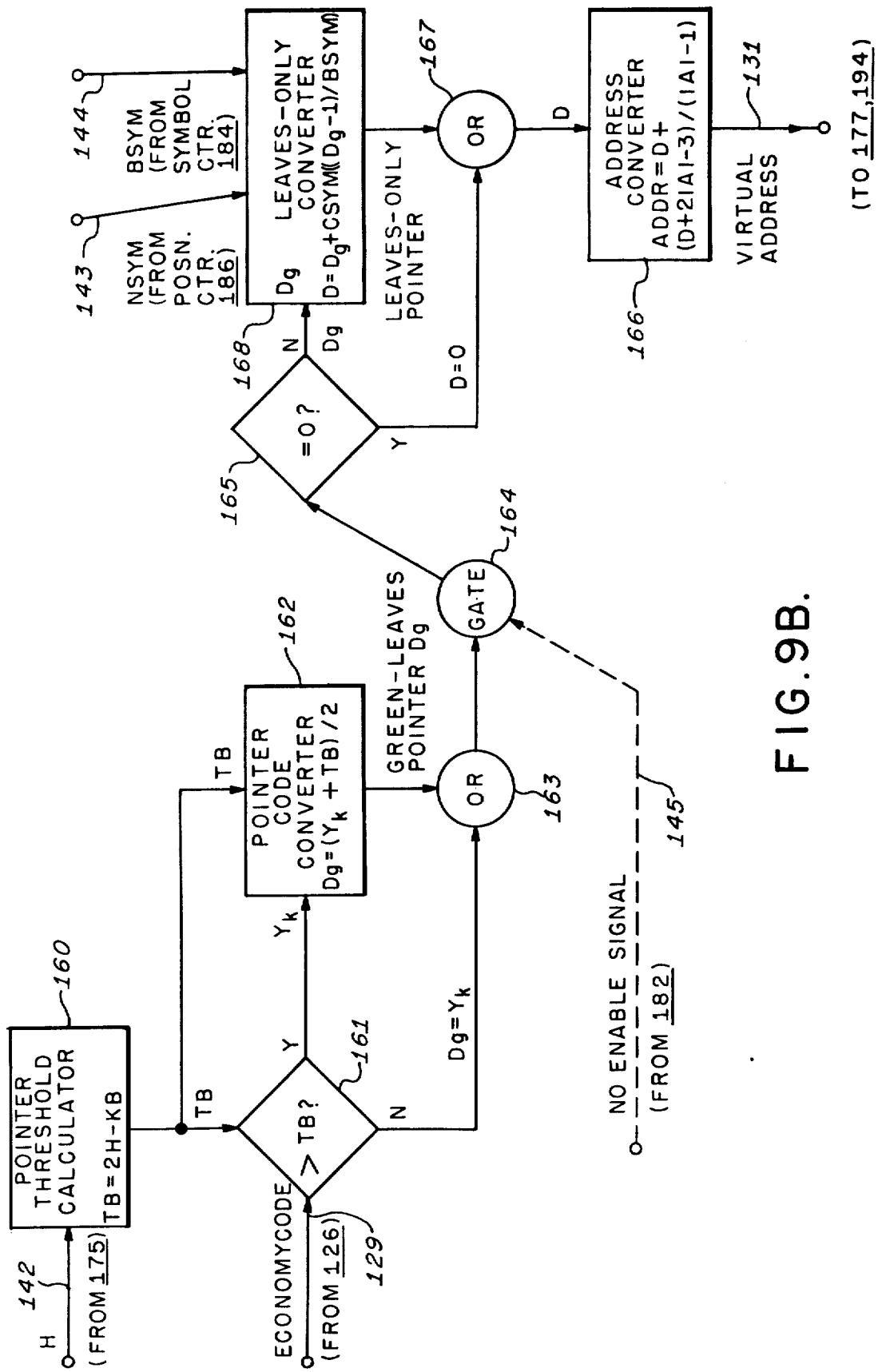
FIG. 9b is a schematic block diagram illustrating details of the pointer economy decoder of the decoder of FIG. 9.

Referring now to FIG. 9b, in which like reference numerals indicate like elements with respect to FIG. 9, a schematic block diagram of details of the pointer economy decoder contained in the economy decoders 128 of FIG. 9 is illustrated. The pointer economy decoder includes a pointer threshold calculator 160 which receives the pointer count H on the lead 142 and computes the threshold TB. The pointer threshold calculator 160 is identical to the pointer threshold calculator 100 of FIG. 8e.

The threshold signal TB is transmitted to a pointer threshold comparator 161 which also receives the economy code signal on the lead 129 from the input buffer 126 (FIG. 9a). As described above, the input buffer 126 transmits the next encoded pointer $Y_k$ to the theshold comparator 161 via the lead 129 upon receipt of the acknowledgement signal on the lead 127 from the pushdown stack 121 (FIG. 9). The threshold comparator 161 transmits the economy code on the lead 129 to a pointer code converter 162 when the economy code exceeds the threshold TB. When the economy code does not exceed the threshold, the economy code on the lead 129 is transmitted by the comparator 161 to an OR gate 163. The pointer code converter 162, which receives the threshold signal TB, converts the economy encoded pointer $Y_k$ to the green-leaves pointer signal $D_g$ utilizing Equation 7 above, where the computation is performed by integer arithmetic. Thus, when the economy encoded pointer $Y_k$ exceeds the threshold TB, it is converted into the green-leaves pointer by the converter 162 and transmitted through the OR gate 163. When the threshold is not exceeded, the economy code $Y_k$ is the green-leaves pointer $D_g$ which is transmitted directly through the OR gate 163.

The green-leaves pointer signal $D_g$ is applied to a gate 164 which is enabled by a signal on the lead 145 from the search tree data base 120 (FIG. 9). The enable signal on the lead 145 enables the gate 164 whenever the economy code signal is not a symbol rank. Thus, when the economy code is a pointer signal $Y_k$ the green-leaves pointer $D_g$ is transmitted through the gate 164 to a green-leaves comparator 165. The green-leaves comparator 165 compares the green-leaves pointer signal $D_g$ with 0 and, if 0, the pointer is transmitted directly to an address converter 166 through an OR gate 167 as the leaves-only pointer D. If, however, $D_g$ is not equal to 0, the comparator 165 transmits the pointer to a leaves-only converter 168 to be converted to the leaves-only pointer D by utilizing Equation 8 above, performing the computation by integer arithmetic. The symbol count BSYM, representative of the number of symbols which have been seen, is obtained from the search tree data base 120 (FIG. 9) via the lead 144. The term CSYM is derived within the converter 168 from the position count NSYM representative of the number of potential but as yet unseen symbols. CSYM is derived as NSYM−1 or is 0 when all of the symbols have been encountered. The NSYM signal is provided by the search tree data base 120 via the lead 143.

The leaves-only pointer signal D transmitted through the OR gate 167 is converted into the corresponding virtual address by the address converter 166 utilizing integer Equation 9 above. The virtual address generated by the address converter 166 is applied to the address generator 132 (FIG. 9) via the lead 131 to be compared to a hashing limit in a manner to be described. The address is returned by the address generator 132 in either hashed or unhashed format to the search tree data base 120 via the lead 133 to begin the tracing to a leaf of a forward path comprised of $X_1$ arcs. The virtual address on the lead 131 is also transmitted directly to the search tree data base 120 for reasons to be described.

Referring now to FIG. 9c, in which like reference numerals indicate like elements with respect to FIG. 9, a schematic block diagram of details of the search tree data base 120 of FIG. 9 is illustrated. The search tree data base 120 includes a label table 170 which comprises a collection of storage elements conceptually configured as illustrated in FIG. 5. The label table 170 is configured identical to and utilized in a manner identical to the label table 70 of FIG. 8a. The label table 170 stores the forward tree utilized to determine the leaf from which to commence a backward trace. The label table 170 is initialized to store the node label 1 at virtual address 1 and 0's at the remaining virtual addresses. The storage elements comprising the label table 170 are accessed under control of an address signal provided by the address generator 132 (FIG. 9) on the lead 133 so as to return the node label stored at the accessed address. The label provided by the label table 170 is applied to a label comparator 171 which compares the label with 0. The label comparator 171 is identical to the label comparator 71 of FIG. 8a. When the label is not 0 it is transmitted by the label comparator 171 via the lead 134 to the address generator 132 (FIG. 9). In response to the node label on the lead 134 the address generator 132 computes the virtual address of the $X_1$ son of the node and returns the address to the label table 170 via the lead 133. This procedure continues until a virtual address is reached for which no node label has been stored indicating that a leaf has been attained. The attained leaf has that virtual address from which to begin the backward trace.

The label table 170 and the address generator 132 (FIG. 9) are utilized by the decoder to perform the forward trace, since the address which is transmitted to the search tree data base 120 by the economy decoders 128 may be the address, not of a leaf, but of an internal node. As discussed above, this may occur since the encoder in generating leaves-only values transmits the pointer value of the father to its $X_1$ son. Before beginning a trace back it is necessary for the decoder to determine whether the address received from the encoder is that of a leaf or of an internal node. When the address is that of an internal node, the node is replaced by its $X_1$ son and the process continued until a leaf is obtained. Thus the virtual address received from the encoder is applied by means of the economy decoders 128 and the address generator 132 via the lead 133 to the label table 170 to begin the forward trace. When the label comparator 171 detects a node label 0 returned from the label table 170, the leaf for starting the backward trace has been detected and, after the forward search tree and backward search tree are updated, the backward trace to the root is commenced in a manner to be described.

The search tree data base 120 includes a node counter 172 which maintains count of the current node providing a signal representative of the node count K. The node counter 172 is identical to the node counter 74 of FIG. 8a. The node counter 172 is initialized to the count 1 and is enabled by the YES enable signal from the label comparator 171. The node count K is applied to the label table 170 through an ADD 1 circuit 173, which adds unity to the extant value K provided by the node counter 172. The output from the ADD 1 circuit 173 is also applied as an input to a gate 174 which is enabled by the YES enable signal from the label comparator 171, and the node count K from the node counter 172 is applied as an input to a pointer counter 175. When the label table 170 returns the node label 0, the label comparator 171 issues the YES enable signal to the node counter 172 enabling the node counter 172 to apply the node count K+1 for entry into the label table 170 at the virtual address on the lead 133 which had returned the node label 0. Updating the label table 170 in this manner updates the forward tree of the decoder in the same manner as the forward tree of the encoder is updated, as previously described.

The YES enable signal from the comparator 171 is also applied to a gate 176. The gate 176 is utilized to transmit the leaf virtual address from which to commence the backward trace. This leaf virtual address is that applied by the address generator 132 on the line 133 that resulted in the label table 170 issuing the label 0. This leaf virtual address is provided to the gate 176 from either the lead 131 from the economy decoders 128 (FIG. 9) or the lead 146 from the address generator 132 (FIG. 9) via an OR gate 177. In a manner to be clarified the leaf virtual address is provided on the lead 131 when the virtual address transmitted by the encoder as the pointer signal is that of a leaf. The leaf virtual address is provided on the lead 146 when the virtual address transmitted by the encoder as the pointer signal is that of an internal node.

The search tree data base 120 includes an address table 178 which comprises a collection of storage elements conceptually configured as illustrated in FIG. 5. The storage elements comprising the address table 178 are accessed under control of a node label signal provided by the label generator 135 (FIG. 9) on the lead 138 so as to return the virtual address stored at the accessed node label location. The address table 178 initially stores the address 1 corresponding to the node label 1 and 0's at all of the other node label locations. The address table 178 is responsive to the acknowledge signal from the pushdown stack 121 (FIG. 9) on the lead 140. The address table 178 accepts the label signal on the lead 138 and returns an address only when enabled by the acknowledge signal on the lead 140. The leaf virtual address from the gate 176 and the first label from the gate 174 are applied to the address table 178 for updating the address table 178 and hence updating the backward search tree in a manner to be described.

The address provided by the address able 178 is applied to an address comparator 179 (FIG. 9f) which compares the address with 1. When the address is not 1, it is transmitted by the address comparator 179 via an OR gate 180 and the lead 137 to the label generator 135 (FIG. 9) and the position extractor 136 (FIG. 9). The label generator 135 computes the node label of the father from the virtual address of the son. The label generator 135 receives the virtual address of the son via the lead 137 from the address table 178 and returns the label of the father to the address table 178 via the lead 138. The label provided on the lead 138 is also transmitted to the position extractor 136 (FIG. 9).

The position extractor 136 (FIG. 9g) receives the node label of the father from the label generator 146 and the virtual address of the son from the address table 178 via the lead 137 and computes the position of the arc joining the son to the father, returning this position to a position-symbol table 181 of the search tree data base 120 via the lead 139.

The position-symbol table 181 comprises a collection of storage elements conceptually configured as illustrated in FIG. 5. The storage elements comprising the position-symbol table 181 are accessed under control of the position signal on the lead 139 so as to return the symbol stored at the accessed position. The position-symbol table 181 contains a storage location for each position 1 through $|A|$. Initially the position-symbol table 181 contains a 0 for the symbol at each of the position locations. The symbol provided by the position-symbol table 181 is applied to a symbol comparator 182 which compares the symbol with 0. When the symbol is not 0, it is transmitted by the symbol comparator 182 via an OR gate 183 and the lead 122 to the pushdown stack 121 (FIG. 9h) for temporary storage. Unless the symbol provided to the symbol comparator 182 is equal to 0, the comparator 182 issues the NO enable signal on the lead 145 to enable the pointer economy decoder contained in the economy decoders 128, discussed above. When a new symbol is encountered the position-symbol table 181 transmits the symbol value 0 to the symbol comparator 182 which as a result issues the YES enable signal on the lead 130. The YES enable signal on the lead 130 is applied to the pointer counter 175, to the rank economy decoder contained in the economy decoders 128 (FIG. 9) to the input buffer 126 (FIG. 9), and to a symbol counter 184. As discussed above, the input buffer, upon receiving the enable signal on the lead 130 transmits the encoded symbol rank to the economy decoders 128 for decoding. Since the enable signal on the lead 130 enables the rank economy decoder, the decoded rank is transmitted by the economy decoders 128 via the lead 141 to a rank-unseen table 185 to recover the new symbol.

The rank-unseen table 185 comprises a collection of storage elements conceptually configured as illustrated in FIG. 5. The rank-unseen table 185 is the inverse of the unseen-rank table 82 of FIG. 8a and provides for each rank, the symbol corresponding thereto where the correspondence between rank and symbol is the same as that described above with respect to the table 82. The storage elements comprising the rank-unseen table 185 are accessed under control of the rank signal on the lead 141 so as to return the symbol stored at the accessed rank. The new symbol recovered from the rank-unseen table 185 is applied to the position-symbol table 181 and written into the position location provided on the lead 139 which had returned the symbol 0. The new symbol is also transmitted via the OR gate 183 and the lead 122 to the pushdown stack 121 (FIG. 9h) for temporary storage therein. Storing the new symbol at the last position p received from the position extractor 136 (FIG. 9) on lead 139 updates the position-symbol table 181. The rank-unseen table 185 is updated by circuitry contained therein by removing the new symbol from the table and moving all symbols thereafter up one location. This updating procedure is complementary to that described above with respect to the unseen-rank table 82 (FIG. 8a) and identical to that described above with respect to the table DR of the decoder program appended hereto.

The symbol counter 184, which is identical to the symbol counter 79 of FIG. 8a counts BSYM the number of distinct input symbols which have been encountered and provides the BSYM signal on the lead 144 to the pointer counter 175 and the economy decoders 128 (FIG. 9). Initially, the counter 184 is set to 0 and thereafter counts upwardly. The symbol counter 184 is incremented by unity upon receipt of the YES enable signal from the symbol comparator 183.

The search tree data base 120 also includes a position counter 186 which counts NSYM, the number of potential but as yet unseen symbols and provides the NSYM signal on the lead 143 to the economy decoders 128 (FIG. 9). The position counter 186 is identical to the position counter 80 of FIG. 8a and is initialized to the value $|A|$. The counter 186 counts downwardly to 0. The position counter 186 provides an inhibiting signal to the pointer counter 175 and the symbol counter 184 when the position counter 186 attains the count of 1. In this manner the symbol counter 184 is prevented from counting beyond $|A|-1$. The rank-unseen table 185 includes circuitry that provides a decrementing signal to the position counter 186 whenever a decoded rank is received on the lead 141. The decrementing signal from the rank-unseen table 185 decrements the NSYM count by unity. The position counter 186 decrements down to the 0 count and remains at the 0 count for the remainder of the data compression operation.

The pointer counter 175, which is identical to the pointer counter 75 of FIG. 8a receives the node count K from the node counter 172 and the symbol count BSYM from the symbol counter 184 as well as enable signals from the address comparator 179 and the symbol comparator 182 and an inhibit signal from the position counter 186. The pointer counter 175 also receives an inhibit signal from a comparator 187 for reasons to be described. The pointer counter 175 computes the pointer count H, the number of green-leaves in the incremental tree, which it provides via the lead 142 to the economy decoders 128 (FIG. 9). Initially, the pointer counter 175 is set to 1. When the address comparator 179 provides the YES enable signal on the lead 123 to the pointer counter 175, the count in the counter 175 is increased by the BSYM value from the symbol counter 184. When the symbol comparator 182 issues the YES enable signal on the lead 130 to the pointer counter 175, the pointer count H is increased by the node count K from the node counter 172. When, however, the position counter 186 issues the inhibit signal to the pointer counter 175, the counter 175 is inhibited from utilizing the node count K to increment the pointer count H. As discussed above, the inhibit signal from the position counter 186 also inhibits incrementation of the symbol counter 184 which, as a result, does not count beyond $|A|-1$.

Referring for the moment to FIG. 9d, an implementation for the pointer counter 175 is illustrated. It is appreciated that the components and configuration of FIG. 9d is identical to that of FIG. 8b. The pointer counter 175 comprises a gate 190, a gate 191, and an accumulator 192. The gate 190 receives the node count K from the node counter 172 and the YES enable signal from the symbol comparator 182 and transmits the current node count K to the accumulator 192 upon receipt of the enable signal from the comparator 182. The gate 190 also receives the inhibit signal from the position counter 186 which inhibits the gate 190 from transmitting the node count K to the accumulator 192 when the position counter 186 stores the count of 1.

The gate 191 receives the symbol count BSYM from the symbol counter 184 and the YES enable signal from the address comparator 179 as well as the inhibit signal from the comparator 187. The gate 191 transmits the current BSYM count to the accumulator 192 upon receipt of the enable signal from the comparator 179. The accumulator 192, which is initialized to the count of 1, increments the count stored therein by BSYM and K under control of the comparators 179 and 182 respectively to provide the pointer count H on the lead 142.

In operation when a new internal node is defined in the incremental search tree, the enable signal to the gate 191 from the comparator 179 causes the count in the accumulator 192 to be increased by BSYM, where $BSYM = |A|-1$ when all of the symbols have been encountered. Whenever a new symbol is encountered, the enable signal applied to the gate 190 by the symbol comparator 182 causes the pointer count to be increased by the node count K. This increase, however, does not occur if $|A|-1$ potential symbols have been encountered. As discussed, the increase by the node count K is prevented by the inhibit signal provided to the gate 190 by the position counter 186 whenever the position counter 186 contains the count of 1.

Figure 9E:
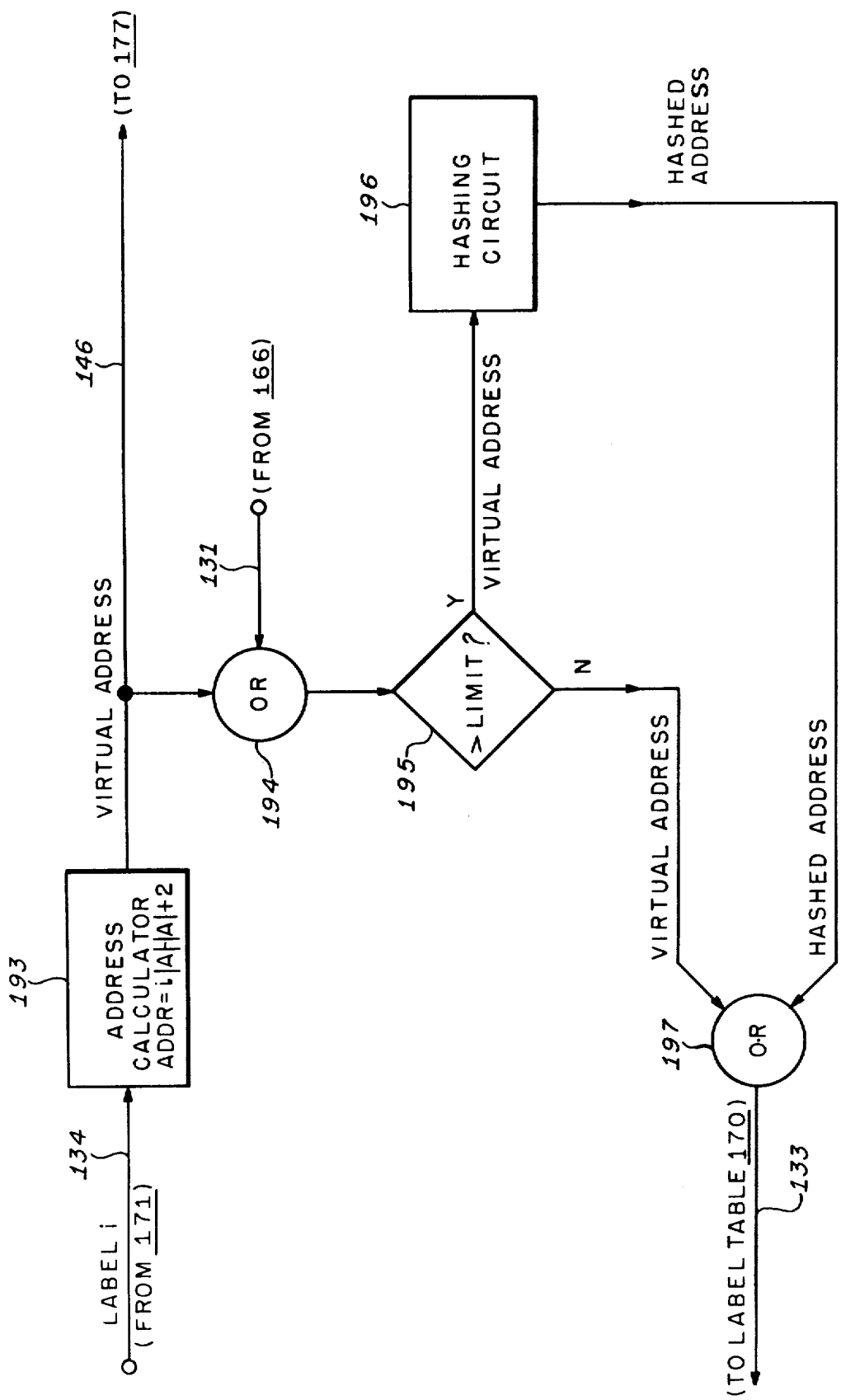
FIG. 9e is a schematic block diagram illustrating details of the adress generator of the decoder of FIG. 9.

Referring for the moment to FIG. 9e, in which like reference numerals indicate like elements with respect to FIG. 9, a schematic block diagram of details of the address generator 132 of FIG. 9 is illustrated. The address generator 132 includes an address calculator 193 which in response to the node label i from the label comparator 171 calculates the virtual address for the $X_1$ son of the node utilizing Equation 1 above where the position term $\emptyset(J)$ or p is replaced by the position $|A|$ of the $X_1$ son. The address calculator 193 may include circuitry similar to and perform the computation in a manner similar to the address calculator 90 of FIG. 8c. The virtual address computed by the address calculator 193 is provided via the lead 146 to the OR gate 177 of FIG 9c. The virtual address computed by the address calculator 193 is also provided as an input to an OR gate 194. The OR gate 194 also receives an input on the lead 131 from the address converter 166 of FIG. 9b.

The virtual address from the address calculator 193 or from the pointer economy decoder on the lead 131 is provided to a hashing limit comparator 195 where it is compared with the limit established for the size of direct storage in the label table 170. The comparator 195 is identical to the hashing limit comparator 91 of FIg. 8c. The comparator 195 is configured whereby when the virtual address is greater than the established limit, the address is provided on the YES output thereof; otherwise the virtual address is provided on the NO output thereof. The address generator 132 also includes a standard hashing circuit 196 which is identical to the hashing circuit 92 of FIG. 8c. The hashing circuit 196 hashes the virtual address in a conventional manner. The hashed address from the hashing circuit 196 is applied to an OR gate 197 which also receives the unchanged virtual address when the address is not greater than the established limit. The resulting address, hashed or unhashed in accordance with the comparison made by the comparator 195, is returned to the label table 170 via the lead 133 to continue the search through the $X_1$ arcs of the forward search tree.

Referring again to FIG. 9c, when the virtual address on the lead 133 results in the label table 170 returning a 0 label, the address on the lead 133 is that of the leaf from which to commence the backward trace. The YES enable signal issued from the label comparator 171 enables the gates 174 and 176 to transmit the first label and the leaf address respectively for updating the address table 178. The leaf address transmitted through the gate 176 is stored at the node $K+1$ location of the address table 178 where K is the extant node count of the node counter 172. In this manner the backward incremental search tree is updated with the current information.

It is appreciated that when the virtual address pointer signal transmitted by the encoder is that of a leaf, the virtual address provided by the address converter 166 (FIG. 9b) through the components 195, 196 and 197 (FIG. 9e) and then to the label table 170 via the lead 133 results in the label comparator 171 issuing the YES enable signal. This leaf address is provided directly from the address converter 166 via the lead 131 and the OR gate 177 to provide the first leaf address to the address table 178 via the gate 176. When, however, the virtual address pointer signal transmitted by the encoder is that of an internal node, the virtual address from the address converter 166, passed through the components 195, 196, and 197 (FIG. 9e) to provide the address on the lead 133 to the label table 170, results in a non 0 label being returned by the label table 170 and transmitted by the label comparator 171 via the lead 134 to the address calculator 193 (FIG. 9e). The address calculator 193, in turn, provides a new address to the label table 170. This forward search continues until the label table 170 returns a 0 label indicating that the desired leaf has been attained. When this occurs, the leaf virtual address for beginning the backward trace is provided from the address calculator 193 (FIg. 9e) via the lead 146 and the OR gate 177 to provide the first leaf address to the address table 178 via the gate 176.

The first leaf address of the backward trace is provided via the OR gate 180 and the lead 137 to the label generator 135 which generates the label of the father node to be visited from the virtual address of the son. The father node label is applied to the address table 178 via the lead 138. As discussed above, the address on the lead 137 and the father node label on the lead 138 computed by the label generator 135 are applied to the position extractor 136 (FIG. 9) which returns the position of the arc from the son to the father to the position-symbol table 181 via the lead 139. The position-symbol table 181 converts the position into the symbol and transmits the symbol via the lead 122 to the pushdown stack 121. When the pushdown stack 121 receives a symbol, an acknowledge signal is transmitted thereby on the lead 140 to the address table 178 permitting the node label on the lead 138 to access the table to continue the backward trace.

During each cycle of the backward trace, the current node label on the lead 138 is provided to the address table 178 which returns the virtual address of the node to the address comparator 179 where it is compared with 1. If the address is not equal to 1, the new address is transmitted to the label generator 135 and the position extractor 136. When the address comparator 179 receives the address 1, the root of the tree has been attained and the traceback ends. The resulting sequences of addresses provided by the address table 178 may be considered as paths through the incremental search tree which effectively record the decoded segments in reverse order. The last element in the sequence is distinguished as the root when the address 1 is returned by the address table 178 in response to the current label.

When the root is atained, the address comparator 179 issues the YES enable signal on the lead 123. This signal updates the pointer counter 175 as discussed above and increments the node counter 172 by unity. During each iteration in which a new symbol is encountered, thus causing the symbol comparator 182 to issue the YES enable signal, the signal on the lead 123 from the address comparator 179 decrements the position counter 186 by unity, until the count 0 is attained. The YES enable signal on the lead 123 from the address comparator 179 also enables the pushdown stack 121 (FIG. 9) to transmit its contents to the output buffer 124 (FIG. 9).

As discussed above, the position p returned by the position extractor 136 via the lead 139 is applied to the position-symbol table 181 which, in turn, transmits the symbol assigned to the position p to the symbol comparator 182 where it is compared with 0. When a new symbol is encountered during an interation, the symbol comparator 182 issues the YES enable signal on the lead 130. When a new symbol is not encountered during an iteration, the symbol comparator 182 issues the NO enable signal on the lead 145. Quiescently, the symbol comparator 182 issues the NO enable signal on the lead 145 thereby enabling the pointer economy decoder contained in the economy decoders 128 (FIG. 9) and disabling the rank economy decoder contained in the economy decoders 128. When, however, the symbol comparator 182 detects that a new symbol has been encountered, the YES enable signal on the lead 130 enables the rank economy decoder, disables the pointer economy decoder and enables the input buffer 126 to transmit the symbol rank to the rank economy decoder. The symbol comparator 182 provides the YES enable signal only during the portion of the decoding iteration required to acquire and store the new symbol. Thereafter the symbol comparator 182 reverts to the NO state to again enable the pointer economy decoder. Any convenient signal, such as the acknowledge signal on the lead 140 from the pushdown stack 121 (FIG. 9) may be utilized to reset the symbol comparator 182 back to the NO state.

Figure 9F:
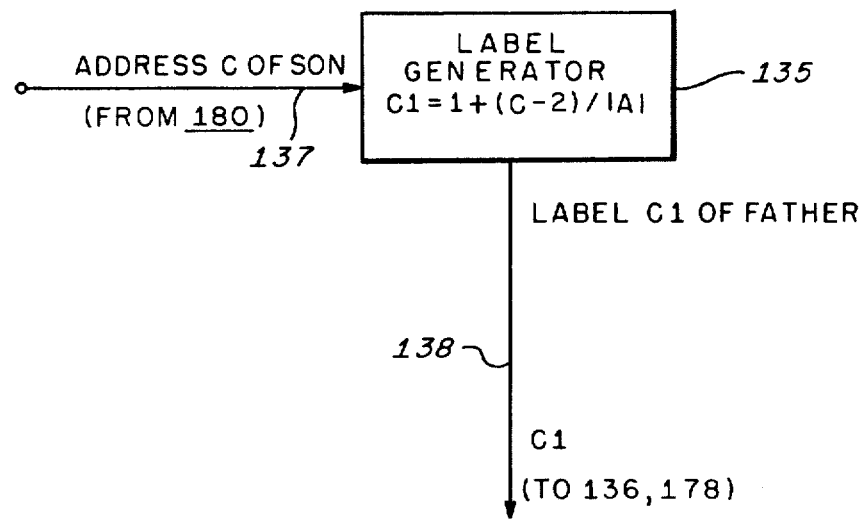
FIG. 9f is a schematic block diagram illustrating details of the label generator of the decoder of FIG. 9.

Referring now to FIG. 9f, in which like reference numerals indicate like elements with respect to FIG. 9, the label generator 135 of FIG. 9 is illustrated. The label generator 135 receives the address C of the son on lead 137 and generates the label Cl of the father on the lead 138 by utilizing the integer Equation 1 above. It is appreciated that the term i and the term Cl are used synonomously to designate the node label of the father. It is further appreciated that the term $\overline{i}$ and the term C are utilized synonomously to denote the virtual address of the son. Any convenient conventional circuitry may be utilized to implement the designated integer equation. For example, conventional shift-and-add circuitry may be utilized as discussed hereinabove.

Figure 9G:
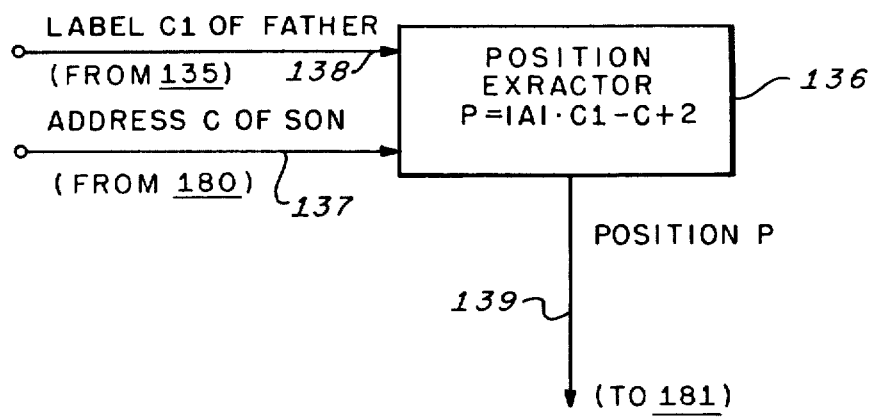
FIG. 9g is a schematic block diagram illustrating details of the position extractor of the decoder of FIG. 9.

Referring now to FIG. 9g, in which like reference numerals indicate like elements with respect to FIG. 9, details of the position extractor 136 of FIG. 9 are illustrated. The position extractor 136 receives the node label Cl of the father on the lead 138 and the virtual address C of the son on the lead 137 and computes the position of the arc joining the son to the father utilizing integer Equation 3 above. It is appreciated that the terms $\emptyset(J)$ and p are utilized synonomously to denote arc position. The position signal p is provided by the position extractor 136 on the lead 139. Any convenient conventional circuitry may be utilized to implement the designated equation including conventional shift-and-add circuitry.

Figure 9H:
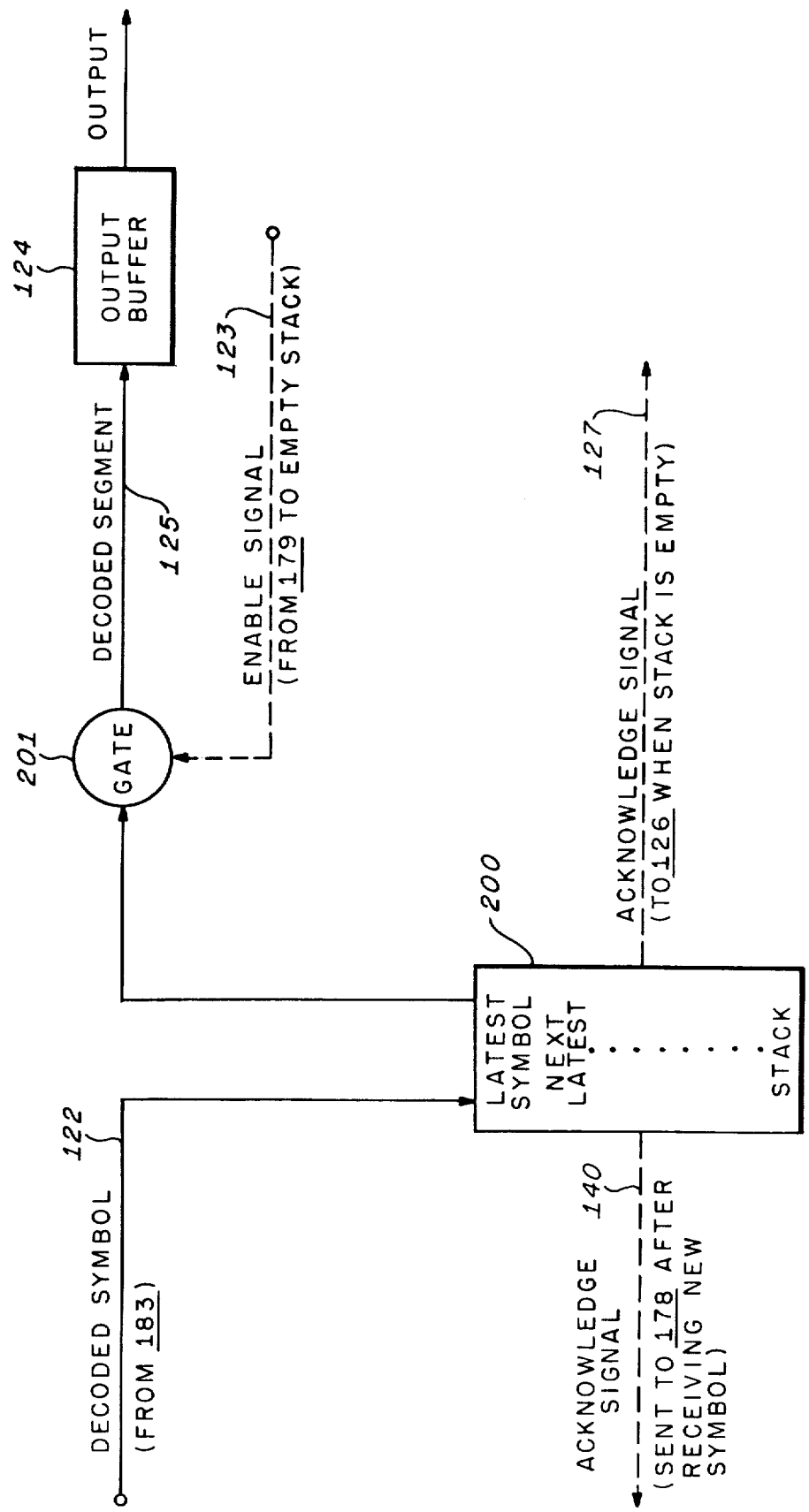
FIG. 9h is a schematic block diagram illustrating details of the push down stack of the decoder of FIG. 9.

Referring now to FIG. 9h, in which like reference numerals denote like elements with respect to FIG. 9, a schematic block diagram of details of the pushdown stack 121 of FIG. 9 is illustrated. The pushdown stack 121 comprises a conventionally configured first in-last out (FILO) pushdown stack 200 that receives the decoded symbols one at a time on the lead 122 from the search tree data base 120. After receiving a symbol, the pushdown stack 200 transmits an acknowledgement signal on the lead 140 to the address table 178 to continue the backward decoding trace. When the root of the backward tree is attained, the address comparator 179 (FIG. 9c) transmits the YES enable signal on the lead 123 to a gate 201 which permits the contents of the pushdown stack 200 to be emptied into the output buffer 124 in the reverse order with respect to the order in which they were acquired by the stack 200. Thus, the pushdown stack 200 reverses the order of the decoded segment of symbols which were provided by the search tree data base 120 in an order reversed from the original order of the data. Accordingly, the pushdown stack 200 provides the symbols of the decoded segment in the order in which they appeared in the original data stream. The pushdown stack 200 then transmits an acknowledgement signal on the lead 127 to the input buffer 126, signalling the buffer 126 to send the next encoded pointer to the economy decoders 128 for decoding.

In the operation of the decoder illustrated in FIGS. 9a–9h, initially the label table 170 stores node label 1 at virtual address 1 and 0's at the remaining virtual addresses, the address table 178 stores virtual address 1 at the node label 1 and 0's at the remaining node labels, the position-symbol table 181 stores 0's at all of the positions and the rank-unseen table 185 initially provides the correspondence between rank and the symbols of the alphabet as established in the unseen-rank table 82 of FIG. 8a. Additionally, the counters are initialized as follows: the node count K of the node counter 172 is set to 1, the pointer count H of the pointer counter 175 is set to 1, the position count NSYM of the position counter 186 is set to $|A|$, and the symbol count BSYM of the symbol counter 184 is set to 0. Quiescently the symbol comparator 182 provides the NO enable signal on the lead 145 thereby enabling the pointer economy decoder contained in the economy decoders 128. The first pointer $Y_1$ received from the encoder has the value 0 which is the pointer passed down from the root father to the $X_1$ son node 2. This is evidenced in FIG. 4c which illustrates the incremental search tree $(T_2, B_2)$. This 0 valued pointer when applied to the pointer threshold comparator 161 is less than the threshold TB and thus takes the NO path through the enabled gate 164. Since the green-leaves pointer $D_g$ is equal to 0, the signal takes the YES path through the green-leaves comparator 165, through the OR gate 167 to the address converter 166. The address converter 166 converts the leaves-only pointer $D=0$ to virtual address 1 which is passed through the hashing limit comparator 195 via the OR gate 194 and thereafter applied to access the label table 170 via the lead 133. In response to the virtual address 1 applied on the lead 133, the label table 170 returns the node label 1. The label comparator 171 passes the node label 1 to the address calculator 193, via the lead 134, which generates the virtual address of the $X_1$ son which in this instance is virtual address 2. The virtual address 2 is passed through the hashing limit comparator 195 to the lead 133 accesses the label table 170 resulting in a 0 node label returned therefrom. The 0 node label returned by the label table 170 indicates that the leaf from which to commence the bckward trace has been attained.

The 0 node label applied to the label comparator 171 results in issuance of the YES enable signal therefrom. The YES enable signal from the label comparator 171 enables the node counter 172 which, through the ADD 1 circuit 173, stores the node label 2 at the accessed virtual address 2 in the label table 170. The YES enable signal from the label comparator 171 enables the gate 174 to transmit the first label of value 2 to the address table 178 and enables the gate 176 to transmit the first leaf address of value 2 appearing on the lead 146 to the address table 178. The first node label of value 2 accesses this location in the address table 178 causing the leaf address value 2 to be stored thereat.

The leaf address of value 2 transmitted through the gate 176 is also applied via the OR gate 180 to the label generator 135 and the position extractor 136. The label generator 135 in response to the virtual address of value 2 generates the node lbel of value 1 and applies this node label value to the address table 178 via the lead 138. The node label of value 1 generated by the label generator 135 is also applied to the position extractor 136. The position extractor 136 generates the position $|A|$ from the node label of value 1 and the virtual address of value 2.

The position |A| returned by the position extractor 136 to the position-symbol table 181 results in the position-symbol table 181 returning the value 0 to the symbol comparator 182. The concomitant YES enable signal issued by the symbol comparator 182 enables the pointer counte 175 to add K=1 to the pointer count which now becomes H=2. The YES enable signal from the symbol comparator 182 also increments the symbol counter 184 to BSYM=1.

The YES enable signal from the symbol comparator 182 enables the gate 154 of the rank economy decoder via the lead 130 and signals the input buffer 126 via the lead 130 to transmit the encoded rank of the new symbol to the rank economy decoder. The decoded rank for this first encountered symbol is applied via the lead 141 to the rank-unseen table 185 which returns the symbol corresponding thereto. The new symbol is applied to the position-symbol table 181 which stores the new symbol at the rank position accessed by the lead 139 which, in this instance, is |A|. The circuitry within the rank-unseen table 185 also decrements the position counte 186 to |A| −1. The new symbol is also transmitted via the OR gate 183 to the stack 200. The stack 200 issues the acknowledge signal to the address table 178 on the lead 140, permitting the node label of value 1 on the lead 138 to access the address table 178. The address table 178, in response thereto, returns the virtual address 1 of the root. The concomitant YES enable signal from the address comparator 179 on the lead 123 enables the pointer counter 175 to add BSYM=1 to H=2 to provide H=3 as the pointer count. The node counter 172 is also incremented to K=2. The YES enable signal from the address comparator 179 applied to the gate 201 via the lead 123 gates the decoded segment from the stack 200 to the output buffer 124. The stack 200 thereafter acknowledges the input buffer 126 via the lead 127 when the stack is empty. The input buffer 126 then issues the next pointer which is processed in the manner described above.

As appreciated from FIG. 4c, there are three leaf pointers in the extant incremental search tree ($T_2$, $B_2$) and thus the pointer count H equals 3. One symbol has been encountered and thus the symbol count BSYM equals 1 and the number of symbols yet to be seen NSYM equals |A|−1.The next node to be processed has node label 3 and, therefore, the node counter 172 stores K=2.

When the next to the last newly encountered symbol has been processed and the tree updated, NSYM will be 1 and BSYM will be |A|−1. The 1 count from the position counter 186 will inhibit the symbol counter d184 from counting beyond the value |A|−1 and the pointer counter 175 will be inhibited from updating the poiner count H by adding the node count K thereto. When the last symbol is encountered, the count NSYM=1 maintains the inhibition of the symbol counter 184 and the pointer counter 175 and when the count NSYM is decremented to 0, the symbol comparator 182 will thereafter no longer receive a 0 from the position-symbol table 181.

As discussed bove with respect to FIG. 8a, the comparator 69 was included to determine when storage for the forward search tree was exhausted. In a similar manner the search tree data base of FIG. 9c includes identical comparator 187 to determine when the node count K is equal to the constant KM. The YES signal from the comparator 187 inhibits the node counter 172, the label table 170 and the pointer counter 175 in the manner described above with respect to FIG. 8a. The inhibit signal applied to the gate 191 (FIG. 9d) of the pointer counter 175 functions in the manner described above with respect to the inhibit signal applied to the gate 86 (FIg. 8b).

It will be appreciated with respect to FIG. 8, FIGS. 8a–8e, FIg. 9 and FIGS. 9a–9h, that the sequences of operations described above are controlled in a conventional manner by a system clock and sequence control units not shown. A sequence control unit connected to the components of the encodedr of FIGS. 8a–8e controls the sequences of operation described above. A sequence control unit connected to the components of the decoder of FIGS. 9a–9h controls the sequences of operations performed thereby as described above. The component blocks of FIGS. 8a–8e and 9a–9h may be implemented by any convenient conventional circuitry for performing the functions described. For example, analog circuits, discrete digital circuits or dedicated programmed processors may be utilized to perform the functions. With respect to an implementation utilizing dedicated programmed processors, coding similar to that appended hereto and discussed above may be utilized in implementing the components.

Although the above described embodiments of the invention utilize consecutively increasing integer node labels and prdetermined arc positions relating to the order in which the symbols are received, it will be appreciated that other arrangements within the purview of the present invention may be utilized. For example, instead of utilizing node labels, the virtual addresses of the internal and external nodes of the search tree may be utilized for uniquely defining the nodes and for controlling the forward and backward traces. Furthermore, the arc positions may be assigned in any predetermined order such as lexicopraphically. It is desirable, however, that the predetermined order of arc position assignments be the same in both the encoder and decoder.

The encoder and decoder of the present invention construct the above described search tree in which each parsed segment of the input data is represented by a path from the root to a leaf. The search tree data base enables parsing, encoding and decoding to be accomplished in linear time. Each input symbol is processed only once by traversing one branch in the tree from a father node to one of its sons. The search tree grows adaptively with the processing of input data. As each new segment is parsed, one new internal node of the tree is created from a leaf, and new leaves are defined, one for each symbol which has been seen plus 1, the alpha branch, to represent all potential but unseen symbols.

The search tree data base includes the label table which storage array is utilized to encode input data, traversing the tree in the forward direction. For any labeled node K and arc position, the virtual address of the appropriate son node is computed by the address generator and the label of the son node is then obtained from the label table. The address table contained in the search tree data base is an arrayutilized in decoding by traversing the search tree in the backward direction. For any virtual address, the node label of the appropriate father node is generated by the label generator and the virtual address of the father is then obtained from the address table.

In the above described embodiments of the invention for each symbol encounteredin the file by the encoder, the symbol-position table provides the arc position assigned to the symbol. The right most (highest) position is assigned to $X_1$, the first symbol encountered, the second right most (second highest) to the second symbol, and so forth. The position-symbol table is the inverse of the symbol-position table. The position-symbol table is utilized by the decoder to keep track, for each arc position, of the symbol which has been assigned to that position.

The encoder constructs the symbol-position table, which provides for each symbol j belonging to A, which symbol has been encountered in the input, the position $\emptyset(j)$ belonging to the set $(1, |A|)$. Whenever a new symbol j is encountered, the next available integer q in the set $(1, |A|)$ is assigned as $\emptyset(j)$, and the symbol-position table is updated by setting $\emptyset(j)=q$. In the preferred embodiments of the invention the assignments are made in order to decreasing q. The first encountered input symbol is assigned the position $|A|$, the second $|A|-1$, etc. The decoder constructs the position-symbol table, which provides for each position q in $(1, |A|)$ the symbol $\emptyset^{-1}(q)=j$ where j belongs to A.

As discussed above, the encoder of the present invention parses the current input data stream by copying the longest match form a previous comma to the next ensuing comma and suffixing an innovation thereto which is the next occurring input symbol. This information is efficiently realized by the pointer to a leaf of the search tree. The path to the root through the father of the leaf provides the segment to be copied thus obviating any requirement for saving old processed input. From each internal node of the search tree extend branches corresponding to all input symbols which have currently been seen in the encoding process, plus the alpha branch, which represents any unseen symbol. After any iteration there are as many nodes in the search tree as there are possible combinations of past commas and innovative symbols which can follow. Combinations which do not represent longest possible copies are represented not by leaves but by internal nodes. Thus, a pointer to one of the search tree leaves provides a minimal representation of the combined event (comma, innovation).

The use of the alpha branch effects a considerable savings in leaf pointer cost. Without this device there would be many more leaves in the tree since each internal node would have one branch extending from it for each possible input symbol, even through many symbols may never appear.

The above described features of the present invention provide a linear data compression process and apparatus for locating the longest copy together with an efficient encoding of the joint event (comma, innovation) and of new symbols as they occur. The data compression system of the present invention does not introduce any changes into the original data, is general purpose and does not presuppose any particular form of input data redundancy. The system of the present invention is op;timal in the long run and the processing time and required storage grow only proportionately to the amount of data to be compressed. The data compression apparatus and system of the present invention provide significantly improved data compression ratios even compared to prior art systems that are presently considered optimal.

Because the system of the present invention possesses the property of noiselessness, a priori knowledge of the input alphabet is not required. The binary code representations of the $2^m$ symbols of the alphabet (where m is the symbol bit size) are assigned ranks in a predetermined order as discussed above. The system receives the binary representations of the symbols, transmits the corresponding ranks and reproduces the symbol binary representations from the received ranks. Thus it is appreciated, as described above, that the unseen-rank table of the encoder and the rank-unseen table of the decoder assign the ranks to the symbols in the same predetermined order with respect to each other, thus providing the correspondence between the initial input data to the encoder and the final output data from the decoder.

The symbol bit size m is predetermined in accordance with the number of symbols that the system will accommodate thus determining the alphabet size $2^m$ processed by the system. The data compression system of the present invention does not require knowledge of the interpretation of the data throughout the compression and recovery procedure. The interpretation of the data is external to the system and irrelevant to the encoding and decoding process.

In the above described embodiments of the invention the encoder and decoder constitute a practical implementation of the modified version of the Lempel-Ziv data compression algorithm described above. The modification is that copying is permitted to take place only from a previous comma (division between parsed segments) up to its successor comma. Each new parsed segment of the input data is identical to an earlier parsed segment constituting the longest match, with one new innovative symbol suffixed constituting the next occurring symbol in the data stream following a matching segment. This modification effects a simplification in the search for the longest copy in the past data history. The present invention is asymptotically optimal and performs significantly better than the unmodified prior art Lempel-Ziv algorithm. This is primarily because the working memory space fills up much less rapidly in the present invention than it would in the unmodified algorithm, so that it becomes practicable to retain a significantly longer past history of the input. Additionally, fewer bits are required for the pointer to a past comma, than would have been required in the unmodified algorithm to point to an arbitrary symbol position in the past input data. Furthermore, bits are not required for indicating the length of the copy, as would have been required in the unmodified algorithm, since the length is always determined as extending to the next ensuing comma.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A data compression and decompression system for compressing digital data and recovering the original data from the compressed data, said system including means for reading the digital data from a medium to provide a stream of data symbol signals, said data symbol signals being members of an alphabet of symbol signals comprising a predetermined number of symbol signals, said system including compression apparatus responsive to said stream of data symbol signals for providing a compressed stream of code signals corresponding thereto and applying said code signals to a medium, said system further including decompression apparatus responsive to said code signals for recovering the original data therefrom, said compression apparatus comprising:

means for parsing said stream of data symbol signals into segments, each segment comprising a prefix and the next data symbol signal occurring in said stream after said prefix, said prefix comprising the longest match with a previous segment, said parsing means defining a first search tree having nodes and branches emanating from said nodes, each node having at most one incoming branch, the outgoing branches emanating from a node being representative of said symbol signals of said alphabet, respectively, said nodes having respective node labels associated therewith and respective addresses associated therewith, said first search tree having a unique root node without an incoming branch and leaf nodes without outgoing branches, said parsing means comprising means for tracing said stream of data symbol signals through said first search tree along a path from said root node to a leaf node, including means responsive to said stream of data symbol signals for determining the branches of said path in accordance with said symbol signals respectively, said parsing means comprising first storage means comprising a plurality of storage locations corresponding respectively to said addresses of said nodes of said tree, said storage locations being utilized for storing said node labels, a node label stored at a particular storage location identifying the node whose address corresponds to said particular storage location, address generator means for generating an address signal and for providing said address signal to said first storage means for accessing said storage locations thereof, said first storage means providing, in response thereto, the node label stored in the storage location accessed by said address signal, said address generator means being responsive to a node label provided by said first storage means and to a data symbol signal from said stream of data symbol signal for generating said address signal in accordance therewith, first detecting means for detecting when an accessed storage location of said first storage means does not contain a node label, said storage location not containing a node label defining a leaf node of said first search tree, and node counting means for inserting a node label into said accessed storage location of said first storage means detected by said first detecting means as not containing a node label;

said address generator means comprising means for sequentially generating said address signals and for providing said address signals to said first storage means, the node label provided by said first storage means in response to an address signal providing the node label for generating the next address signal, said address generator means sequentially generating said address signals in accordance with the node labels sequentially provided by said first storage means respectively and in accordance with successive symbol signals of said stream of data symbol signals respectively, said address generator means sequentially generating said address signals until said first detecting means detects an accessed storage location of said first storage means without a node label; and means responsive to the address of said accessed storage location not containing a node label for generating a pointer signal in accordance therewith for each said segment, said pointer signal being representative of said previous segment matching said prefix and of said next occurring data symbol signal after said prefix, thereby providing pointer signals for segments of said stream of data symbol signals, respectively, said pointer signals comprising said compressed stream of code signals.

2. The compression apparatus of claim 1 in which said address generator means comprises means for generating said address signal further in accordance with the number of symbol signals comprising said alphabet.

3. The compression apparatus of claim 1 in which said means for tracing said stream of data symbol signals through said first search tree from said root node to a leaf node includes means for initiating said tracing by accessing said first storage means at said storage location corresponding to said root node.

4. The compression apparatus of claim 1 in which said node counting means comprises means for generating successively increasing node labels in accordance with said first detecting means detecting accessed storage locations of said first storage means not containing node labels respectively.

5. The compression apparatus of claim 4 in which said parsing means further comprises symbol mapping means for assigning ordered symbol position signals to said symbol signals of said alphabet, respectively, said symbol position signals being provided to said address generator means for generating said address signals in accordance therewith.

6. The compression apparatus of claim 5 in which said outgoing branches emanating from a node are representative of said symbol signals of said alphabet, respectively, in accordance with the order in which said symbol signals of said alphabet are received by said parsign means, said symbol mapping means comprising means for assigning said ordered symbol position signals to said symbol signals of said alphabet, respectively, in accordance with the order in which said symbol signals of said alphabet are received by said parsing means.

7. The compression apparatus of claim 6 in which said outgoing branches emanating from a node have positions with respect to each other in accordance with the order in which said symbol signals of said alphabet are received by said parsing means, said symbol mapping means comprising second storage means comprising a plurality of storage locations corresponding respectively to said symbol signals of said alphabet, said storage locations being utilized for storing said symbol position signals, a symbol position signal symbol signal of said alphabet indicating the order in which said particular symbol signal was received by said parsing means with respect to the other symbol signals of said alphabet, said second storage means being accessed by the symbol signals of said stream of data symbol signals to provide the symbol position signals stored at said storage locations corresponding to the accessing symbol signals, said symbol position signal provided by said second storage means being provided to said address generator means for generating said address signals in accordance therewith.

8. The compression apparatus of claim 7 in which said symbol mapping means further includes second detecting means for detecting when an accessed storage location of said second storage means does not contain a symbol position signal.

9. The compression apparatus of claim 8 in which said symbol mapping means further includes position counting means for inserting a symbol position signal into said accessed storage location of said second storage means detected by said second detecting means as not containing a symbol position signal.

10. The compression apparatus of claim 9 in which said position counting means comprises means for generating successive symbol position signals in response to said second detecting means detecting storage locations of said second storage means not containing symbol position signals.

11. The compression apparatus of claim 6 in which said address generator means comprises means for generating said address signal in accordance with the product of said node label provided by said first storage means with the number of symbol signals comprising said alphabet less said symbol position signal provided by said symbol mapping means.

12. The compression apparatus of claim 11 in which said address generator means comprises means for generating said address signal in accordance with $$\text{address signal} = i|A| - p + 2$$

where i comprises said node label, $|A|$ comprises the number of symbol signals of said alphabet and p comprises said symbol position signal.

13. The compression apparatus of claim 1 in which said first storage means includes a directly addressed portion and a hash addressed portion and said address generator means further comprises hashing limit comparator means for comparing said address signal to a predetermined hashing limit, and hashing means for hashing said address signal thereby providing a hashed address signal, said address generator means including means for providing either said address signal or said hashed address signal to said first storage means in accordance with the comparison between said address signal and said hashing limit.

14. The compression apparatus of claim 1 in which said means defining a first search tree comprises means defining a first search tree having alpha-branches emanating from said nodes representative of all of the symbol signals of said alphabet not yet encountered during said compressing of said stream of data symbol signals.

15. The compression apparatus of claim 10 in which said means defining a first search tree comprises means defining a first seach tree having alpha-branches emanating from said nodes representative of all of the symbol signals of said alphabet not yet encountered during said compressing of said stream of data symbol signals, an alpha-branch of said first search tree being encountered when said second detecting means detects an accessed storage location of said second storage means not containing a symbol position signal.

16. The compression apparatus of claim 10 in which said means for generating a pointer signal includes leaves-only converter means responsive to said address signals from said address generator means and said node labels from said first storage means for providing a leaves-only pointer signal in accordance therewith.

17. The compression apparatus of claim 16 in which said leaves-only converter means comprises means for providing said leaves-only pointer signal in accordance with the difference between said address signals and said node labels, respectively.

18. The compression apparatus of claim 17 in which said leaves-only converter means comprises means for providing said leaves-only pointer signal in accordance with $$D = C - E - 1$$

where D comprises said leaves-only pointer signal, C comprises said address signal and E comprises said node label.

19. The compression apparatus of claim 17 in which said leaves-only converter means includes means for inhibiting taking said difference between an address signal and a node label whenever the symbol signal that resulted in the address signal is a predetermined symbol signal of said alphabet.

20. The compression apparatus of claim 17 in which said leaves-only converter means includes means for inhibiting taking said difference between an address signal and a node label whenever the symbol signal that resulted in the addressing signal is the first symbol signal encountered by said encoding apparatus in compressing said stream of data symbol signals.

21. The compression apparatus of claim 17 in which said leaves-only converter means includes means responsive to said symbol position signals for inhibiting taking said difference between an address signal and a node label whenever the symbol position signal resulting in the address signal is that symbol position signal assigned to a predetermined symbol signal.

22. The compression apparatus of claim 17 in which said leaves-only converter means includes means responsive to said symbol position signals for inhibiting taking said difference between an address signal and a node label whenever the symbol position signal resulting in the address signal is that symbol position signal assigned to the first symbol signal of said alphabet encountered by said encoding apparatus in compressing said stream of data symbol signals.

23. The compression apparatus of claim 16 in which said means for generating a pointer signal further includes green-leaves converter means responsive to said leaves-only pointer signal for generating a green-leaves pointer signal corresponding thereto in accordance with the number of symbol signals of said alphabet not yet encountered by said encoding apparatus during said compressing of said stream of data symbol signals.

24. The compression apparatus of claim 16 in which said means for generating a pointer signal further includes green-leaves converter means responsive to said leaves-only pointer signal for generating a green-leaves pointer signal corresponding thereto in accordance with the number of symbol signals of said alphabet currently encountered by said encoding apparatus during said compressing of said stream of data symbol signals.

25. The compression apparatus of claim 23 in which greenleaves converter means includes means for generating said green-leaves pointer signal further in accordance with said number of symbol signals of said alphabet.

26. The compression apparatus of claim 25 in which said green-leaves converter means comprises means for generating said green-leaves pointer signal in accordance with $$D_g = D+(1-\text{NSYM})(D/(|A|-1))$$

where $D_g$ comprises said green-leaves pointer signal, D comprises said leaves-only pointer signal, NSYM comprises a signal representative of the number of symbol signals of said alphabet not yet encountered by said encoding apparatus during said compressing of said stream of data symbol signals, $|A|$ comprises the number of symbol signals of said alphabet and $D_g$ is generated utilizing integer arithmetic.

27. The compression apparatus of claim 23 in which said green-leaves converter means comprises means responsive to said symbol position signal for providing said number of symbol signals not yet encountered.

28. The compression apparatus of claim 26 in which said green-leaves converter means comprises means responsive to said symbol position signal for providing said NSYM signal.

29. The compression apparatus of claim 23 in which said means for generating a pointer signal further includes means responsive to said first detecting means for enabling said green-leaves converter means to convert said leaves-only pointer signal to said green-leaves pointer signal when said first detecting means detects an accessed storage location of said first storage means without a node label.

30. The compression apparatus of claim 29 in which said means for enabling said green-leaves converter means comprises gating means coupling said leaves-only converter means to said green-leaves converter means and responsive to said first detecting means for transferring said leaves-only pointer signal to said green-leaves converter means when said first detecting means detects an accessed storage location of said first storage means without a node label.

31. The compression apparatus of claim 23 further including symbol counting means for providing a symbol count signal in accordance with the number of symbol signals of said alphabet currently encountered by said encoding apparatus during said compressing of said stream of data symbol signals, said symbol counting means being responsive to said second detecting means for incrementing said symbol count signal when said second detecting means detects an accessed storage location of said second storage means not containing a symbol position signal.

32. The compression apparatus of claim 31 further including pointer counting means for providing a pointer count signal representative of the number of leaf nodes in said first search tree.

33. The compression apparatus of claim 32 in which said node counting means comprises means for generating a node count signal representative of the number of nodes of said first search tree that are not leaf nodes, said node count signal providing said node labels for insertion into said first storage means, said node counting means being responsive to said first detecting means for incrementing said node count signal when said first detecting means detects an accessed storage location of said first storage means not containing a node label, and said position counting means comprises means for generating a position count signal representative of the number of symbol signals of said alphabet not yet encountered by said encoding apparatus during said compressing of said stream of data symbol signals, said position count signal providing said symbol position signals for insertion into said second storage means, said position counting means being responsive to said second detecting means for decrementing said position count signal when said second detecting means detects an accessed storage location of said second storage means not containing a symbol position signal.

34. The compression apparatus of claim 33 in which said pointer counting means comprises means responsive to said node count signal and said symbol count signal and to said first and second detecting means for incrementing said pointer count signal by said symbol count signal when said first detecting means detects an accessed storage location of said first storage means not containing a node label and for incrementing said pointer count signal by said node count signal when said second detecting means detects an accessed storage location of said second storage means not containing a symbol position signal.

35. The compression apparatus of claim 34 in which said position counting means includes means for generating an inhibit signal when said position count signal attains a predetermined position count.

36. The compression apparatus of claim 35 in which said symbol counting means comprises means responsive to said inhibit signal for inhibiting said symbol count signal from being incremented beyond a predetermined symbol count.

37. The compression apparatus of claim 36 in which said symbol counting means comprises means responsive to said inhibit signal for inhibiting said symbol count signal from being incremented beyond one less than the number of symbol signals comprising said alphabet.

38. The compression apparatus of claim 35 in which said pointer counting means comprises means responsive to said inhibit signal for inhibiting said pointer count signal from being incremented by said node count signal.

39. The compression apparatus of claim 32 in which said means for generating a pointer signal includes pointer economy encoder means responsive to said green-leaves pointer signal for converting said green-leaves pointer signal into a corresponding pointer economy code signal in accordance with a predetermined prefix code.

40. The compression apparatus of claim 32 in which said means for generating a pointer signal includes pointer ecomony encoder means responsive to said green-leaves pointer signal for converting said green-leaves pointer signal to a corresponding pointer economy code signal in accordance with a predetermined left biased prefix code.

41. The compression apparatus of claim 39 in which said pointer economy encoder means comprises
pointer threshold calculator means responsive to said pointer count signal for generating a pointer threshold in accordance therewith,
pointer threshold comparator means responsive to said green-leaves pointer signal and said pointer threshold for determining when said green-leaves pointer signal exceeds said pointer threshold, and pointer output converter means responsive to said green-leaves pointer signal and said pointer threshold for converting said green-leaves pointer signal into a converted green-leaves pointer signal in accordance with said pointer threshold, said green-leaves pointer signal or said converted green-leaves pointer signal providing said pointer economy code signal in accordance with said green-leaves pointer signal exceeding said pointer threshold.

42. The compression apparatus of claim 41 in which said pointer threshold calculator means comprises means for calculating said pointer threshold in accordance with $$TB = 2H - KB$$

where TB comprises said pointer threshold, H comprises said pointer count signal and KB comprises the least integer that is not less than $\log_2(H)$, and said pointer output converter means comprises means for converting said green-leaves pointer signal to said converted green-leaves pointer signal in accordance with $$\text{Converted } D_g = (2D_g - TB)/2$$

where $D_g$ comprises said green-leaves pointer signal.

43. The compression apparatus of claim 33 further comprising new symbol detecting means including said second detecting means for detecting that a symbol signal has been newly encountered by said encoding apparatus when said second detecting means detects a storage location of said second storage means not containing a symbol position signal.

44. The compression apparatus of claim 43 further including means enabled by said new symbol detecting means for assigning predetermined rank signals to said symbol signals of said alphabet respectively.

45. The compression apparatus of claim 44 in which said rank assigning means comprises third storage means comprising a plurality of storage locations corresponding respectively to said symbol signal of said alphabet, said storage locations being utilized for storing said rank signals corresponding to said symbols respectively, said third storage means being accessed by a newly encountered symbol to provide the rank signal stored at said storage location corresponding to the newly encountered symbol.

46. The compression apparatus of claim 45 in which said rank assigning means further includes means for deleting a storage location and the corresponding rank signal from said third storage means when the symbol signal corresponding thereto is first encountered by said encoding apparatus during said compressing of said stream of data symbol signals and for decrementing all rank signals subsequent to said deleted storage location.

47. The compression apparatus of claim 45 further including rank economy encoder means responsive to the rank signal provided by said third storage means for converting said rank signal into a corresponding rank economy code signal in accordance with a predetermined prefix code.

48. The compression apparatus of claim 45 further including rank economy encoder means responsive to the rank signal provided by said third storage means for converting said rank signal into a corresponding rank ecomony code signal in accordance with a predetermined left biased prefix code.

49. The compression apparatus of claim 47 in which said rank economy encoder means comprises rank threshold calculator means responsive to said position count signal for generating a rank threshold in accordance therewith, rank threshold comparator means responsive to said rank signal and said rank threshold for determining when said rank signal exceeds said rank threshold, and rank output converter means responsive to said rank signal and said rank threshold for converting said rank signal into a converted rank signal in accordance with said rank threshold, said rank signal or said converted rank signal providing said rank economy code signal in accordance with said rank signal exceeding said rank threshold.

50. The compression apparatus of claim 49 in which said rank threshold calculator means comprises means for calculating said rank threshold in accordance with $$TA = 2\text{NSYM} - KA$$

where TA comprises said rank threshold, NSYM comprises said position count signal and KA comprises the last integer that is not less than $\log_2(\text{NSYM})$ and said rank output converter means comprises means for converting said rank signal to said converted rank signal in accordance with $$\text{Converted } R = (2R - TA)/2$$

where R comprises said rank signal, said rank economy code signal being provided in said compressed stream of code signals.

51. The compression apparatus of claim 1 further including means for providing said successive symbol signals of said data stream in accordance with said first detecting means detecting accessed storage locations of said first storage means containing node labels respectively.

52. The compression apparatus of claim 1 in which said parsing means further comprises symbol mapping means for assigning ordered symbol position signals to said symbol signals of said alphabet, respectively, and means responsive to said first detecting means for providing said successive symbol signals of said data stream to said symbol mapping means when said first detecting means detects accessed storage locations of said first storage means containing node labels respectively, said symbol position signals being provided to said address generator means for generating said address signals in accordance with said successive symbol signals of said stream of data symbols.

53. The compression apparatus of claim 33 further including means for comparing said node count signal to a predetermined constant, and means for inhibiting said node counting means from incrementing said node count signal, for inhibiting said first storage means from inserting said node label therein and for inhibiting said pointer counting means from incrementing said pointer count signal by said symbol count signal, whenever said node count signal exceeds said predetermined constant.

54. The data compression and data recovery system of claim 1 in which said decompression apparatus comprises means for recovering said segments of said stream of data symbol signals from said poiner signals, respectively.

55. The decompression apparatus of claim 54 in which said segment recovery means comprises means defining a second search tree having nodes and branches emanating from said nodes, each node having at most one incoming branch, the outgoing branches emanating from a node being representative of said symbol signals of said alphabet respectively, said nodes having respective node labels associated therewith and respective addresses associated therewith, said second search tree having a unique root node without an incoming branch and leaf nodes without outgoing branches, said segment recovery means comprising means for tracing a path through said second search tree to said root from the leaf node corresponding to a pointer signal, extracting from the branches of said path the respective symbol signals associated with said branches, thereby recovering the segment corresponding to said pointer signal.

56. The decompression apparatus of claim 55 in which said segment recovery means comprises fourth storage means comprising a plurality of storage locations corresponding respectively to said nodes of said second search tree, said storage locations being utilized for storing said addresses of said nodes, an address stored at a particular storage location being the address of the node corresponding to said particular storage location, label generator means for generating a node label signal and for providing said node label signal to said fourth storage means for accessing said storage locations thereof said fourth storage means providing, in response thereto, the address stored in the storage location accessed by said node label signal, said label generator means being responsive to an address provided by said fourth storage means for generating said node label signal in accordance therewith.

57. The decompression apparatus of claim 56 in which said label generator means comprises means responsive to said address provided by said fourth storage means for generating the node label signal corresponding to the father node of the node having said address provided by said fourth storage means.

58. The decompression apparatus of claim 56 in which said label generator means comprises means for generating said node label signal further in accordance with the number of symbol signals comprising said alphabet.

59. The decompression apparatus of claim 58 in which said label generator means comprises means for generating said node label signal in accordance with $$\text{node label} = 1 + (C-2)/|A|$$

where C comprises said address provided by said fourth storage means, $|A|$ comprises the number of symbol signals of said alphabet and said node label signal is generated utilizing integer arithmetic.

60. The decompression apparatus of claim 56 in which said segment recovery means further includes third detecting means for detecting when an accessed storage location of said fourth storage means contains the address for said root node.

61. The decompression apparatus of claim 56 in which said segment recovery means further comprises symbol extracting means responsive to the address provided by said fourth storage means and to the node label signal provided by said label generator means for providing the symbol signal corresponding thereto.

62. The decompression apparatus of claim 57 in which said segment recovery means includes means for inserting the address of said leaf node corresponding to said pointer signal into a storage location of said fourth storage means not containing an address, said storage location into which said address is inserted sequentially following the last storage location of said fourth storage means having an address stored thereat.

63. The decompression apparatus of claim 62 in which said means for inserting said address further includes means for applying said leaf address to said label generator means for generating a node label signal corresponding to the node label of said father node of said leaf node.

64. The decompression apparatus of claim 61 in which said segment recovery means includes leaf determining means responsive to the address corresponding to said pointer signal for determining the leaf address corresponding thereto and for providing a leaf address signal in accordance therewith.

65. The decompression apparatus of claim 64 in which said symbol signals of said alphabet have respective symbol position signals associated therewith and said leaf determining means comprises means defining a third search tree identical to said first search tree, said leaf determining means including means for tracing a path through said third search tree from a node thereof having said address corresponding to said pointer signal to a leaf node along said path comprised of branches representative of a predetermined symbol signal of said alphabet, the address of said leaf node providing said leaf address signal to said fourth storage means and to said label generator means.

66. The decompression apparatus of claim 65 in which said means for tracing a path through said third search tree comprises means for tracing said path through said third seach tree along said path comprised of branches representative of the first symbol signal of said alphabet encountered by said encoding apparatus in compressing said stream of data symbol.

67. The decompression apparatus of claim 65 in which said leaf determining means comprises fifth storage means comprising a plurality of storage locations corresponding respectively to said addresses of said nodes of said third search tree, said storage locations being utilized for storing said node labels, a node label stored at a particular storage location identifying the node whose address corresponds to said particular storge location, and addressing means for generating an address signal and for providing said address signal to said fifth storage means, said fifth storage means providing, in response thereto, the node label stored in the storage location addressed by said addressing signal, said addressing means being responsive to a node label provided by said fifth storage means for generating said address signal in accordance with said node label in accordance with said predetermined symbol signal of said alphabet.

68. The decompression apparatus of claim 67 in which said addressing means comprises means for generating said address signal in accordance with the first symbol signal encountered by said encoding apparatus during said compressing of said stream of data symbol signals.

69. The decompression apparatus of claim 67 in which said addressing means comprises means for generating said address signal in accordance with said symbol position signal representative of said predetermined symbol signal.

70. The decompression apparatus of claim 68 in which said addressing means comprises means for generating said address signal in accordance with said symbol position signal representative of said first encountered symbol signal.

71. The decompression of claim 70 in which said addressing means comprises means for generating said address signal in accordance with the product of said node label provided by said fifth storage means with said number of symbols comprising said alphabet less said symbol position signal representative of said first encountered symbol signal.

72. The decompression apparatus of claim 71 in which said addressing means comprises means for generating said address signal in accordance with $$\text{address signal} = i|A| - |A| + 2$$

where i comprises said node label, $i|A|$ comprises said product of said node label with said number of symbol signals comprising said alphabet and $|A|$ comprises said symbol position signal for said first encountered symbol signal.

73. The decompression apparatus of claim 67 in which said leaf determining means further includes fourth detecting means for detecting when an accessed storage location of said fifth storage means does not contain a node label, the address of said accessed storage location of said fifth storage means not containing a node label providing said leaf address signal to said fourth storage means and to said label generator means.

74. The decompression apparatus of claim 73 in which said leaf determining means further includes node counting means for inserting a node label into said accessed storage location of said fifth storage means detected by said fourth detecting means as not containing a node label.

75. The decompression apparatus of claim 74 in which said node counting means comprises means for generating successively increasing node labels in accordance with said fourth detecting means detecting accessed storage locations of said fifth storage means as not containing node labels repectively.

76. The decompression apparatus of claim 75 in which said node counting means comprises means for generating a node count signal representative of the number of nodes of said third search tree that are not leaf nodes, said node count signal providing said node label for insertion into said fifth storage means, said node counting means being responsive to said fourth detecting means for incrementing said node count signal as a result of said fourth detecting means detecting an accessed storage location of said fifth storage means as not containing a node label.

77. The decompression apparatus of claim 75 in which said node counting means comprises means for generating a node count signal representative of the number of nodes of said third search tree that are not leaf nodes, said node count signal providing said node label for insertion into said fifth storage means, said node counting means being responsive to said third detecting means for incrementing said node count signal when said third detecting means detects said storage location of said fourth storage means containing said address of said root node, said node count signal accessing said fourth storage means for insertion of said leaf address signal into the storage location of said fourth storage means accessed by said node count signal.

78. The decompression apparatus of claim 77 in which said leaf detecting means further includes means responsive to said leaf address signal, said node count signal and said fourth detecting means for transmitting said node count signal and said leaf address signal to said fourth storage means for insertion of said leaf address signal into the storage location of said fourth storage means accessed by said node count signal when said fourth detecting means detects a storage location of said fifth storage means as not containing a node label, said means for transmitting said leaf address further comprising means for providing said leaf address signal to said label generator means when said fourth detecting means detects a storage location of said fifth storage means as not containing a node label.

79. The decompression apparatus of claim 73 in which said addressing means comprises means for sequentially generating address signals and providing said address signals to said fifth storage means, the node label provided by said fifth storage means in response to an address signal providing the node label for generating the next address signal, said addressing means sequentially generating said address signals in accordance with the node labels sequentially provided by said fifth storage means respectively and in accordance with said predetermined symbol signal of said data alphabet, said addressing means sequentially generating said address signals until said fourth detecting means detects an addressed storage location of said fifth storage means without a node label.

80. The decompression apparatus of claim 67 in which said fifth storage means includes a directly addressed portion and a hash addressed portion and said addressing means includes hashing limit comparator means for comparing said address signal to a predetermined hashing limit, and hashing means for hashing said address signal thereby providing a hashed address, said addressing means including means for providing either said address signal or said hashed address to said fifth storage means in accordance with the comparison between said address signal and said hashing limit.

81. The decompression apparatus of claim 76 in which said symbol signals of said alphabet have respective symbol position signals associated therewith, and said symbol extracting means includes position extractor means responsive to said node label signal from said label generator means and to said address from said fourth storage means for generating a symbol position signal in accordance therewith.

82. The decompression apparatus of claim 81 in which said position extractor means comprises means for generating said symbol position signal further in accordance with said number of symbol signals comprising said alphabet.

83. The decompression apparatus of claim 82 in which said position extractor means comprises means for generating said symbol position signal in accordance with the product of said node label signal and said number of symbol signals comprising said alphabet less said address.

84. The decompression apparatus of claim 83 in which said position extractor means comprises means for generating said symbol position signal in accordance with $$p=|A|\cdot Cl-C+2$$

where p comprises said symbol position signal, $|A|$ comprises said number of symbol signals of said alphabet, Cl comprises said node label signal and C comprises said address.

85. The decompression apparatus of claim 81 in which said symbol extracting means includes position-symbol converter means responsive to said symbol position signals from said position extractor means for providing a symbol signal corresponding to said symbol position signal.

86. The decompression apparatus of claim 85 in which said position-symbol converter means comprises a sixth storage means comprising a plurality of storage locations corresponding respectively to said symbol position signals, said storage locations of said sixth storage means being utilized for storing said symbol signals corresponding to said symbol position signals respectively, said sixth storage means being accessed by said symbol position signal from said position extractor means for providing the symbol signal stored at the storage location accessed by the symbol position signal.

87. The decompression apparatus of claim 86 in which said symbol extracting means further includes fifth detecting means for detecting when an accessed storage location of said sixth storage means does not contain a symbol signal.

88. The decompression apparatus of claim 87 in which said symbol extracting means includes means responsive to said fifth detecting means for providing a rank signal extracted from said compressed stream of code signals representative of a newly encountered symbol signal whenever said fifth detecting means detects a storage location of said sixth storage means not containing a symbol signal.

89. The decompression apparatus of claim 88 in which said symbol extracting means further includes means responsive to said rank signal for converting said rank signal to the newly encountered symbol signal of said alphabet corresponding thereto.

90. The decompression apparatus of claim 89 in which said means for converting said rank signal comprises seventh storage means comprising a plurality of storage locations corresponding respectively to said rank signals, respectively, said storage locations being utilized for storing said symbol signals corresponding to said rank signals, respectively, said seventh storage means being accessed by a rank signal to provide the symbol signal stored at said storage location accessed by said rank signal.

91. The decompression apparatus of claim 90 in which said means for converting said rank signal further includes means for deleting a symbol signal from said seventh storage means when the rank signal corresponding thereto is received by said decoding apparatus during said recovering of said segments of said stream of data symbols and for effectively decrementing the rank signals subsequent to said deleted symbol signal.

92. The decompressing apparatus of claim 90 in which said sixth storage means includes means for receiving said symbol signal from said seventh storage means and for storing said symbol signal at the storage location thereof accessed by said position signal that resulted in said fifth detecting means detecting that an accessed storage location of said sixth storage means does not contain a symbol signal.

93. The decompression apparatus of claim 89 further including symbol counting means for providing a symbol count signal in accordance with the number of newly encountered symbol signals received by said decoding apparatus, said symbol counting means being responsive to said fifth detecting means for incrementing said symbol count signal when said fifth detecting means detects a storage location of said sixth storage means not containing a symbol signal.

94. The decompression apparatus of claim 93 further including position counting means for generating a position count signal representative of said number of symbol signals comprising said alphabet less the number of newly encountered symbol signals encountered by said decoding apparatus, said position counting means being responsive to said fifth detecting means for decrementing said position count signal when said fifth detecting means detects a storage location of said sixth storage means as not containing a symbol signal.

95. The decompression apparatus of claim 94 further including pointer counting means for providing a pointer count signal representative of the number of leaf nodes in said second search tree.

96. The decompression apparatus of claim 95 in which said pointer counting means comprises means responsive to said node count signal and said symbol count signal and to said third and fifth detecting means for incrementing said pointer count signal by said symbol count signal when said third detecting means detects said storage location of said fourth storage means containing said address of said root and for incrementing said pointer count signal by said node count signal when said fifth detecting means detects a storage location of said sixth storage means as not containing a symbol signal.

97. The decompression apparatus of claim 96 in which said position counting means includes means for generating an inhibit signal when said position count signal attains a predetermined count.

98. The decompression apparatus of claim 97 in which said symbol counting means comprises means responsive to said inhibit signal for inhibiting said symbol count signal from being incremented beyond a predetermined count.

99. The decompression apparatus of claim 98 in which said symbol counting means comprises means responsive to said inhibit signal for inhibiting said symbol count signal from being incremented beyond one less than the number of symbol signals comprising said alphabet.

100. The decompression apparatus of claim 97 in which said pointer counting means comprises means responsive to said inhibit signal for inhibiting said pointer count signal from being incremented by said node count signal.

101. The decompression apparatus of claim 95 in which said pointer signals provided by said encoding apparatus comprise a pointer economy code signal,
   said decoding apparatus further comprising pointer economy decoder means responsive to said pointer economy code signal for converting said pointer economy code signal to a green-leaves pointer signal corresponding thereto utilizing a predetermined prefix code.

102. The decompression apparatus of claim 101 in which said pointer economy decoder means comprises means for converting said pointer economy code signal to said green-leaves pointer signal utilizing a predetermined left biased prefix code.

103. The decompression apparatus of claim 101 in which said pointer economy decoder means comprises
   pointer threshold calculator means responsive to said pointer count signal for generating a pointer threshold in accordance therewith,
   pointer threshold comparator means responsive to said pointer economy code signal and said pointer threshold for determining when said pointer economy code signal exceeds said pointer threshold, and
   pointer code converter means responsive to said pointer economy code signal and said pointer threshold for converting said pointer economy code signal into a converted pointer economy code signal in accordance with said pointer threshold,
   said pointer economy code signal or said converted pointer economy code signal providing said green-leaves pointer signal in accordance with said pointer economy code signal exceeding said pointer threshold.

104. The decompression apparatus of claim 103 in which
   said pointer threshold calculator means comprises means for calculating said pointer threshold in accordance with $$TB = 2H - KB$$

where TB comprises said pointer threshold, H comprises said pointer count signal and KB comprises the least integer that is not less than $\log_2(H)$, and
   said pointer code converter means comprises means for converting said pointer economy code signal to said converted pointer economy code signal in accordance with Converted $Y_k = (Y_k + TB)/2$ where $Y_k$ comprises said pointer economy code signal and said converted pointer economy code signal is generated utilizing integer arithmetic.

105. The decompression apparatus of claim 101 further comprising leaves-only converter means responsive to said green-leaves pointer signal and to said symbol count signal for converting said green-leaves pointer signal to a corresponding leaves-only pointer signal in accordance with said symbol count signal.

106. The decompression apparatus of claim 105 in which said leaves-only converter means includes means responsive to said position count signal for converting said green-leaves pointer signal to said leaves-only pointer signal in accordance with said position count signal.

107. The decompression apparatus of claim 106 in which said leaves-only converter means comprises means for converting said green-leaves pointer signal to said leaves-only pointer signal in accordance with $$D = D_g + CSYM((D_g - 1)/BSYM)$$

where D comprises said leaves-only pointer signal, $D_g$ comprises said green-leaves pointer signal, CSYM comprises (NSYM−1) or zero when NSYM=0, NSYM comprises said position count signal, BSYM comprises said symbol count signal and said leaves-only pointer signal D is derived utilizing integer arithmetic.

108. The decompression apparatus of claim 105 in which said leaves-only converter means includes means responsive to said green-leaves pointer signal for determining when said green-leaves pointer signal equals zero and providing a zero valued leaves-only pointer signal in accordance therewith.

109. The decompression apparatus of claim 108 further including address converter means responsive to said leaves-only pointer signal for converting said leaves-only pointer signal to an address signal corresponding thereto.

110. The decompression apparatus of claim 109 in which said address converter means comprises means for providing said address signal in accordance with said number of symbol signals of said alphabet.

111. The decompression apparatus of claim 110 in which said address converter means comprises means for providing said address signal in accordance with $$\text{address signal} = D + (D + 2|A| - 3)/(|A| - 1)$$

where D comprises said leaves-only pointer signal, |A| comprises the number of symbol signals of said alphabet, and said address signal is generated utilizing integer arithmetic.

112. The decompression apparatus of claim 109 in which said address converter means includes means for providing said address signal from said address converter means to said leaf determining means for determining said leaf address signal corresponding thereto.

113. The decompression apparatus of claim 109 in which said address converter means includes means for providing said address signal from said address converter means to said addressing means of said leaf determining means resulting in said addressing means providing said address signal to said fifth storage means for commencing the tracing of said path through said third search tree from a node thereof having an address corresponding to said address signal from said address converter means.

114. The decompression apparatus of claim 94 in which said rank signal corresponding to said newly encountered symbol comprises a rank economy code signal,
   said decoding apparatus further including rank economy decoder means responsive to said rank economy code signal for converting said rank economy code signal into a corresponding decoded rank signal utilizing a predetermined prefix code.

115. The decompression apparatus of claim 94 in which said rank signal corresponding to said newly encountered symbol signal comprises a rank economy code signal,
said decoding apparatus further including rank economy decoder means responsive to said rank economy code signal for converting said rank economy code signal into a corresponding decoded rank signal utilizing a predetermined left biased prefix code.

116. The decompression apparatus of claim 114 in which said rank economy decoder means comprises
rank threshold calculator means responsive to said position count signal for generating a rank threshold in accordance therewith,
rank threshold comparator means responsive to said rank economy code signal and to said rank threshold for determining when said rank economy code signal exceeds said rank threshold, and
rank code converter means responsive to said rank economy code signal and said rank threshold for converting said rank economy code signal into a converted rank economy code signal in accordance with said rank threshold,
said rank economy code signal or said converted rank economy code signal providing said decoded rank signal in accordance with said rank economy code signal exceeding said rank threshold.

117. The decompression apparatus of claim 116 in which
said rank threshold calculator means comprises means for providing said rank threshold in accordance with $$TA = 2NSYM - KA$$

where TA comprises said rank threshold, NSYM comprises said position count signal and KA comprises the least integer that is not less than $\log_2(NSYM)$, and
said rank code converter means comprises means for converting said rank economy code signal to said converted rank economy code signal in accordance with new $R = (R + TA)/2$ where R comprises said rank economy code signal and said converted rank economy code signal is generated utilizing integer arithmetic,
said decoded rank signal being provided to said means for converting said rank signal for conversion to said newly encountered symbol signal of said alphabet corresponding thereto.

118. The decompression apparatus of claim 114 including means responsive to said fifth detecting means for enabling said rank economy decoder means to provide said decoded rank signal representative of a newly encountered symbol signal whenever said fifth detecting means detects a storage location of said sixth storage means not containing a symbol signal.

119. The decompression apparatus of claim 61 further including decoded segment reversing means responsive to symbol signals provided by said symbol extracting means for reversing the order in which symbol signals are received by said decoded segment reversing means thereby recovering the segments of said stream of data symbol signals corresponding to said pointer signals respectively.

120. The decompression apparatus of claim 95 further including
means for comparing said node count signal to a predetermined constant, and
means for inhibiting said node counting means from incrementing said node count signal, for inhibiting said fifth storage means from inserting said node label therein and for inhibiting said pointer counting means from incrementing said pointer count signal by said symbol count signal, whenever said node count signal exceeds said predetermined constant.

121. The decompression apparatus of claim 55 in which said means defining a second search tree comprises means defining a second search tree having alpha-branches emanating from said nodes representative of all of the symbol signals of said alphabet not yet encountered during said recovering of said segments.

122. The decompression apparatus of claim 88 in which said means defining a second search tree comprises means defining a second search tree having alpha-branches emanating from said nodes representative of all of the symbol signals of said alphabet not yet encountered during said recovering of said segments, an alpha-branch of said second search tree being encountered when said fifth detecting means detects an accessed storage location of said sixth storage means not containing a symbol signal.

123. A data compression and decompression method for compressing digital data and recovering the original data from the compressed data, said method including reading the digital data from a medium to provide a stream of data symbol signals, said data symbol signals being members of an alphabet of symbol signals comprising a predetermined number of symbol signals, said data compression and decompression method including a compression method for providing a compressed stream of code signals corresponding to said stream of data symbol signals and applying said code signals to a medium, said data compression and decompression method further including a decompression method for recovering the original data from said code signals, said compression method comprising:
parsing said stream of data symbol signals into segments, each segment comprising a prefix and the next data symbol signal occurring in said stream after said prefix, said prefix comprising the longest match with a previous segment, said parsing step defining a first search tree having nodes and branches emanating from said nodes, each node having at most one incoming branch, the outgoing branches emanating from a node being representative of said symbol signals of said alphabet respectively, said nodes having respective node labels associated therewith and respective addresses associated therewith, said first search tree having a unique root node without an incoming branch and leaf nodes without outgoing branches,
said parsing step comprising the step of tracing said stream of data symbol signals through said first search tree along a path from said root node to a leaf node, including the step of determining the branches of said path in accordance with said symbol signals, respectively, of said stream of data symbol signals, said parsing step comprising the steps of storing said node labels at respective storage locations of a first storage means, said storage locations of said first storage means corresponding respectively to said addresses of said nodes of said tree, a node label stored at a particular storage location identifying the node whose address corresponds to said particular storage location, generating an address signal, accessing said storage locations of said first storage means with said address signal, said first storage means providing, in response thereto, the node label stored in the storage location accessed by said address signal, said step of generating said address signal comprising the step of generating said address signal in accordance with a node label provided by said first storage means and a data symbol from said stream of data symbols, detecting when an accessed storage location of said first storage means does not contain a node label, said storage location not containing a node label defining a leaf node of said first search tree, and inserting a node label into said accessed storage location of said first storage means detected as not containing a node label;

said step of generating said address signal comprising the steps of sequentially generating address signals, providing said address signals to said first storage means, the node label provided by said first storage means in response to an address signal providing the node label for generating the next address signal, said step of sequentially generating said address signals comprising the step of sequentially generating said address signals in accordance with the node labels sequentially provided by said first storage means, respectively, and in accordance with successive symbols of said stream of data symbols, respectively, said address signals being sequentially generated in response to said sequentially provided node labels until an accessed storage location of said first storage means is detected without a node label; and generating a pointer signal, for each said segment, in accordance with the address of said accessed storage location of said first storage means not containing a node label, said pointer signal being representative of said previous segment matching said prefix and of said next occurring data symbol signal after said prefix, thereby providing pointer signals for segments of said stream of data symbol signals, respectively, said pointer signals comprising said compressed stream of code signals.

124. The compression method of claim 123 in which said step of generating said address signal comprises the step of generating said address signal further in accordance with the number of symbol signals comprising said alphabet.

125. The compression method of claim 123 in which said step of tracing said stream of data symbol signals through said first search tree from said root node to a leaf node includes the step of initiating said tracing by accessing said first storage means at said storage location corresponding to said root.

126. The compression method of claim 123 in which said step of inserting a node label includes the step of generating successively increasing node labels, respectively, in accordance with the occurrence of said step of detecting accessed storage locations of said first storage means not containing node labels.

127. The compression method of claim 126 in which said parsing step further comprises the step of assigning ordered symbol position signals to said symbol signals of said alphabet, respectively, said step of generating address signals comprising the step of generating address signals in accordance with said symbol position signals.

128. The compression method of claim 127 in which said outgoing branches emanating from a node are representative of said symbol signals of said alphabet, respectively, in accordance with the order in which said symbol signals of said alphabet are received during said parsing step, said step of assigning ordered symbol position signals comprising the step of assigning said ordered symbol position signals to said symbol signals of said alphabet, respectively, in accordance with the order in which said symbol signals of said alphabet are received during said parsing step.

129. The compression method of claim 128 in which said outgoing branches emanating from a node have positions with respect to each other in accordance with the order in which said symbol signals of said alphabet are received during said parsing step, said step of assigning ordered symbol position signals comprising the steps of storing said symbol position signals at storage locations of a second storage means, said storage locations corresponding respectively to said symbol signals of said alphabet, a symbol position signal stored at a storage location corresponding to a particular symbol signal of said alphabet indicating the order in which said particular symbol signal was received during said parsing step with respect to the other symbol signals of said alphabet, and accessing said second storage means with the symbol signals of said stream of data symbol signals to provide the symbol position signals stored at said storage locations corresponding to the accessing symbols, said step of generating said address signals comprising the step of generating said address signals in accordance with said symbol position signals provided by said second storage means.

130. The compression method of claim 129 in which said step of assigning said symbol position signals further comprises the step of detecting when an accessed storage location of said second storage means does not contain a symbol position signal.

131. The compression method of claim 130 in which said step of assigning said symbol position signals includes the step of inserting a symbol position signal into said accessed storage location of said second storage means detected as not containing a symbol position signal.

132. The compression method of claim 131 in which said step of inserting said symbol position signal includes the step of generating successive symbol position signals respectively in response to the occurrence of detecting said storage locations of said second storage means not containing symbol position signals.

133. The compression method of claim 129 in which said step of generating said address signal comprises the step of generating said address signal in accordance with the product of said node label provided by said first storage means with the number of symbol signals comprising said alphabet less said symbol position signal provided by said second storage means.

134. The compression method of claim 133 in which said step of generating said address signal comprises the step of generating said address signal in accordance with $$\text{address signal} = i|A| - p + 2$$

where i comprises said node label, $|A|$ comprises the number of symbol signals of said alphabet and p comprises said symbol position signal.

135. The compression method of claim 123 in which said first storage means includes a directly addressed portion and a hash addressed portion, said step of generating said address signal further comprising the steps of
 comparing said address signal to a predetermined hashing limit,
 hashing said address signal thereby providing a hashed address signal, and
 providing either said address signal or said hashed address signal to said first storage means in accordance with the comparison between said address signal and said hashing limit.

136. The compression method of claim 123 in which said step of defining a first search tree comprises the step of defining a first search tree having alpha-branches emanating from said nodes representative of all of the symbol signals of said alphabet not yet encountered during said parsing step.

137. The compression method of claim 132 in which said step of defining a first search tree comprises the step of defining a first search tree having alpha-branches emanating from said nodes representative of all of the symbol signals of said alphabet not yet encountered during said parsing step, an alpha-branch of said first search tree being encountered when an accessed storage location of said second storage means is detected as not containing a symbol position signal.

138. The compression method of claim 132 in which said step of generating a pointer signal includes the step of generating a leaves-only pointer signal in accordance with said node labels from said first storage means and said address signals.

139. The compression method of claim 138 in which said step of generating said leaves-only pointer signal comprises the step of generating said leaves-only pointer signal in accordance with the difference between said address signals and said node labels, respectively.

140. The compression method of claim 139 in which said step of generating said leaves-only pointer signal comprises the step of generating said leaves-only pointer signal in accordance with $$D = C - E - 1$$

where D comprises said leaves-only pointer signal, C comprises said address signal and E comprises said node label.

141. The compression method of claim 139 in which said step of generating said leaves-only pointer signal includes the step of inhibiting taking said difference between an address signal and a node label whenever the symbol that resulted in the address signal is a predetermined symbol of said alphabet.

142. The compression method of claim 139 in which said step of generating said leaves-only pointer signal includes the step of inhibiting taking said difference between an address signal and a node label whenever the symbol signal that resulted in the address signal is the first symbol signal of said alphabet encountered during the performance of said encoding method.

143. The compression method of claim 139 in which said step of generating said leaves-only pointer signal includes the step of inhibiting taking said difference between an address signal and a node label whenever the symbol position signal resulting in the address signal is that symbol position signal assigned to a predetermined symbol.

144. The compression method of claim 139 in which said step of generating said leaves-only pointer signal includes the step of inhibiting taking said difference between an address signal and a node label whenever the symbol position signal resulting in the address signal is that symbol position signal assigned to the first symbol signal of said alphabet encountered during the performance of said encoding method.

145. The compression method of claim 138, in which said step of generating a pointer signal further includes the step of generating a green-leaves pointer signal corresponding to said leaves-only pointer signal in accordance with the number of symbols of said alphabet not yet encountered during the performance of said encoding method.

146. The compression method of claim 138 in which said step of generating a pointer signal further includes the step of generating a green-leaves pointer signal corresponding to said leaves-only pointer signal in accordance with the number of symbol signals of said alphabet currently encountered during said encoding method.

147. The compression method of claim 145 in which said step of generating said green-leaves pointer signal further includes the step of generating said green-leaves pointer signal in accordance with said number of symbol signals of said alphabet.

148. The compression method of claim 147 in which said step of generating said green-leaves pointer signal comprises the step of generating said green-leaves pointer signal in accordance with $$D_g = D + (1 - NSYM)(D/(|A| - 1))$$

where $D_g$ comprises said green-leaves pointer signal, D comprises said leaves-only pointer signal, NSYM comprises a signal representative of the number of symbol signals of said alphabet not yet encountered during the performance of said encoding method, $|A|$ comprises the number of symbol signals of said alphabet and $D_g$ is generated utilizing integer arithemtic.

149. The compression method of claim 145 in which said step of generating said green-leaves pointer signal includes the step of providing said number of symbol signals not yet encountered in response to said symbol position signal.

150. The compression method of claim 148 in which said step of generating said green-leaves pointer signal includes the step of providing said NSYM signal in response to said symbol position signal.

151. The compression method of claim 145 in which said step of generating a pointer signal includes the step of enabling said step of converting said leaves-only pointer signal to said greeen-leaves pointer signal when an accessed storage location of said first storage means is detected without a node label.

152. The compression method of claim 145 further including the steps of
generating a symbol count signal in accordance with the number of symbol signals of said alphabet currently encountered during the performance of said encoding method, and
incrementing said symbol count signal when an accessed storage location of said second storage means is detected as not containing a symbol position signal.

153. The compression method of claim 152 further including the step of providing a pointer count signal representative of the number of leaf nodes in said first search tree.

154. The compression method of claim 153 further including the steps of
generating a node count signal representative of the number of nodes of said first search tree that are not leaf nodes, said node count signal providing said node labels for insertion into said first storage means, and
incrementing said node count signal when an accessed storage location of said first storage means is detected as not containing a node label.

155. The compression method of claim 154 further including the steps of generating a position count signal representative of the number of symbol signals of said alphabet not yet encountered during the performance of said encoding method, said position count signal providing said symbol position signals for insertion into said second storage means, and
decrementing said position count signal when an accessed storage location of said second storage means is detected as not containing a symbol position signal.

156. The compression method of claim 155 in which said step of generating said pointer count signal comprises the steps of incrementing said pointer count signal by said symbol count signal when an accessed storage location of said first storage means is detected as not containing a node label, and
incrementing said pointer count signal by said node count signal when an accessed storage location of said second storage means is detected as not containing a symbol position signal.

157. The compression method of claim 156 in which said step of generating a position count signal includes the step of generating an inhibit signal when said position count signal attains a predetermined position count.

158. The compression method of claim 157 in which said step of generating said symbol count signal includes the step of inhibiting said symbol count signal from being incremented beyond a predetermined symbol count in response to said inhibit signal.

159. The compression method of claim 158 in which said step of generating said symbol count signal includes the step of inhibiting said symbol count signal from being incremented beyond one less than the number of symbol signals comprising said slphabet in response to said inhibit signal.

160. The compression method of claim 157 in which said step of generating said pointer count signal includes the step of inhibiting said pointer count signal from being incremented by said node count signal in response to said inhibit signal.

161. The compression method of claim 153 in which said step of generating a pointer signal includes the step of converting said green-leaves pointer signal into a corresponding pointer economy code signal in accordance with a predetermined prefix code.

162. The compression method of claim 153 in which said step of generating a pointer signal includes the step of converting said green-leaves pointer signal to a corresponding pointer economy code signal in accordance with a predetermined left biased prefix code.

163. The compression method of claim 161 in which said step of converting said green-leaves pointer signal to a corresponding pointer economy code signal coprises the steps of
generating a pointer threshold in accordance with said pointer count signal,
comparing said green-leaves pointer signal to said pointer threshold for determining when said green-leaves pointer signal exceeds said pointer threshold, and
converting said green-leaves pointer signal into a converted green-leaves pointer signal in accordance with said pointer threshold,
said green-leaves pointer signal or said converted green-leaves pointer signal providing said pointer economy code signal in accordance with said green-leaves pointer signal exceeding said pointer threshold.

164. The compression method of claim 163 in which said step of generatinng a pointer threshold comprises the step of calculating said pointer threshold in accordance with $$TB = 2H - KB$$

where TB comprises said pointer threshold, H comprises said pointer count signal and KB comprises the least integer that is not less than $\log_2(H)$, and
said step of converting said green-leaves pointer signal into a converted green-leaves pointer signal comprises the step of converting said green-leaves pointer signal to said converted green-leaves pointer signal in accordance with converted $D_g = (2D_g - TB)/2$ where $D_g$ comprises said green-leaves pointer signal.

165. The compression method of claim 155 further comprising the step of detecting that a symbol signal ha been newly encountered during the performance of said encoding method when a storage location of said second storage means is detected as not containing a symbol position signal.

166. The compression method of claim 165 further including the step of assigning predetermined rank signals to said symbol signals of said alphabet, respectively, in response to detecting newly encountered symbol signals.

167. The compression method of claim 166 in which said step of assigning predetermined rank signals to said symbol signals of said alphabet comprises the steps of
storing said rank signals corresponding to said symbol signals respectively at storage locations respectively of a third storage means, said storage locations of said third storage means corresponding respectively to said symbol signals of said alphabet, and acessing said third storage means by a newly encountered symbol signal to provide the rank signal stored at said storage location corresponding to the newly encountered symbol signal.

168. The compression method of claim 167 in which said step of assigning predetermined rank signals further includes the steps of deleting a storage location and the corresponding rank signal from said third storage means when the symbol signal corresponding thereto is first encountered during the performance of said encoding method, and decrementing all rank signals subsequent to said deleted storage location.

169. The compression method of claim 168 further including the step of converting said rank signal provided by said third storage means into a corresponding rank economy code signal in accordance with a predetermined prefix code.

170. The compression method of claim 168 further including the step of converting said rank signal provided by said third storage means into a corresponding rank economy code signal in accordance with a predetermined left biased prefix code.

171. The compression method of claim 169 in which said step of converting said rank signal into a corresponding rank economy code signal comprises the steps of generating a rank threshold in accordance with said position count signal, comparing said rank signal with said rank threshold for determining when said rank signal exceeds said rank threshold, and converting said rank signal into a converted rank signal in accordance with said rank threshold, said rank economy or said converted rank signal providing said rank economy code signal in accordance with said rank signal exceeding said rank threshold.

172. The compression method of claim 171 in which said step of generating a rank threshold comprises the step of calculating said rank threshold in accordance with $$TA = 2\ NSYM - KA$$

where TA comprises said rank threshold, NSYM comprises said position count signal and KA comprises the least integer that is not less than $\log_2$ (NSYM), and said step of converting said rank signal into a converted rank signal comprises the step of converting said rank signal to said converted rank signal in accordance with converted $R = (2R - TA)/2$ where R comprises said rank signal, said rank economy code signal being provided in said compressed stream of code signals.

173. The compression method of claim 123 further including the step of providing said successive symbol signals of said data stream in accordance with detecting accessed storage locations of said first storage means containing node labels respectively.

174. The compression method of claim 123 in which said parsing step comprises the steps of assigning ordered symbol position signals to said symbol signals of said alphabet, respectively, and providing said successive symbols of said data stream for assigning said ordered symbol position signals thereto when accessed storage locations of said first storage means are detected as containing node labels respectively, said step of generating said address signals comprising the step of generating said address signals in response to said symbol position signals in accordance with said successive symbol signals of said stream of data symbol signals.

175. The compression method of claim 168 further including the steps of comparing said node count signal to a predetermined constant, and inhibiting said node count signal from being incremented, inhibiting said node label from being inserted into said first storage means and inhibiting said pointer count signal from being incremented by said symbol count signal, whenever said node count signal exceeds said predetermined constant.

176. The data compression and data recovery method of claim 123, in which said decompression method comprises the step of recovering said segments of said stream of data symbol signals from said respective pointer signals of said compressed stream of code signals.

177. The decompression method of claim 176 in which said segment recovering step comprises the steps of defining a second search tree having nodes and branches emanating from said nodes, each node having at most one incoming branch, the outgoing branches emanating from a node being representative of said symbol signals of said alphabet respectively, said nodes having respective node labels associated therewith and respective addresses associated therewith, said second search tree having a unique root node without an incoming branch and leaf nodes without outgoing branches, tracing a path through said second search tree to said root from the leaf node corresponding to a pointer signal, and extracting from the branches from said path the respective symbol signals associated with said branches, thereby recovering the segment corresponding to said pointer signal.

178. The decompression method of claim 177 in which said segment recovering step comprises the steps of storing said addresses of said nodes of said second search tree at storage locations of a fourth storage means, said storage locations corresponding respectively to said nodes of said second search tree, an address stored at a particular storage location being the address of the node corresponding to said particular storage location, generating a node label signal, and providing said node label signal to said fourth storage means for accessing said storage locations thereof, said fourth storage means providing, in response thereto, the address stored in the storage location accessed by said node label signal, said step of generating said node label signal comprising the step of generating said node label signal in accordance with an address provided by said fourth storage means.

179. The decompression apparatus of claim 178 in which said step of generating said node label signl comprises the step of generating said node label signal corresponding to the father node of the node having said address provided by said fourth storage means.

180. The decompression method of claim 178 in which said step of generating said node label signal includes the step of generating said label signal further in accordance with the number of symbol signals comprising said alphabet.

181. The decompression method of claim 180 in which said step of generating said node label signal comprises the step of generating said node label signal in accordance with $$\text{node label} = 1 + (C-2)/|A|$$

where C comprises said address provided by said fourth storage means, $|A|$ comprises the number of symbol signals of said alphabet and said node label signal is generated utilizing integer arithmetic.

182. The decompression method of claim 178 in which said segment recovering step further includes the step of detecting when an accessed storage location of said fourth storage means contains the address of said root node.

183. The decompression method of claim 178 in which said segment recovering step further comprises a symbol extracting step providing the symbol signal corresponding to said node label signal and to the address provided by said fourth storage means.

184. The decompression method of claim 179 in which said segment recovering step includes the step of inserting the address of the leaf node corresponding to said pointer signal into a storage location of said fourth storage means not containing an address, said storage location into which said address is inserted sequentially following the last storage location of said fourth storage means having an address stored thereat.

185. The decompression method of claim 184 in which said step of generating said node label signal includes the step of generating, in response to said leaf address, a node label signal corresponding to the node label of said father node of said leaf node.

186. The decompression method of claim 183 in which said segment recovering step includes a leaf determining step comprising the step of determining the leaf address corresponding to the address corresponding to said pointer signal and providing a leaf address signal in accordance therewith.

187. The decompression method of claim 186 in which said symbol signals of said alphabet have respective symbol position signals associated therewith and said leaf determining step comprises the step of defining a third search tree identical to said first search tree, said leaf determining step including the step of tracing a path through said third search tree from a node thereof having said address corresponding to said pointer signal to a leaf node along a path comprised of branches representative of a predetermined symbol signal of said alphabet, the address of said leaf node providing said leaf address signal to said fourth storage means and said step of generating said node label signal including the step of generating a node label signal in accordance with said address of said leaf node.

188. The decompression method of claim 187 in which said step of tracing a path through said third search tree comprises the step of tracing said path through said third search tree along said path comprised of branches representative of the first symbol signal of said alphabet encountered in performing said encoding method.

189. The decompression method of claim 187 in which said leaf determining step comprises the steps of storing said node labels at storage locations of a fifth storage means, said storage locations of said fifth storage means corresponding respectively to said addresses of said nodes of said third search tree, a node label stored at a particular storage location identifying the node whose address corresponds to said particular storage location, generating an address signal, and providing said address signal to said fifth storage means, said fifth storage means providing, in response thereto, the node label stored in the storage location accessed by said address signal, said step of generating said address signal comprising the step of generating said address signal in accordance with a node label provided by said fifth storage means and in accordance with said predetermined symbol signal of said alphabet.

190. The decompression method of claim 189 in which said step of generating said address signal comprises the step of generating said address signal in accordance with the first symbol signal encountered during the performance of said encoding method.

191. The decompression method of claim 189 in which said step of generating said address signal comprises the step of generating said address signal in accordance with the said symbol position signal representative of said predetermined symbol.

192. The decompression method of claim 190 in which said step of generating said address signal comprises the step of generating said address signal in accordance with said symbol position signal representative of said first encountered symbol signal.

193. The decompression method of claim 192 in which said step of generating said address signal comprises the step of generating said address signal in accordance with the product of said node label provided by said fifth storage means with said number of symbol signals comprising said alphabet less said symbol position signal representative of said first encountered symbol signal.

194. The decompression method of claim 193 in which said step of generating said address signal comprises the step of generating said address signal in accordance with $$\text{address signal} = i|A| - |A| + 2$$

where i comprises said node label, $i|A|$ comprises said product of said node label with said number of symbol signals comprising said alphabet and $|A|$ comprises said symbol position signal for said first encountered symbol signal.

195. The decompression method of claim 189 in which said leaf determining step further includes the step of detecting when an accessed storage location of said fifth storage means does not contain a node label,
the address of said accessed storage location of said fifth storage means not containing a node label providing said leaf address signal to said fourth storage means and providing said leaf address signal for said step of generating said node label signal.

196. The decompression method of claim 195 in which said leaf determining step further includes the step of inserting a node label into said accessed storage location of said fifth storage means detected as not containing a node label.

197. The decompression method of claim 196 in which said leaf determining step includes the step of generating successively increasing node labels in accordance with detecting accessed storage locations of said fifth storage means not containing node labels respectively.

198. The decompression method of claim 197 in which said leaf determining step includes the steps of
generating a node count signal representative of the number of nodes of said third search tree that are not leaf nodes, said node count signal providing said node label for insertion into said fifth storage means, and
incrementing said node count signal as a result of detecting an accessed storage location of said fifth storage means as not containing a node label.

199. The decompression method of claim 197 in which said leaf determining step includes the steps of
generating a node count signal representative of the number of nodes of said third search tree that are not leaf nodes, said node count signal providing said node label for insertion into said fifth storage means,
incrementing said node count signal when said storage location of said fourth storage means containing said address of said root node is detected, and
accessing said fourth storage means by said node count signal for insertion of said leaf address signal into the storage location of said fourth storage means accessed by said node count signal.

200. The decompression method of claim 199 in which said leaf determining step includes the steps of
transmitting said node count signal and said leaf address signal to said fourth storage means for insertion of said leaf address signal into the storage location of said fourth storage means accessed by said node count signal when a storage location of said fifth storage means is detected as not containing a node label, and
providing said leaf address signal for utilization in said node label generation step when a storage location of said fifth storage means is detected as not containing a node label.

201. The decompression method of claim 195 in which said step of generating said address signal comprises the steps of
sequentially generating address signals, and
providing said address signals to said fifth storage means, the node label provided by said fifth storage means in response to an address signal providing the node label for generating the next address signal, said step of sequentially generating said address signal comprising sequentially generating said address signals in accordance with the node label sequentially provided by said fifth storage means respectively and in accordance with said predetermined symbol signal of said data alphabet, said address signals being sequentially generated until an accessed storage location of said fifth storage means without a node label is detected.

202. The decompression method of claim 189 in which said fifth storage means includes a directly addressed portion and a hash addressed portion and in which said step of generating said address signal includes the steps of
comparing said address signal to a predetermined hashing limit,
hashing said address signal thereby providing a hashed address signal, and
providing either said address signal or said hashed address signal to said fifth storage means in accordance with the comparison between said address signal and said hashing limit.

203. The decompression method of claim 188 in which said symbol signals of said alphabet have respective symbol position signals associated therewith, said symbol extracting step including a position extracting step of generating a symbol position signal in accordance with said address from said fourth storage means and in accordance with said node label signal.

204. The decompression method of claim 203 in which said position extracting step comprises the step of generating said symbol position signal further in accordance with said number of symbols comprising said alphabet.

205. The decompression method of claim 204 in which said position extracting step comprises the step of generating said symbol position signal in accordance with the product of said node label signal and said number of symbol signals comprising said alphabet less said address.

206. The decompression method of claim 205 in which said position extracting step comprises the step of generating said symbol position signal in accordance with $$p + |A| \cdot C1 - C + 2$$

where p comprises said symbol position signal, $|A|$ comprises said number of symbol signals of said alphabet, C1 comprises said node label signal and C comprises said address.

207. The decompression method of claim 203 in which said symbol extracting step includes a position-symbol converting step of providing a symbol signal corresponding to said symbol position signal.

208. The decompression method of claim 207 in which said position-symbol converting step comprises the steps of
storing said symbol signals corresponding to said symbol position signals respectively at respective storage locations of a sixth storage means, said storage locations of said sixth storage means corresponding respectively to said symbol position signals, and
accessing said sixth storage means by said symbol position signal for providing the symbol signals stored at the storage location of said sixth storage means accessed by the symbol position signal.

209. The decompression method of claim 208 in which said symbol extracting step further includes the step of detecting when an accessed storage location of said sixth storage means does not contain a symbol signal.

210. The decoding method of claim 209 in which said symbol extracting step includes the step of providing a signal extracted from said compressed stream of digital data representative of a newly encountered symbol whenever a storage location of said sixth storage means is detected not containing a symbol signal.

211. The decompression method of claim 210 in which said symbol extracting step further includes the step of converting said rank signal to the newly encountered symbol signal of said alphabet corresponding thereto.

212. The decompression method of claim 211 in which said rank converting step comprises the steps of storing said symbol signals corresponding to said respective rank signals at respective storage locations of a seventh storage means, said storage locations of said seventh storage means corresponding respectively to said rank signals, and accessing said seventh storage means by said rank signal to provide the symbol signal stored at said storage location accessed by said rank signal.

213. The decompression method of claim 212 in which said rank converting step includes the steps of deleting a symbol signal from said seventh storage means when the rank signal corresponding thereto is received during performance of said decoding method, and effectively decrementing the rank signals subsequent to said deleted symbol signal.

214. The decompression method of claim 212 in which said position-symbol converting step includes the steps of providing said symbol signal from said seventh storage means to said sixth storage means, and storing said symbol signal received from said seventh storage means at the storage location of said sixth storage means accessed by said position signal that resulted in detecting an accessed storage location of said sixth storage means as not containing a symbol signal.

215. The decompression method of claim 211 further including the steps of providing a symbol count signal in accordance with the number of newly encountered symbol signals currently received during the performance of said decoding method, and incrementing said symbol count signal when an accessed storage location of said sixth storage means is detected as not containing a symbol signal.

216. The decompression method of claim 215 further including the steps of generating a position count signal representative of said number of symbol signals comprising said alphabet less the number of newly encountered symbol signals encountered during the performance of said decoding method, and decrementing said position count signal when an accessed storage location of said sixth storage means is detected as not containing a symbol signal.

217. The decompression method of claim 216 further including the step of providing a pointer count signal representative of the number of leaf nodes in said second search tree.

218. The decompression method of claim 217 in which said step of providing a pointer count signal comprises the steps of incrementing said pointer count signal by said symbol count signal when an accessed storage location of said fourth storage means is detected as containing said address of said root, and incrementing said pointer count signal by said node count signal when an accessed storage location of said sixth storage means is detected as not containing a symbol signal.

219. The decompression method of claim 218 in which said step of generating a position count signal includes the step of generating an inhibit signal when said position count signal attains a predetermined count.

220. The decompression method of claim 219 in which said step of generating said symbol count signal includes the step of inhibiting said symbol count signal from being incremented beyond a predetermined count in response to said inhibit signal.

221. The decompression method of claim 220 in which said step of generating said symbol count signal includes the step of inhibiting said symbol count signal from being incremented beyond one less than the number of symbol signals comprising said alphabet in response to said inhibit signal.

222. The decompression method of claim 219 in which said step of generating said pointer count signal includes the step of inhibiting said pointer count signal from being incremented by said node count signal in response to said inhibit signal.

223. The decompression method of claim 217 in which said pointer signal provided during the performance of said encoding method comprises a pointer economy code signal, said decoding method further comprising the step of converting said pointer economy code signal to a green-leaves pointer signal corresponding thereto utilizing a predetermined prefix code.

224. The decompression method of claim 223 in which said step of converting said pointer economy code signal to a green-leaves pointer signal comprises the step of converting said pointer economy code signal to said green-leaves pointer signal utilizing a predetermined left biased prefix code.

225. The decompression method of claim 223 in which said step of converting said pointer economy code signal to a green-leaves pointer signal comprises the steps of generating a pointer threshold in accordance with said pointer count signal, comparing said pointer economy code signal with said pointer threshold to determine when said pointer economy code signal exceeds said pointer threshold, and converting said pointer economy code signal into a converted pointer economy code signal in accordance with said pointer threshold, said pointer economy code signal or said converted pointer economy code signal providing said green-leaves pointer signal in accordance with said pointer economy code signal exceeding said pointer threshold.

226. The decompression method of claim 225 in which said step of generating said pointer threshold comprises the step of calculating said pointer threshold in accordance with $TB = 2H - KB$ where TB comprises said pointer threshold, H comprises said pointer count signal and KB comprises the least integer that is not less than $\log_2(H)$, and said step of converting said pointer economy code signal into a converted pointer economy code signal comprises the step of converting said pointer economy code signal to said converted pointer economy code signal in accordance with converted $Y_k = (Y_k + TB)/2$ where $Y_k$ comprises said pointer economy code signal and said converted pointer economy code signal is generated utilizing integer arithmetic.

227. The decompression method of claim 223 further including the step of converting said green-leaves pointer signal to a corresponding leaves-only pointer signal in accordance with said symbol count signal.

228. The decompression method of claim 227 in which said step of converting said green-leaves pointer signal to a corresponding leaves-only pointer signal further includes the step of converting said green-leaves pointer signal to said leaves-only pointer signal in accordance with said position count signal.

229. The decompression method of claim 228 in which said step of converting said green-leaves pointer signal to said leaves-only pointer signal comprises the step of converting said green-leaves pointer signal to said leaves-only pointer signal in acordance with $D = D_g + CSYM((D_g - 1)/BSYM)$ where D comprises said leaves-only pointer signal, $D_g$ comprises said green-leaves pointer signal, CSYM comprises (NSYM−1) or zero when NSYM=0, NSYM comprises said position count signal, BSYM comprises said symbol count signal and said leaves-only pointer signal D is generated utilizing integer arithmetic.

230. The decompression method of claim 227 in which said step of converting said green-leaves pointer signal to said leaves-only pointer signal includes the steps of determining when said green-leaves pointer signal equals zero, and providing a zero valued leaves-only pointer signal when said green-leaves pointer signal equals zero.

231. The decompression method of claim 230 further including the step of converting said leaves-only pointer signal to an address signal corresponding thereto.

232. The decompression method of claim 231 in which said step of converting said leaves-only pointer signal to an address signal includes the step of providing said address signal in accordance with said number of symbol signals of said alphabet.

233. The decompression method of claim 232 in which said step of converting said leaves-only pointer signal to an address signal comprises the step of providing said address signal in accordance with address signal $= D + (D + 2|A| - 3)/(|A| - 1)$ where D comprises said leaves-only pointer signal, $|A|$ comprises the number of symbol signals of said alphabet and said address signal is generated utilizing integer arithmetic.

234. The decompression method of claim 231 in which said step of converting said leaves-only pointer signal to said address signal includes the step of utilizing said address signal in said step of determining said leaf address signal, said step of determining said leaf address signal comprising the step of determining said leaf address signal in accordance with said address signal.

235. The decompression method of claim 231 in which said step of converting said leaves-only pointer signal to said address signal includes the step of providing said address signal generated from said leaves-only pointer signal for utilization during said address generating step of said leaf determining step to provide the address signal to said fifth storage means for commencing the tracing of said path through said third search tree from a node thereof having an address corresponding to said address signal generated from said leaves-only pointer signal.

236. The decompression method of claim 216 in which said rank signal corresponding to said newly encountered symbol signal comprises a rank economy code signal, said decoding method further including the step of converting said rank economy code signal into a corresponding decoded rank signal utilizing a predetermined prefix code.

237. The decompression method of claim 216 in which said rank signal corresponding to said newly encountered symbol signal comprises a rank economy code signal, said decoding method further including the step of converting said rank economy code signal into a corresponding decoded rank signal utilizing a predetermined left biased prefix code.

238. The decompression method of claim 236 in which said step of converting said rank economy code signal into a corresponding decoded rank signal comprises the steps of generating a rank threshold in accordance with said position count signal, comparing said rank economy code signal to said rank threshold to determine when said rank economy code signal exceeds said rank threshold, and converting said rank economy code signal into a converted rank economy code signal in accordance with said rank threshold, said rank economy code signal or said converted rank economy code signal providing said decoded rank signal in accordance with said rank economy code signal exceeding said rank threshold.

239. The decompression method of claim 28 in which said step of generating said rank threshold comprises the step of providing said rank threshold in accordance with $TA = 2NSYM - KA$ where TA comprises said rank threshold, NSYM comprises said position count signal and KA comprises the least integer that is not less than $\log_2(NSYM)$, and said step of converting said rank economy code signal into a converted rank economy code signal comprises the step of converting said rank economy code signal to said converted rank economy code signal in accordance with converted $R = (R + TA)/2$ where R comprises said rank economy code signal and said converted rank economy code signal is generated utilizing integer arithmetic, said decoded rank signal being utlilized during said step for converting said rank signal to said symbol signal for converting said rank signal to said newly encountered symbol signal of said alphabet corresponding thereto.

240. The decompression method of claim 236 including the step of enabling said step of converting said rank economy code signal into a corresponding decoded rank signal whenever an accessed storage location of said sixth storage means is detected as not containing a symbol signal.

241. The decompression method of claim 183 further including the step of reversing the order in which said symbol signals are provided during said symbol extracting step thereby recovering the segments of said stream of data symbol signals corresponding to said pointer signals respectively.

242. The decompression method of claim 217 further including the steps of
comparing said node count signal to a predetermined constant, and
inhibiting the incrementation of said node count signal, inhibiting said fifth storage means from inserting said node label therein and inhibiting the incrementation of said pointer count signal by said symbol count signal, whenever said node count signal exceeds said predetermined constant.

243. The decompression method of claim 177 in which said step of defining a second search tree comprises the step of defining a second search tree having alpha-branches emanating from said nodes representative of all of the symbol signals of said alphabet not yet encountered during the performance of said decoding method.

244. The decompression method of claim 210 in which said step of defining a second search tree comprises the step of defining a second search tree having alpha-branches emanating from said nodes representative of all of the symbol signals of said alphabet not yet encountered during the performance of said decoding method, an alpha branch of said second search tree being encountered when an accessed storage location of said sixth storage means is detected not containing a symbol signal.

* * * * *

UNITED STATES PATENT AND TRADEMARK OFFICE
CERTIFICATE OF CORRECTION

PATENT NO. : 4,464,650

DATED : August 7, 1984

INVENTOR(S) : Willard L. Eastman, Abraham Lempel, Jacob Ziv

It is certified that error appears in the above-identified patent and that said Letters Patent is hereby corrected as shown below:

On the title page, item [73] Assignee: should read as follows:

--Assignee: Sperry Corporation, New York, N.Y.
Bell Telephon Laboratories, Incorporated, Murray Hill, N.J.
American Telephone and Telegraph Company, New York, N.Y.--

Signed and Sealed this

Fourteenth Day of July, 1992

Attest:

DOUGLAS B. COMER

Attesting Officer     Acting Commissioner of Patents and Trademarks